(12) United States Patent
Snaith et al.

(10) Patent No.: US 10,374,181 B2
(45) Date of Patent: Aug. 6, 2019

(54) PHOTOACTIVE LAYER PRODUCTION PROCESS

(71) Applicant: ISIS INNOVATION LIMITED, Oxfordshire (GB)

(72) Inventors: Henry Snaith, Oxfordshire (GB); Victor Burlakov, Oxfordshire (GB); James Ball, Oxfordshire (GB); Giles Eperon, Oxfordshire (GB); Alain Goriely, Oxfordshire (GB)

(73) Assignee: OXFORD UNIVERSITY INNOVATION LIMITED, Oxford (GB)

(*) Notice: Subject to any disclaimer, the term of this patent is extended or adjusted under 35 U.S.C. 154(b) by 407 days.

(21) Appl. No.: 14/899,309

(22) PCT Filed: Jun. 17, 2014

(86) PCT No.: PCT/GB2014/051858
§ 371 (c)(1),
(2) Date: Dec. 17, 2015

(87) PCT Pub. No.: WO2014/202965
PCT Pub. Date: Dec. 24, 2014

(65) Prior Publication Data
US 2016/0141535 A1    May 19, 2016

(30) Foreign Application Priority Data
Jun. 18, 2013   (GB) .................................. 1310854.3

(51) Int. Cl.
*H01L 51/00* (2006.01)
*H01L 51/42* (2006.01)
*H01L 51/44* (2006.01)

(52) U.S. Cl.
CPC ........ *H01L 51/424* (2013.01); *H01L 51/0002* (2013.01); *H01L 51/0003* (2013.01);
(Continued)

(58) Field of Classification Search
CPC ..................................................... H01L 51/424
See application file for complete search history.

(56) References Cited

U.S. PATENT DOCUMENTS 5,686,980 A * 11/1997 Hirayama ......... G02F 1/133512
257/294
2004/0005747 A1   1/2004 Park et al.
(Continued)

FOREIGN PATENT DOCUMENTS

WO   WO 2013/034312   3/2013

OTHER PUBLICATIONS

Kitazawa et al., "Optical properties of CH3NH3PbX3 (X=halogen) and their mixed-halide crystals," 2002, J. Mater. Sci. 37, pp. 3585-3587. (Year: 2002).*

(Continued)

*Primary Examiner* — Robert A Vetere
(74) *Attorney, Agent, or Firm* — Kenneth H. Sonnenfeld; Rajesh D. Patel; King & Spalding LLP

(57) ABSTRACT

The invention relates to processes for producing semi-transparent photoactive layers, and devices comprising the same. The invention provides a process for producing a semi-transparent photoactive layer comprising: a) disposing on a substrate a composition, which composition comprises a photoactive material or one or more precursors of a photoactive material, to form a resulting layer; and b) dewetting the resulting layer to form a dewet layer of the photoactive material, wherein the dewet layer of the photoactive material is semi-transparent. The invention also provides a semi-transparent photoactive layer comprising a (Continued)

substrate and, disposed on the substrate, a dewet layer of a photoactive material, wherein the dewet layer of a photoactive material comprises a plurality of absorbing regions which comprise the photoactive material and a plurality of transparent regions which do not substantially comprise the photoactive material. Devices and processes for producing devices comprising the semi-transparent layer are also disclosed, as are building components and automotive components comprising the semi-transparent layer.

15 Claims, 24 Drawing Sheets

(52) U.S. Cl.
CPC ...... *H01L 51/0032* (2013.01); *H01L 51/0035* (2013.01); *H01L 51/441* (2013.01); *H01L 51/4226* (2013.01); *H01L 51/447* (2013.01); *Y02B 10/12* (2013.01); *Y02P 70/521* (2015.11)

(56) References Cited

U.S. PATENT DOCUMENTS

| | | | | |
|---|---|---|---|---|
| 2004/0094196 | A1* | 5/2004 | Shaheen | B82Y 10/00 136/263 |
| 2008/0295889 | A1* | 12/2008 | Schindler | B82Y 10/00 136/263 |
| 2009/0107549 | A1* | 4/2009 | Borden | H01L 31/0284 136/261 |
| 2010/0059738 | A1* | 3/2010 | Burroughes | C08G 73/0266 257/40 |
| 2011/0081735 | A1 | 4/2011 | Coe et al. | |
| 2011/0100423 | A1* | 5/2011 | Fortmann | H01L 31/055 136/246 |
| 2011/0309307 | A1* | 12/2011 | Zeika | C07D 497/04 252/500 |
| 2012/0204950 | A1 | 8/2012 | Magdassi et al. | |
| 2013/0014818 | A1* | 1/2013 | Cotlet | H01L 51/4253 136/256 |
| 2014/0370694 | A1* | 12/2014 | Ishihara | H01L 27/1292 438/502 |

OTHER PUBLICATIONS

Kargupta et al., "Creation of Ordered Patterns by Dewetting of Thin Films on Homogeneous and Heterogeneous Substrates", 2002, Journal of Colloid and Interface Science 245, pp. 99-115. (Year: 2002).*
Ameri et al., "Fabrication, Optical Modeling, and Color Characterization of Semitransparent Bulk-Heterojunction Organic Solar Cells in an Inverted Structure," Advanced Functional Materials, 20, pp. 1592-1598, 2010.
Archambeau et al., "Organic Solar Cells with an Ultra thin Organized Hole Transport Layer," J Mater Sci: mater Electron, 18, pp. 919-923, 2007.
Bailey-Salzmann et al., "Semitransparent organic photovoltaic cells," Applied Physics Letters, 88, pp. 233502-1-233502-3, 2006.
Ball et al., "Low-temperature processed meso-superstructured to thin-film perovskite solar cells," Energy & Environmental Science, 6, pp. 1739-1743, 2013.
Burlakov et al., "Controlling coverage of solution cast materials with unfavourable surface interactions," Appl. Phys. Lett. 104, pp. 091602-1-091602-6, 2014.
Chiang et al., "Non-Color Distortion for Visible Light Transmitted Tandem Solid State Dye-Sensitized Solar Cells," Renewable Energy, 59, pp. 136-140, 2013.
Chen et al., "Visibly Transparent Polymer Solar Cells Produced by Solution Processing," ACS Nano, 6(8), pp. 7185-7190, 2012.
Chen, et al., "Semi-transparent Polymer Solar Cells with 6% PCE, 25% Average Visible Transmittance and a Color Rendering Index Close to 100 for Power Generating Window Applications," Energy Environ. Sci., 5, pp. 9551-9557, 2012.
Cheng et al., "Layered Organic-Inorganic Hybrid Perovskites: Structure, Optical Properties, Film Preparation, Patterning and Templating Engineering," CystEngComm, 12, pp. 2646-2662, 2010.
Chueh et al., "Toward High-Performance Semi-Transparent Polymer Solar Cells:Optimization of Ultra-Thin Light Absorbing Layer and Transparent Cathode Architecture," Adv Energy Mater, 3, pp. 417-423, 2013.
Chung et al., "All-solid-state dye-sensitized solar cells with high efficiency," Nature, 485, pp. 486-489, 2012.
Colsmann et al., "Efficient Semi-Transparent Organic Solar Cells with Good Transparency Color Perception and Rendering Properties," Adv Energy Mater, 1, pp. 599-603, 2011.
Ellmer, "Past Achievements and Future Challenges in the Development of Optically Transparent Electrodes," Nat. Photonics, 6, pp. 809-817, 2012.
Eperon, et al., "Morphological Control for High Performance, Solution-Processed Planar Heterojunction Perovskite Solar Cells," Adv. Funct. Mater., pp. 1-7, 2013.
Eperon et al., "Neutral Color Semitransparent Micostructured Perovskite Solar Cells," ACSNANO, vol. 8, No. 1, pp. 591-598, 2014.
Henemann, "BIPV: Built-in solar energy," Renewable Energy Focus 9, pp. 14-19, 2008.
Horiuchi et al., "High Efficiency of Dye-Sensitized Solar Cells Based on Metal-Free Indoline Dyes," J. Am. Chem. Soc. 126, pp. 12218-12219, 2004.
Im et al., "6.5% Efficient Perovskite Quantum-dot-sensitized Solar Cell," Nanoscale 3, pp. 4088-4093, 2011.
Kagan et al., "Patterning Organic-Inorganic Thin-Film Transistors Using Microcontact Printed Templated," Appl. Phys. Lett. 79(21), pp. 3536-3538, 2001.
Kang et al., "Manufacturing Method for Transparent Electric Windows Using Dye-Sensitized $TiO_2$ Solar Cells," Solar Energy Materials & Solar Cells, 75, pp. 475-479, 2003.
Kim et al.,"Lead Iodide Perovskite Sensitized All-Solid State Submicron Thin Film Mesoscopic Solar Cell with Efficiency Exceeding 9%," Scientific Reports, vol. 2, pp. 1-7, 2012.
Kirchartz et al., "Efficiency Limits of Organic Bulk Heterojunction Solar Cells," J Phys Chem C, 113, pp. 17958-17966, 2009.
Kitazawa et al., "Optical Properties of $CH_3NH_3PbX_3$ (X=halogen) and their Mixed-Halide Crystals," Journal of Materials Science, 37, pp. 3585-3587, 2002.
Kojima et al., "Organometal Halide Perovskites as Visible-Light Sensitizers for Photovoltaic Cells," J Am Chem Soc, 131, pp. 6050-6051, 2009.
Krebs et al., "Upscaling of Polymer Solar Cell Fabrication Using Full Roll-to-Roll Processing," Nanoscale, 2, pp. 873-886, 2010.
Lee et al., "Lithography-Free Fabrication of Large Area Subwavelength Antireflection Structures Using Thermally Dewetted Pt/Pd Alloy Etch Mask," Nanoscale Res Lett, 4, pp. 364-370, 2009.
Lee, et al., "Efficient Hybrid Solar Cells Based on Meso-Superstructured Organometal Halide Perovskites," Science, 338, pp. 643-647, 2012.
Liu, et al., "Efficient Planar Heterojunction Perovskite Solar Cells by Vapour Deposition," Nature, 501, pp. 395-398, 2013.
Mitzi, "Templating and Structural Engineering in Organic Inorganic Perovskites," Journal of the Chemical Society, Dalton Transactions, No. 1, pp. 1-12, 2001.
Noh et al., "Chemical Management for Colorful, Efficient, and Stable Inorganic-Organic Hybrid Nanostructured Solar Cells," Nano Letters, pp. 1764-1769, 2013.
Schmidt-Mende, et al., "Organic Dye for Highly Efficient Solid-State Dye-Sensitized Solar Cells," Adv. Mater., 17(7), pp. 813-815, 2005.
Snaith, "Estimating the Maximum Attainable Efficiency in Dye-Sensitized Solar Cells," Advanced Functional Materials 20, pp. 13-19, 2010.

(56) References Cited

OTHER PUBLICATIONS

Song et al., "Disordered Submicron Structures Integrated on Glass Substrate for Broadband Absorption Enhancement of Thin-Film Solar Cells," Solar Energy Materials & Solar Cells 101, pp. 73-78, 2012.
Smith, et al., "The CIE Colorimetric Standards and Their Use," Trans. Opt. Soc., 33, pp. 73-134, 1932.
Zeng, et al. Efficient Dye-Sensitized Solar Cells with an Organic Photosensitizer Featuring Orderly Conjugated Ethylenedioxythiophene and Dithienosilole Blocks, Chem. Mater. 22, pp. 1915-1925, 2010.
Zhang et al., "Preparations and Characterizations of Luminescent Two Dimensional Organic-Inorganic Perovksite Semicondutors," Materials, 3, pp. 3385-3406, 2010.

* cited by examiner (a)

(b)

PHOTOACTIVE LAYER PRODUCTION PROCESS

FIELD OF THE INVENTION

The invention relates to processes for producing semi-transparent photoactive layers and processes for producing devices containing semi-transparent photoactive layers. Also disclosed are semi-transparent photoactive layers and devices containing the same. Semi-transparent photoactive layers are useful for producing semi-transparent optoelectronic devices and building-integrated photovoltaics.

BACKGROUND TO THE INVENTION

Building-integrated photovoltaics are an attractive concept for economic generation of solar power. Integration of semi-transparent solar cells into windows is of particular interest, since it opens the prospect of employing the entire façade of a building for solar power generation, rather than simply employing the limited roof space. In order for such solar windows to be practical, costs must be low, and ideally they can be manufactured through existing coating methods employed in the glazing industry. They need to generate significant power, whilst still having good transparency. Furthermore, whilst coloured windows are interesting for novel applications, and a "splash" of colour may be desirable, the largest demand is for neutral-colour tinted windows with controllable levels of tinting.

Most recent approaches to achieve uniformly coated semi-transparency in solar cells have used organic solar cells or dye-sensitized cells (see, for instance, Kang, M. G., Park, N., Park, Y. J., Ryu, K. S. & H., C. S., Solar Energy Materials and Solar Cells, 75, 475-479, 2003). These technologies are solution-processable, representing a low-cost production method and easily scalable. However, their efficiencies are limited by fundamental charge transfer losses. As such, attempts to produce semi-transparent organic photovoltaics have resulted in either unsatisfactory performance or a lower visible transmittance than desired. To attain colour-neutrality, the active materials must be chosen carefully, often at a loss to overall efficiency (Amen, T. et al., Advanced Functional Materials, 20, 1592-1598, 2010). An option with thin-film solar technologies is to simply reduce the thickness of the absorber to allow transparency. Indeed, this is precisely what is done with amorphous silicon, currently being installed in BIPV. However, if this is done with any conventional semiconductor, such as amorphous silicon, the film will take on a red or brown tint due to the absorption coefficient increasing from the band-gap.

Semiconducting perovskites have recently emerged as a new and interesting class of photovoltaic materials. They offer solution-processable bulk semiconductors which can be fabricated using inexpensive and abundant materials. Single junction power conversion efficiencies of up to 12.3% have now been demonstrated (see, for instance, Lee, M. M., Teuscher, J., Miyasaka, T., Murakami, T. N. & Snaith, H. J., Science, 338, 643-7, 2012; Ball, J. M., Lee, M. M., Hey, A. & Snaith, H. J., Energy & Environmental Science, 2013, doi:10.1039/b000000x). The inventors' recent work has shown that high-efficiency perovskite solar cells can be produced at low temperatures and in a fully planar heterojunction thin-film architecture, greatly reducing fabrication costs and simplifying the design. These characteristics would make such perovskites ideal materials for fabrication of semi-transparent windows. However, although the methylammonium lead halide perovskite responsible for the highest efficiencies has absorption across the whole visible spectrum, uniform films that are thin enough to be semi-transparent have greater absorption in the high-energy end of the spectrum, as is observed with conventional semiconductors, meaning that they appear brown, or red in transmission. Though "bronze" is a choice for solar glazing, it does not represent the most desirable glazing option.

SUMMARY OF THE INVENTION

The inventors have studied and modelled dewetting of solution-processed photoactive films, including perovskite films, during formation and crystallisation. They determined the important parameters for minimising dewetting during annealing, and used the model developed to attain full-coverage of $CH_3NH_3PbI_{3-x}Cl_x$ perovskite films, demonstrating high efficiency planar heterojunction solar cells with no mesoporous layers. In performing this work, the inventors realised that in addition to minimising dewetting, they could use their processing knowledge to control dewetting, and here they invented a new concept for the fabrication of semi-transparent solar cells. Contrary to established practice, they maximise dewetting of a solid thin photoactive film, to form a micro-structured array of photoactive islands. The length scale of the islands and dewet regions is significantly larger than the wavelength of light, and as such the light passes through the regions with no photoactive material, and the islands are of adequate thickness to absorb strongly across the whole visible spectrum. The combination of fully absorbing photoactive islands and transmitted light, results in solar cells which are of neutral colour and semi-transparent. By varying the extent of dewetting of the thin film, hence altering the diameter of the islands of photoactive material (for instance perovskite), the inventors can tune the average visible transmission. With average transmission of ~50% high power conversion efficiencies of up to 5% are obtained for dewet films of perovskite incorporated into complete solar cells. This represents a promising new technology for low-temperature solution-processable semi-transparent solar cells. The inventors have also demonstrated the ease of colour-tinting such semi-transparent cells with no reduction in cell efficiency, via incorporation of a dye within an inert matrix in the regions where light would otherwise pass through.

Thus, the invention relates to a process for producing a semi-transparent photoactive layer comprising a dewet layer of a photoactive material. This process allows the production of neutrally coloured semi-transparent optoelectronic devices using easily scaled-up technologies. Dewetting produces a semi-transparent micro-structured array of photoactive regions with minimal effort. These photoactive layers and devices will enable building-integrated optoelectronic devices to be produced economically.

Accordingly, the invention provides a process for producing a semi-transparent photoactive layer, comprising:

a) disposing on a substrate a composition, which composition comprises a photoactive material or one or more precursors of a photoactive material, to form a resulting layer; and b) dewetting the resulting layer to form a dewet layer of the photoactive material, wherein the dewet layer of the photoactive material is semi-transparent.

The invention also provides a semi-transparent photoactive layer which is obtainable by a process according to the invention for producing a semi-transparent photoactive layer.

Furthermore, the invention provides a semi-transparent photoactive layer comprising a substrate and, disposed on the substrate, a dewet layer of a photoactive material, wherein the dewet layer of a photoactive material comprises:

a plurality of absorbing regions which comprise the photoactive material; and a plurality of transparent regions which do not substantially comprise the photoactive material.

The invention also provides a process for producing an optoelectronic device, comprising:

a) producing a semi-transparent photoactive layer by a process according to the invention; and b) disposing on the semi-transparent photoactive layer a layer of a semiconductor.

Optoelectronic devices obtainable by a process according to the invention are also provided.

An optoelectronic device is also provided, wherein the optoelectronic device comprises a semi-transparent photoactive layer wherein the photoactive layer comprises a substrate and, disposed on the substrate, a dewet layer of a photoactive material, wherein the dewet layer of a photoactive material comprises:

a plurality of absorbing regions which comprise the photoactive material; and a plurality of transparent regions which do not substantially comprise the photoactive material.

Building and automotive components comprising a photoactive layer according to the invention are also provided.

BRIEF DESCRIPTION OF THE FIGURES

FIG. 12 shows total transmission of a semi-transparent perovskite film (black) and a semi-transparent perovskite film with a spin-coated layer of Rhodamine B dye in a polystyrene matrix (grey), measured with an integrating sphere. The contribution of the dye to the transmission spectrum is clearly seen, between 450 and 650 nm.

DETAILED DESCRIPTION OF THE INVENTION

Figure 1:
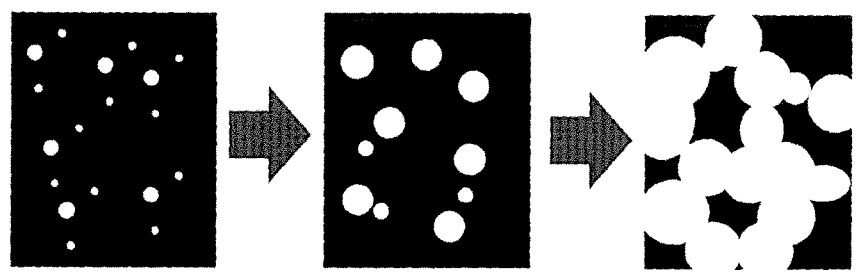
FIG. 1 shows a schematic representation of a dewetting process where holes initially form in a material after casting and initial solvent evaporation, and then as the material proceeds to fully crystallize, the films dewet further and the holes grow to produce isolated regions of the dewet material. The fractional dewetting of the film (ratio of coated to non-coated regions) depends upon parameters such as as-cast film thickness, the temperature of the annealing, the non-stoichiometry of the as cast material, the surface energy interaction between the material in the film and the substrate.

The invention provides a process for producing a semi-transparent photoactive layer comprising:

a) disposing on a substrate a composition, which composition comprises a photoactive material or one or more precursors of a photoactive material, to form a resulting layer; and b) dewetting the resulting layer to form a dewet layer of the photoactive material, wherein the dewet layer of the photoactive material is semi-transparent.

Parts (a) and (b) of the process may be performed either sequentially or simultaneously. Typically (a) is performed first and then (b) is performed. However, (a) and (b) may be performed simultaneously. Often, for instance, the process in (a) will be initiated and, while (a) is being performed, the process in (b) will be initiated such that the resulting layer is dewetting while more of the composition is disposed on the substrate. For instance, dewetting may occur while the composition is disposed.

The term "semi-transparent", as used herein, refers to material or object which has a transmission (alternatively and equivalently referred to as a transmittance) to visible light intermediate between a transparent material or object and an opaque material or object. Typically, a transparent material will have an average transmission for visible light (generally light with a wavelength of from 370 to 740 nm) of around 100%, or from 90 to 100%. Typically, an opaque material will have an average transmission for visible light of around 0%, or from 0 to 5%. A semi-transparent material or object will typically have an average transmission for visible light of from 10 to 90%, typically 40 to 60%. Unlike many translucent objects, semi-transparent objects do not typically distort or blur images. Transmission for light may be measured using routine methods, for instance by comparing the intensity of the incident light with the intensity of the transmitted light.

The term "photoactive layer", as used herein, refers to a layer which comprises a photoactive material, or a layer which comprises a layer of a photoactive material. The photoactive layer may further comprise other layers and materials. For instance, a photoactive layer according to the invention may comprise a substrate and a dewet layer of a photoactive material. The substrate may be inert, or may comprise further photoactive materials or conductive materials.

The term "disposing on", as used herein, does not necessarily mean "disposing directly on" (it includes, but is not limited to, "disposing directly on"). Thus, when the term "disposing on" is used herein in the context of disposing a component onto a substrate, the term does not necessarily imply that the component is disposed directly onto a surface of the substrate; rather, there may be an intervening layer or layers in between the substrate on which the component is being disposed and the component itself. Often, however, disposing a component onto a substrate will involve disposing the component directly onto a surface of the substrate.

The term "substrate", as used herein, refers generally to an object or material on which a composition may be disposed. The substrate may, for instance, be a piece of glass or a component for an optoelectronic device, for instance an electrode or an electrode with a compact layer of a semiconductor on it. The substrate may for instance be a polymer foil with high transparency, such as poly(ethylene terephthalate) (PET). The substrate may comprise a layer of a transparent material, for instance glass or a transparent polymer (e.g. PET) foil, a layer of a first electrode material, and a layer of an n-type semiconductor, for instance a compact layer of $TiO_2$.

The term "photoactive material", as used herein, refers to a material which either (i) absorbs light, which may then generate free charge carriers; or (ii) accepts charge, both electrons and holes, which may subsequently recombine and emit light.

The term "one or more precursors of a photoactive material", as used herein, refers to a one or more compounds or materials which will form the photoactive material under certain conditions, for instance when combined in solution. For instance if A and B together form C when combined (for instance on contact in solution, or once crystallised together from solution), A and B are precursors of C.

The term "layer", as used herein, refers to any structure which is substantially laminar in form (for instance extending substantially in two perpendicular directions, but limited in its extension in the third perpendicular direction). A layer may have a varying thickness, and may vary in thickness to the extent that some regions in the layer have a thickness substantially of 0 nm (and thus substantially comprising none of the material which forms the layer). For instance a layer of a material may comprise a plurality of unconnected regions of the material provided these regions are all contained within a layer-like region. "Layer" is not restricted to single layers of a single material but includes any multilayered system of one of more materials.

The term "resulting layer", as used herein, refers to a layer of material formed by the disposition of the composition comprising a photoactive material, or one or more precursors of a photoactive material. The resulting layer may comprise the composition itself, the photoactive material and/or one or more precursors of the photoactive material. In some cases, the resulting layer may be a layer of the photoactive material. In other cases, the resulting layer may be a layer of the composition comprising the photoactive material, or may be a layer of the composition comprising one or more precursors of the photoactive material. The resulting layer will not necessarily be a homogenous and continuous layer of the disposed composition. For instance, the resulting layer may itself be dewet to some extent when it is formed. For example, the resulting layer may be a layer of a composition comprising the photoactive material which has dewet to some extent, and which may then dewet further during (b) (which may occur simultaneously with the disposition of the composition). If the composition comprises a solvent (as described below), the solvent may be removed from the composition during (a) or (b). For instance, if the composition comprises a solvent, the solvent may evaporate during (a) and/or (b). If the composition comprises one or more precursors of a photoactive material, the precursor compounds may combine or react to form the photoactive material at any stage of the process. For instance, the precursor compounds may react as soon as the composition is disposed to form a resulting layer which comprises the photoactive material, wherein the resulting layer may then dewet to form the dewet layer of the photoactive material; or the photoactive material may form while the resulting layer is dewetting. The resulting layer may be a layer of a liquid material or a layer of a solid material, or a layer comprising both solid and liquid materials.

The term "dewetting", as used herein, refers to the process whereby a layer of a material on a surface is disrupted, initially forming holes in the layer of a material, and then the material may separate into two distinct phases, one phase of areas of the material (droplets, platelets or continuous but non-complete film) and the other phase of voids, or absences of the material. The process may occur by a liquid composition comprising the material dewetting (and then the solvent may be removed); by a solid layer melting into a liquid state and the liquid state then dewetting; by solid state diffusion of a solid layer of the material; or by a combination of these processes. Dewetting occurs as it minimises the surface energy of the photoactive material/substrate interface, the photoactive material/air (or vacuum) interface and the substrate/air (or vacuum) interface. Here, reference to air includes reference to any gaseous atmosphere under which dewetting is carried out, for instance a nitrogen atmosphere. The extent to which a material de-wets a surface depends on the surface energies of each component of the system and other factors such as layer thickness, curing temperature and stoichiometry of the as-deposited film. As shown schematically in FIG. 1, a layer of material can dewet to form a dewet layer which may contain a plurality of holes in the layer of the material. This occurs in the early stage of dewetting process where the film is initially disrupted and holes form. As the dewetting progresses, these holes grow until they intersect, forming isolated areas of the photoactive material. This occurs in the middle stages of dewetting. As the dewetting proceeds further, the isolated areas of photoactive material may contract into smaller areas (which may be associated with an increase in thickness of the areas of photoactive material). The separation between individual "islands" of the photoactive material may increase. This occurs in the late stages of dewetting. Herein, dewetting does not proceed to the extent that there is no material left on the substrate.

FIG. 1 shows a schematic representation of a dewetting process where holes initially form in a material after casting and initial solvent evaporation, and then as the material proceeds to fully crystallize, the films dewet further the holes grow to produce isolated regions of the dewet material. The fractional dewetting of the film (ratio of coated to non-coated regions) depends upon parameters such as as-cast film thickness, the temperature of the annealing, the non-stoichiometry of the as-cast material, the surface energy interaction between the material in the film and the substrate.

The term "platelet", as used herein, refers to a collection of matter in the form of a flattened volume or disc. For instance, a platelet may be a collection of matter which is from 50 nm to 1 μm thick, and extends for from 2 to 100 μm in the two transverse directions. The shape of a platelet as viewed from above may be circular, substantially circular or may have any shape including concave and convex components of the outline.

The term "dewet layer", as used herein, refers to a layer of a material wherein the material has been dewet. The layer may have been dewet to any extent. Accordingly, a dewet layer will comprise either a plurality of holes in the material (for instance if the material has only dewet the surface to a small extent) or a plurality of isolated regions of the material (for instance if the material has substantially dewet the surface). Isolated regions of material may themselves comprise holes, and holes in the material may themselves contain isolated regions of the material. A dewet layer will still comprise the photoactive material, whether as a continuous mass perforated with a plurality of holes (early stage dewetting) or a plurality of unconnected regions comprising the photoactive material (late stage dewetting). A dewet layer may comprise combinations of these forms (i.e. early and late stage dewetting). A dewet layer of a material, as discussed herein, will generally have a coverage of the material of greater than or equal to 5%, or greater than or equal to 10% and typically a coverage of greater than or equal to 20%. As will be understood by the skilled person, the term "coverage of the material", as used herein, refers to the percentage of the area of the surface of the substrate on which the material is disposed which is covered by the material. A dewet layer may also be referred to as a partially dewet layer, and any use of the term "dewet layer" herein includes reference to a "partially dewet layer". Both dewet layers and partially dewet layers may be layers wherein dewetting has not proceeded to the fullest possible extent. A partially dewet layer of a material may comprise a continuous mass of the material which comprises (is perforated with) a plurality of holes which do not substantially comprise the material, or may comprise a plurality of unconnected regions of the material. A partially dewet material may be dewet to a small extent, or may be substantially dewet. "Perforation" does not imply that holes have been made by actively removing the material (for instance by etching), but that holes have formed due to dewetting.

The dewet layer of the photoactive material typically comprises:

a plurality of absorbing regions which comprise the photoactive material; and a plurality of transparent regions which do not substantially comprise the photoactive material.

The term "absorbing region", as used herein refers to a region which comprises the photoactive material and accordingly absorbs light. Absorbing regions are often isolated islands, droplets or platelets of the photoactive material disposed on the surface of the substrate, but may also be large continuous regions of the photoactive material which surround holes in the photoactive material (wherein the holes correspond to transparent regions).

The term "transparent region" as used herein, refers to a region which does not substantially comprise the photoactive material. In the substantial absence of the photoactive material, light is free to pass through the transparent regions. Of course, the regions in the photoactive layer as a whole which correspond to transparent regions in the dewet layer of the photoactive material will only be transparent insofar as the substrate on which the photoactive material is disposed is transparent. The substrate is typically transparent or semi-transparent.

The phrase "which do not substantially comprise the photoactive material", as used herein, refers to regions which comprise either none of the photoactive material whatsoever, or which comprise a small amount of the photoactive material which still allows light to pass through. For instance a number of nano-crystals or small clusters of the photoactive material may still be disposed on the substrate in the transparent region, or a very thin layer of the photoactive material may remain, provided it does not noticeably colour the light or absorb the light. For instance, the dewet layer of the photoactive material may comprises a plurality of absorbing regions which comprise the photoactive material and a plurality of transparent regions which comprise a layer of the photoactive material with a thickness of less than 10 nm, less than 5 nm, or less than 1 nm. For instance, the dewet layer of the photoactive material may comprises a plurality of absorbing regions which comprise the photoactive material and a plurality of transparent regions which comprise a layer of the photoactive material with a thickness of from 0 to 10 nm, from 0 to 5 nm, or from 0 to 1 nm.

Figure 3:
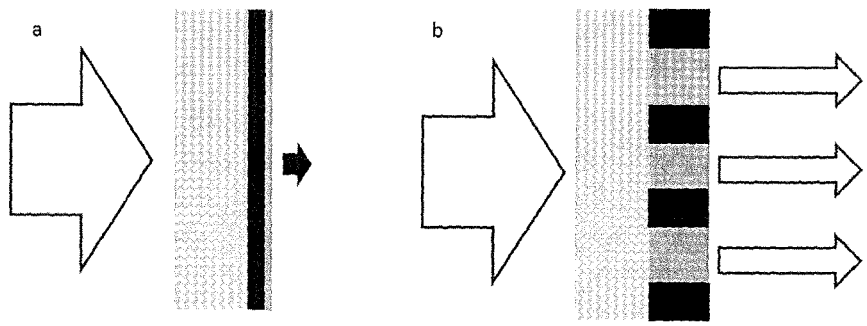
FIG. 3 shows a schematic representation of the difference between obtaining semi-transparency through using a thin film of the absorbing material or through using a perforated layer of the absorbing material. In a) the film is continuous and absorbs most light, producing light that is coloured, typically brown if the band gap of the absorber is in the near infrared region of the spectrum. In b) the absorbent areas are thick enough to absorb the majority of the incident sun light over the visible region of the spectrum, yet the transparent areas allow light of all wavelengths to pass through producing light which is uncoloured, or predominantly flat in transmission spectrum.

As discussed above, a thin film of a photoactive material often leads to the tinting of light passing through. Dewet layers avoid this problem. FIG. 3 shows a schematic representation of the difference between obtaining semi-transparency through using a thin film of the absorbing material or through using a perforated layer of the absorbing material. In a) the film is continuous and absorbs most light, producing light that is coloured, typically brown if the band gap of the absorber is in the near infrared region of the spectrum. In b) the absorbent areas are thick enough to absorb the majority of the incident sun light over the visible region of the spectrum, yet the transparent areas allow light of all wavelengths to pass through producing light which is uncoloured, or predominantly flat in transmission spectrum.

Typically, (b) comprises dewetting the resulting layer until a dewet layer of the photoactive material is formed which comprises:

i) a plurality of unconnected absorbing regions of the photoactive material, wherein the average radius of the absorbing regions is from 0.4 µm to 100 µm and the average distance between the centres of two adjacent absorbing regions is from 1 µm to 300 µm; or ii) a plurality of unconnected transparent regions which do not substantially comprise the photoactive material, wherein the average diameter of the transparent regions is from 400 nm to 300 µm.

The term "unconnected", as used herein, refers to two or more regions of a material which are not in contact and are not contiguous, i.e. do not have a continuous mass of the material which connects the two regions (in the case of unconnected absorbing regions) or to two or more regions which do not substantially comprise the material and which are not contiguous, i.e. do not have a continuous substantial absence of the material which connects the two regions (in the case of unconnected transparent regions).

The radius or diameter of a region is measured as the radius or diameter of a circle of the same area as the region. For instance to evaluate the radius or diameter of a square region, the area of the square region is measured, and then the radius or diameter of that region is the radius or diameter of a circle having the same area as the square region. An average radius or diameter may be evaluated by measuring the radii or diameters of all of the regions in a given (sufficiently large) area of the photoactive layer and then taking an average.

The distance between the centres of two adjacent absorbing regions is the distance between the centres (calculated as the (two-dimensional) centre of mass of the region) of two adjacent (nearest neighbour) regions. The nearest neighbours may be calculated by evaluating the Delaunay triangulation of the centres of masses of the regions and those regions with centres which are connected are nearest neighbours.

If the absorbing regions are unconnected (i.e. significant dewetting has occurred) then the average radius of the absorbing regions may be from 0.4 to 100 µm, from 1 to 20 µm or from 2 to 5 µm, and the average distance between the centres of two adjacent absorbing regions may be from 1 to 300 µm, from 1 to 50 µm or from 5 to 20 µm. In a case where the dewet layer of the photoactive layer material is only partially dewet and comprises a connected absorbing region perforated with a plurality of unconnected transparent regions, then the average diameter of the transparent regions may be greater than 400 nm, from 400 nm to 300 µm, from 700 nm to 300 µm, or from 700 nm to 50 µm.

In order for the photoactive layer to be semi-transparent, the length scale of the dewet layer of the photoactive material must be greater than the wavelength of visible light so that the light may pass through the transparent regions in the dewet layer of the photoactive material without being substantially absorbed or diffracted. The length scale of the dewet layer, or the size of holes in dewet layer may be such that only some wavelengths of visible light can transmit. For instance a smaller length scale, say less than 500 nm, may still lead to a semi-transparent layer, but the light which transmits will be that with a shorter wavelength, i.e. blue light. Typically, therefore, the length scale of the dewet layer of the photoactive material is greater than or equal to 400 nm, greater than or equal 700 nm, greater than or equal to 1 µm, or from 700 nm to 300 µm. The length scale of a dewet layer is the characterising length of the transparent regions. Here, the length scale may, for instance, be defined to be the diameter of a circle, wherein the circle is the largest circle that can always be placed wholly within at least one transparent region in any circular area of the dewet layer, which circular area has a diameter of 20 times (or optionally 10 or 30 times) that of the circle being placed. For instance, if the length scale of the dewet layer of the photoactive material is 1 µm, then this means that in any circular region of the dewet layer with a diameter of 20 µm, there will be at least one transparent region which is large enough to wholly fit a circle of diameter 1 µm inside. Therefore, in one embodiment, (b) comprises dewetting the resulting layer until a dewet layer of the photoactive material with a length scale of greater than or equal to 400 nm is formed. Step (b) may for instance comprise dewetting the resulting layer until a dewet layer of the photoactive material with a length scale of greater than or equal to 1 µm is formed. The resulting layer may for instance be dewet until the length scale is from 700 nm to 300 µm, or from 1 µm to 30 µm. Typically the resulting layer is dewet until the length scale is from 1 µm to 30 µm. If the length scale is too large, then the film will become visibly patchy to the eye, and the benefit of the invention to obtain visually uniform transparency will be lost.

Length scales, average radii and diameters may all be measured by analysing SEM images of the dewet layer. SEM images may be taken during dewetting to assess how much more dewetting is required, or whether the desired coverage, average radii and/or length scale of the dewet layer has been achieved. These parameters may be evaluated by computer assisted analysis of SEM images.

A benefit of the present invention is that a semi-transparent layer of a photoactive material is obtained with minimal effort as the dewetting process itself creates a micro-structured array of transparent and absorbing regions. Dewetting provides a semi-transparent layer with excellent optical properties.

The average thickness of the dewet layer of the photoactive material may be from 50 nm to 2 μm. Optionally, the average thickness of the layer may be from 50 nm to 10 μm, from 50 to 500 nm, or from 50 to 200 nm. The average thickness of the dewet layer is the average maximum height of absorbing regions in the dewet layer. This can be measured by analysing (cross-sectional) SEM images of the dewet layer of the photoactive material.

In order to allow the photoactive layer to be semi-transparent, the dewet layer of the photoactive material typically has a coverage of the photoactive material of from 20% to 90%. The coverage of the photoactive material may be from 30% to 70%, or typically from 40% to 60%. As will be understood by the skilled person, the term "coverage of the photoactive material", as used herein, refers to the percentage of the area of the surface of the substrate which is covered by the photoactive material. This may be measured by analysing SEM images of the dewet layer.

The dewet layer of the photoactive material usually has an average transmission of from 10% to 90% for light with a wavelength of from 370 nm to 740 nm. Often, the dewet layer of the photoactive material has an average transmission of from 20% to 80%, or from 30% to 75% for light with a wavelength of from 370 nm to 740 nm. Typically, the average transmission is from 30% to 75% for these wavelengths of light. In some cases, the average transmission is from 40% to 60% for these wavelengths of light. The average transmission may be for light with a wavelength of from 200 nm to 800 nm.

The average transmission for light over a range of wavelengths is measured by taking the average of transmissions for light of each of the wavelengths. This is evaluated by taking a transmission spectrum of the dewet layer. Often, it is desirable that the transmission spectrum of the dewet layer is "flat", meaning that the transmission for each of the wavelengths is similar (e.g. all within a 20% range). This may be desirable as it will lead to the light passing through the layer remaining uncoloured. Of course, in some cases coloured light may be desirable. Measurement of the average transmission for visible light is a convenient way to assess whether sufficient dewetting has occurred. If the transmission of visible light is as desired (for instance from 10% to 90%, or from 20% to 80%), it may not be necessary to assess and evaluate the actual form of the dewet layer in terms of length scales.

The term "semiconductor material", as used herein, refers to a material with electrical conductivity intermediate in magnitude between that of a conductor and an insulator. Typically, a semiconductor material is a material that has a conductivity of from $10^3$ to $10^{-8}$ Scm$^{-1}$. Standard techniques such as a 4-point probe conductivity measurement may be used to measure conductivity. Examples of semiconductor materials include an oxide or chalcogenide of a metal or metalloid element; a group IV compound; a compound comprising a group III element and a group V element; a compound comprising a group II element and a group VI element; a compound comprising a group I element and a group VII element; a compound comprising a group IV element and a group VI element; a compound comprising a group V element and a group VI element; a compound comprising a group II element and a group V element; a ternary or quaternary compound semiconductor; a perovskite semiconductor or an organic semiconductor. Typical examples of semiconductor materials include oxides of titanium, niobium, tin, zinc, cadmium, copper or lead; chalcogenides of antimony or bismuth; copper zinc tin sulphide; copper zinc tin selenide, copper zinc tin selenide sulphide, copper indium gallium selenide; copper indium gallium diselenide; and copper indium gallium diselenide sulphide. Further examples are group IV compound semiconductors (e.g. silicon carbide); group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide); ternary or quaternary semiconductors (e.g. copper indium selenide, copper indium gallium diselenide, or copper zinc tin sulphide); and perovskite semiconductor materials (e.g. $CH_3NH_3PbI_3$, $CH_3NH_3PbI_2Cl$, $CH_3NH_3PbI_{3-x}Cl_x$, $CH_3NH_3PbI_{3-x}Br_x$ (where x is from 0.0 to 3.0) and other perovskites as defined below). Examples of materials which are not semiconductor materials include, for instance elemental metals, which are of course conductors, and electrical insulators or dielectrics such as silica, alumina or calcite.

The term "oxide", as used herein, refers to a compound comprising at least one oxide ion (i.e. $O^{2-}$) or divalent oxygen atom. It is to be understood that the terms "metal oxide" and "an oxide of a metal element" used herein encompass both oxides comprising one metal, and also mixed-metal oxides. For the avoidance of doubt, a mixed-metal oxide refers to a single oxide compound comprising more than one metal element. Examples of mixed-metal oxides include zinc tin oxide and indium tin oxide. Similarly, it is to be understood that the terms "metalloid oxide" and "an oxide of a metalloid element" used herein encompass oxides comprising one metalloid element and also mixed-metalloid oxides. For the avoidance of doubt, a mixed-metalloid oxide refers to a single oxide compound comprising more than one metalloid element.

The tem "chalcogenide", used herein, refers to a compound comprising at least one of a sulphide, selenide or telluride ion (i.e. $S^{2-}$, $Se^{2-}$, or $Te^{2-}$) or a divalent sulphur, selenium or tellurium atom. It is to be understood that the terms "metal chalcogenide" and "a chalcogenide of a metal element" encompass chalcogenides comprising one metal and also mixed-metal chalcogenides. For the avoidance of doubt, a mixed-metal chalcogenide refers to a single chalcogenide compound comprising more than one metal element. Similarly, it is to be understood that the terms "metalloid chalcogenide" and "a chalcogenide of a metalloid element" used herein encompass chalcogenides comprising one metalloid and also mixed-metalloid chalcogenides. For the avoidance of doubt, a mixed-metalloid chalcogenide refers to a single chalcogenide compound comprising more than one metalloid element.

The term "metal", as used herein, refers to any metallic element. Metallic elements are those which have a delocalised band of electrons. Examples of metals include Li, Na, K, Rb, Cs, Mg, Ca, Sr, Ba, Sc, Y, Lu, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Hg, Al, Ga, In, Tl, Sn, Pb, and Bi.

The term "metalloid", as used herein, refers to any element which is a metalloid. Metalloid elements are those which have properties which are intermediate between those of metals and non-metals. Typically, the metalloids are taken to include B, Si, Ge, As, Sb and Te.

The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula $[A][B][X]_3$, wherein [A] is at least one cation, [B] is at least one cation and [X] is at least one anion. When a perovskite comprise more than one A cation, the different A cations may distributed over the A sites in an ordered or disordered way. When a perovskite comprises more than one B cation, the different B cations may distributed over the B sites in an ordered or disordered way. When a perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "organic cation" refers to a cation comprising carbon. The cation may comprise further elements, for example, the cation may comprise hydrogen, nitrogen or oxygen.

The term "halide" refers to an anion of a group 7 element, i.e., of a halogen. Typically, halide refers to a fluoride anion, a chloride anion, a bromide anion, or an iodide anion.

The term "treating", as used herein, refers to any process in which one compound is allowed to react or interact with another. This may be done through any appropriate process. Treating includes, inter alia, exposing two or more reagents to each other, mixing two or more reagents in their solid state, adding a solution of one or more reagents to a solid form of the other, adding a solid of one or more reagents to a solution of another, mixing solutions of two or more reagents, or mixing solutions of two or more reagents and then adding a solid of a third and optionally further reagents. One of the listed reagents by which another is treated may be added as the reagent itself, or may be added as a precursor that converts by some process to the reagent itself. Therefore, treating a compound A with a compound B includes treating compound A with a precursor to compound B which converts to compound B by any method, including, inter alia, converting to B when dissolved, converting to B due to exposure to A, converting to B under basic or acidic conditions, and converting to B over time in a decomposition type process.

As used herein, an alkyl group can be a substituted or unsubstituted, linear or branched chain saturated radical, it is often a substituted or an unsubstituted linear chain saturated radical, more often an unsubstituted linear chain saturated radical. A $C_1$-$C_{20}$ alkyl group is an unsubstituted or substituted, straight or branched chain saturated hydrocarbon radical. Typically it is $C_1$-$C_{10}$ alkyl, for example methyl, ethyl, propyl, butyl, pentyl, hexyl, heptyl, octyl, nonyl or decyl, or $C_1$-$C_6$ alkyl, for example methyl, ethyl, propyl, butyl, pentyl or hexyl, or $C_1$-$C_4$ alkyl, for example methyl, ethyl, i-propyl, n-propyl, t-butyl, s-butyl or n-butyl.

When an alkyl group is substituted it typically bears one or more substituents selected from substituted or unsubstituted $C_1$-$C_{20}$ alkyl, substituted or unsubstituted aryl (as defined herein), cyano, amino, $C_1$-$C_{10}$ alkylamino, di($C_1$-$C_{10}$)alkylamino, arylamino, diarylamino, arylalkylamino, amido, acylamido, hydroxy, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a $C_1$-$C_{20}$ alkyl group in which at least one hydrogen atom has been replaced with an aryl group. Examples of such groups include, but are not limited to, benzyl (phenylmethyl, $PhCH_2$—), benzhydryl ($Ph_2CH$—), trityl (triphenylmethyl, $Ph_3C$—), phenethyl (phenylethyl, $Ph$-$CH_2CH_2$—), styryl (Ph-CH=CH—), cinnamyl (Ph-CH=CH—$CH_2$—).

Typically a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, typically from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from $C_1$-$C_6$ alkyl which is unsubstituted (to form an aralkyl group), aryl which is unsubstituted, cyano, amino, $C_1$-$C_{10}$ alkylamino, di($C_1$-$C_{10}$)alkylamino, arylamino, diarylamino, arylalkylamino, amido, acylamido, hydroxy, halo, carboxy, ester, acyl, acyloxy, $C_1$-$C_{20}$ alkoxy, aryloxy, haloalkyl, sulfhydryl (i.e. thiol, —SH), $C_{1-10}$ alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single $C_1$-$C_6$ alkylene group, or with a bidentate group represented by the formula —X—($C_1$-$C_6$)alkylene, or —X—($C_1$-$C_6$)alkylene-X—, wherein X is selected from O, S and NR, and wherein R is H, aryl or $C_1$-$C_6$ alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically it carries 0, 1, 2 or 3 substituents.

The photoactive material typically comprises a semiconductor material.

The photoactive material typically comprises a solution-processable photoactive material. Solution-processable photoactive materials are desirable as they may be incorporated easily into pre-existing manufacturing technologies and the capital expenditure required for the film deposition equipment is much lower than for other methods of thin film deposition, such as vapour deposition. The term "solution-processable photoactive material", as used herein, refers to a photoactive material which is soluble, which may be formed from a solution comprising soluble precursor compounds, or which may be in suspension in a solution (for instance nanoparticles of an insoluble photoactive material). Photoactive perovskites are solution-processable, as are many ternary and quaternary semiconductors, e.g. CIGS and CZTSSe, or nanoparticles of semiconductors, e.g. PbS, PbS, GaAs, GIGS, CZTSSe.

The photoactive material may comprise a photoactive material which may be deposited by vapour deposition. For instance, the photoactive material may comprise a perovskite which may be deposited by vapour deposition.

The photoactive material may comprise a perovskite, cadmium oxide, copper oxide, lead oxide, crystalline silicon, amorphous silicon, silicon carbide, gallium arsenide, antimony sulfide, antimony selenide, antimony telluride, bismuth sulfide, bismuth selenide, bismuth telluride, cadmium sulfide, cadmium selenide, cadmium telluride, cadmium arsenide, cuprous chloride, cuprous iodide, lead selenide, lead sulphide, indium arsenide, indium phosphide, copper indium selenide, copper zinc tin sulphide, copper zinc tin selenide, copper zinc tin selenide sulphide, copper indium gallium selenide, copper indium gallium diselenide, or copper indium gallium diselenide sulphide.

Often, the photoactive material comprises a perovskite, gallium arsenide, lead selenide, lead sulphide, indium arsenide, indium phosphide, copper indium selenide, copper zinc tin sulphide, copper zinc tin selenide, copper zinc tin selenide sulphide, copper indium gallium selenide, copper indium gallium diselenide, or copper indium gallium diselenide sulphide.

In one embodiment, the photoactive material comprises a photoactive perovskite.

The photoactive perovskite is typically one which is capable of (i) absorbing light, and thereby generating free charge carriers; and/or (ii) emitting light, by accepting charge, both electrons and holes, which subsequently recombine and emit light.

Thus, the perovskite employed is typically a light-absorbing and/or a light-emitting perovskite.

Usually, the perovskite is a light-absorbing material. Typically the perovskite is capable of absorbing light having a wavelength of from 300 nm to 2000 nm (i.e. a perovskite which is capable of absorbing light that has a wavelength which falls anywhere within this range). More typically, the perovskite is one which is capable of absorbing light having a wavelength in the range of from 300 nm to 1200 nm, or, for instance, capable of absorbing light having a wavelength of from 300 nm to 1000 nm. More typically, the perovskite is one which is capable of absorbing light having a wavelength anywhere in the range of from 300 nm to 800 nm.

The photoactive perovskite typically has a band gap of equal to or less than 3.0 eV. In some embodiments, the band gap of the perovskite is less than or equal to 2.8 eV, for instance equal to or less than 2.5 eV. The band gap may for instance be less than or equal to 2.3 eV, or for instance less than or equal to 2.0 eV.

Usually, the band gap is at least 0.5 eV. Thus, the band gap of the perovskite may be from 0.5 eV to 2.8 eV. In some embodiments it is from 0.5 eV to 2.5 eV, or for example from 0.5 eV to 2.3 eV. The band gap of the perovskite may for instance be from 0.5 eV to 2.0 eV. In other embodiments, the band gap of the perovskite may be from 1.0 eV to 3.0 eV, or for instance from 1.0 eV to 2.8 eV. In some embodiments it is from 1.0 eV to 2.5 eV, or for example from 1.0 eV to 2.3 eV. The band gap of the perovskite may for instance be from 1.0 eV to 2.0 eV.

The band gap of the perovskite is more typically from 1.2 eV to 1.8 eV. The band gaps of organometal halide perovskites, for example, are typically in this range and may for instance, be about 1.5 eV or about 1.6 eV. Thus, in one embodiment the band gap of the perovskite is from 1.3 eV to 1.7 eV.

Several compounds with the perovskite structure are not photoactive. Some oxides such as $BaTiO_3$ also have a perovskite crystal structure. However, most of these perovskite oxides have band gaps greater than 3 eV and as such are not photoactive in the visible to near infrared region of the solar spectrum. In one embodiment, the photoactive material does not comprise a perovskite oxide.

The perovskite typically comprises at least one anion selected from halide anions and chalcogenide anions.

The perovskite often comprises a first cation, a second cation, and said at least one anion.

As the skilled person will appreciate, the perovskite may comprise further cations or further anions. For instance, the perovskite may comprise two, three or four different first cations; two, three or four different second cations; or two, three of four different anions.

Typically, the second cation in the perovskite is a metal cation. The metal may be selected from tin, lead and copper, and is typically selected from tin and lead.

More typically, the second cation is a divalent metal cation. For instance, the second cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. The second cation may be selected from $Sn^{2+}$, $Pb^{2+}$ and $Cu^{2+}$. Usually, the second cation is selected from $Sn^{2+}$ and $Pb^{2+}$.

The first cation in the perovskite is usually an organic cation.

Usually, in the optoelectronic device of the invention, the organic cation has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

Typically, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl, for instance. For instance, $R_1$ may be hydrogen or methyl, $R_2$ may be hydrogen or methyl, $R_3$ may be hydrogen or methyl, and $R_4$ may be hydrogen or methyl.

The organic cation may have the formula $(R_aNH_3)^+$, wherein: $R_a$ is hydrogen, or unsubstituted or substituted $C_1$-$C_{20}$ alkyl. For instance, $R_a$ may be methyl or ethyl. Typically, $R_a$ is methyl.

In some embodiments, the organic cation has the formula $(R_5R_6N=CH-NR_7R_8)^+$, wherein:

$R_5$ is hydrogen, unsubstituted or substituted $C_1$-$C_{20}$ alkyl, or unsubstituted or substituted aryl;

$R_6$ is hydrogen, unsubstituted or substituted $C_1$-$C_{20}$ alkyl, or unsubstituted or substituted aryl;

$R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, $R_5$ in the cation $(R_5R_6N=CH-NR_7R_8)^+$ is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

The organic cation may, for example, have the formula $(H_2N=CH-NH_2)^+$.

In one embodiment, the perovskite is a mixed-anion perovskite, wherein the mixed-anion perovskite comprises two or more different anions selected from halide anions and chalcogenide anions. Usually, said two or more different anions are two or more different halide anions.

Thus, the perovskite may be a mixed-anion perovskite comprising a first cation, a second cation, and two or more different anions selected from halide anions and chalcogenide anions. For instance, the mixed-anion perovskite may comprise two different anions and, for instance, the anions may be a halide anion and a chalcogenide anion, two different halide anions or two different chalcogenide anions. The first and second cations may be as further defined hereinbefore. Thus the first cation may be an organic cation, which may be as further defined herein. For instance it may be a cation of formula $(R_1R_2R_3R_4N)^+$, or formula $(R_aNH_3)^+$, as defined above. Alternatively, the organic cation may be a cation of formula $(R_5R_6N=CH-NR_7R_8)^+$ as defined above. The second cation may be a divalent metal cation. For instance, the second cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the second cation is selected from $Sn^{2+}$ and $Pb^{2+}$.

The perovskite may be a mixed-halide perovskite, wherein said two or more different anions are two or more different halide anions.

The photoactive material typically comprises a mixed-anion perovskite, wherein the mixed-anion perovskite comprises two or more different anions selected from halide anions and chalcogenide anions.

Typically, they are two or three different halide anions, more typically, two different halide anions. Usually the halide anions are selected from fluoride, chloride, bromide and iodide, for instance chloride, bromide and iodide.

Often, the perovskite is a perovskite compound of the formula (I):

$$[A][B][X]_3 \qquad (I)$$

wherein:
[A] is at least one organic cation;
[B] is at least one metal cation; and
[X] is said at least one anion.

The perovskite of formula (I) may comprise one, two, three or four different metal cations, typically one or two different metal cations. Also, the perovskite of the formula (I), may, for instance, comprise one, two, three or four different organic cations, typically one or two different organic cations. Likewise, the perovskite of formula (I), may, comprise one two, three or four different anions, typically two or three different anions.

The organic and metal cations in the perovskite compound of formula (I) may be as further defined hereinbefore. Thus the organic cations may be selected from cations of formula $(R_1R_2R_3R_4N)^+$, cations of formula $(R_aNH_3)^+$, and cations of formula $(R_5R_6N=CH-NR_7R_8)^+$ as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, and $Eu^{2+}$. Usually, the metal cation is $Sn^{2+}$ or $Pb^{2+}$.

The organic cation may, for instance, be selected from cations of formula $(R_5R_6N=CH-NR_7R_8)^+$ and a cation of formula $(H_2N=CH-NH_2)^+$. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, and $Eu^{2+}$. Usually, the metal cation is $Sn^{2+}$ or $Pb^{2+}$.

Typically, [X] in formula (I) is two or more different anions selected from halide anions and chalcogenide anions. More typically, [X] is two or more different halide anions.

In one embodiment, the perovskite is a perovskite compound of the formula (IA):

$$AB[X]_3 \qquad (IA)$$

wherein:
A is an organic cation;
B is a metal cation; and
[X] is two or more different halide anions.

Typically, [X] in formula (IA) is two or more different anions selected from halide anions and chalcogenide anions. Usually, [X] is two or more different halide anions. Typically, [X] is two or three different halide anions. More typically, [X] is two different halide anions. In another embodiment [X] is three different halide anions.

The organic and metal cations in the perovskite compound of formula (IA) may be as further defined hereinbefore. Thus the organic cation may be selected from cations of formula $(R_1R_2R_3R_4N)^+$, cations of formula $(R_aNH_3)^+$ and cations of formula $(R_5R_6N=CH-NR_7R_8)^+$, each as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the metal cation is $Sn^{2+}$ or $Pb^{2+}$.

The organic cation may, for instance, be selected from cations of formula $(R_5R_6N=CH-NR_7R_8)^+$, and a cation of formula $(H_2N=CH-NH_2)^+$. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the metal cation is $Sn^{2+}$ or $Pb^{2+}$.

Often, the perovskite is a perovskite compound of formula (II):

$$ABX_{3-y}X'_y \qquad (II)$$

wherein:
A is an organic cation;
B is a metal cation;
X is a first halide anion;
X' is a second halide anion which is different from the first halide anion; and
y is from 0.05 to 2.95.

Usually, y is from 0.5 to 2.5, for instance from 0.75 to 2.25. Typically, y is from 1 to 2.

Again, in formula (II), the organic and metal cations may be as further defined hereinbefore. Thus the organic cation may be a cation of formula $(R_1R_2R_3R_4N)^+$ or a cation of formula $(R_5R_6N=CH-NR_7R_8)^+$, or more typically, a cation of formula $(R_aNH_3)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the metal cation is $Sn^{2+}$ or $Pb^{2+}$.

In some embodiments, the perovskite is a perovskite compound of formula (IIa):

$$ABX_{3z}X'_{3(1-z)} \qquad (IIa)$$

wherein:

A is an organic cation of the formula $(R_5R_6N=CH-NR_7R_8)^+$, wherein:

$R_5$ is hydrogen, unsubstituted or substituted $C_1$-$C_{20}$ alkyl, or unsubstituted or substituted aryl;

$R_6$ is hydrogen, unsubstituted or substituted $C_1$-$C_{20}$ alkyl, or unsubstituted or substituted aryl;

$R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl;

B is a metal cation;

X is a first halide anion;

X' is a second halide anion which is different from the first halide anion; and z is greater than 0 and less than 1.

z is typically from 0.05 to 0.95.

Usually, z is from 0.1 to 0.9. z may, for instance, be 0.1, 0.2, 0.3, 0.4, 0.5, 0.6, 0.7, 0.8 or 0.9, or z may be a range of from any one of these values to any other of these values (for instance, from 0.2 to 0.7, or from 0.1 to 0.8).

B, X and X' may be as defined hereinbefore. The organic cation may, for instance, be $(R_5R_6N=CH-NR_7R_8)^+$, wherein: $R_5$, $R_6$, $R_7$ and $R_8$ are independently selected from hydrogen and unsubstituted or substituted $C_1$-$C_6$ alkyl. For instance, the organic cation may be $(H_2N=CH-NH_2)^+$.

The perovskite is typically a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

For instance, the perovskites may be selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

Typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$.

More typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$.

The perovskite is typically selected from $CH_3NH_3PbBrI_2$, $CH_3NH_3PbBrCl_2$, $CH_3NH_3PbIBr_2$, $CH_3NH_3PbICl_2$, $CH_3NH_3PbI_2Cl$, $CH_3NH_3SnF_2Br$, and $CH_3NH_3SnF_2I$.

The perovskite may be $CH_3NH_3PbI_2Cl$.

In some embodiments, the perovskite may be a perovskite of formula $(H_2N=CH-NH_2)PbI_{3z}Br_{3(1-z)}$, wherein z is greater than 0 or less than 1. z may be as further defined hereinbefore.

The perovskite may comprise said mixed-anion perovskite and a single-anion perovskite, for instance in a blend, wherein said single anion perovskite comprises a first cation, a second cation and an anion selected from halide anions and chalcogenide anions; wherein the first and second cations are as herein defined for said mixed-anion perovskite. For instance, the perovskite may comprise: $CH_3NH_3PbI_2Cl$ and $CH_3NH_3PbI_3$; $CH_3NH_3PbI_2Cl$ and $CH_3NH_3PbBr_3$; $CH_3NH_3PbBrCl_2$ and $CH_3NH_3PbI_3$; or $CH_3NH_3PbBrCl_2$ and $CH_3NH_3PbBr_3$.

The perovskite may be of formula $(H_2N=CH-NH_2)PbI_{3z}Br_{3(1-z)}$, wherein z is as defined herein, and a single-anion perovskite such as $(H_2N=CH-NH_2)PbI_3$ or $(H_2N=CH-NH_2)PbBr_3$.

The perovskite may comprise more than one perovskite, wherein each perovskite is a mixed-anion perovskite, and wherein said mixed-anion perovskite is as herein defined. For instance, the photoactive material may comprise two or three said perovskites. The photoactive material may, for instance, comprise two perovskites wherein both perovskites are mixed-anion perovskites. For instance, the photoactive material may comprise: $CH_3NH_3PbICl_2$ and $CH_3NH_3PbIBr_2$; $CH_3NH_3PbICl_2$ and $CH_3NH_3PbBrI_2$; $CH_3NH_3PbBrCl_2$ and $CH_3NH_3PbBrI_2$; or $CH_3NH_3PbBrCl_2$ and $CH_3NH_3PbIBr_2$.

The photoactive material may comprise two different perovskites, wherein each perovskite is a perovskite of formula $(H_2N=CH-NH_2)PbI_{3z}Br_{3(1-z)}$, wherein z is from 0 to 1 or is as defined herein.

In some embodiments of the invention, when [B] is a single metal cation which is $Pb^{2+}$, one of said two or more different halide anions is iodide or fluoride; and when [B] is a single metal cation which is $Sn^{2+}$ one of said two or more different halide anions is fluoride. Usually, one of said two or more different halide anions is iodide or fluoride. Typically, in some embodiments, one of said two or more different halide anions is iodide and another of said two or more different halide anions is fluoride or chloride. Often, in some embodiments, one of said two or more different halide anions is fluoride. Typically, in some embodiments of the invention, either: (a) one of said two or more different anions is fluoride and another of said two or more different anions is chloride, bromide or iodide; or (b) one of said two or more different anions is iodide and another of said two or more different anions is fluoride or chloride. Typically, [X] is two different halide anions X and X'. Often, said divalent metal cation is $Sn^{2+}$. Alternatively, said divalent metal cation may be $Pb^{2+}$.

The photoactive material typically comprises a mixed-halide perovskite of the formula (I)

$$[A][B][X]_3 \qquad (I)$$

wherein:

[A] is at least one organic cation of the formula $(R_1R_2R_3R_4N)^+$, wherein:

(i) $R_1$ is hydrogen, unsubstituted or substituted $C_1$-$C_{20}$ alkyl, or unsubstituted or substituted aryl;

(ii) $R_2$ is hydrogen, unsubstituted or substituted $C_1$-$C_{20}$ alkyl, or unsubstituted or substituted aryl;

(iii) $R_3$ is hydrogen, unsubstituted or substituted $C_1$-$C_{20}$ alkyl, or unsubstituted or substituted aryl; and (iv) $R_4$ is hydrogen, unsubstituted or substituted $C_1$-$C_{20}$ alkyl, or unsubstituted or substituted aryl; or

[A] is at least one organic cation of the formula $(R_5R_6N=CH-NR_7R_8)^+$, wherein:

(i) $R_5$ is hydrogen, unsubstituted or substituted $C_1$-$C_{20}$ alkyl, or unsubstituted or substituted aryl;

(ii) $R_6$ is hydrogen, unsubstituted or substituted $C_1$-$C_{20}$ alkyl, or unsubstituted or substituted aryl;

(iii) $R_7$ is hydrogen, unsubstituted or substituted $C_1$-$C_{20}$ alkyl, or unsubstituted or substituted aryl; and (iv) $R_8$ is hydrogen, unsubstituted or substituted $C_1$-$C_{20}$ alkyl, or unsubstituted or substituted aryl;

[B] is at least one divalent metal cation; and

[X] is two or more different halide anions.

The photoactive material typically comprises $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, $CH_3NH_3SnF_2Cl$, $(H_2N=CH-NH_2)PbI_3$, $(H_2N=CH-NH_2)PbBr_3$ or $(H_2N=CH-NH_2)PbI_{3z}Br_{3(1-z)}$, wherein z is from 0.0 to 1.0.

Optionally, the photoactive material may further comprise a dye or a pigment. The dye or pigment may be incorporated in the photoactive material or may be disposed on the surface of the photoactive material. The dye may be selected from any dye suitable for use in a photoactive layer or an optoelectronic device. These are well known to the skilled person. An example of a suitable dye is the indoline dye D102, an organic "push-pull" dye such as those described in T. Horiuchi et al. ("High Efficiency of Dye-Sensitized Solar Cells Based on Metal-Free Indoline Dyes", J. Am. Chem. Soc. 126, 12218-12219 (2004)), a ruthenium complex dye, an organic dyes such as those described in W. Zeng, et al. ("Efficient Dye-Sensitized Solar Cells with an Organic Photosensitizer Featuring Orderly Conjugated Ethylenedioxythiophene and Dithienosilole Blocks", Chem. Mater. 22, 1915-1925 (2010)) a rylene based dye such as those described in US 2012/0017995, Rhodamine dyes (including rhodamine B (9[9-(2-carboxyphenyl)-6-diethylamino-3-xanthenylidene]-diethylammonium chloride) and Rhodamine 6G ($C_{27}H_{29}ClN_2O_7$)), DCM (4-(dicyanomethylene)-2-methyl-6-(4-dimethylaminostyryl)-4H-pyran), Sulphan blue ([4-(α-(4-diethylaminophenyl)-5-hydroxy-2,4-disulfophenylmethylidene)-2,5-cyclohexadien-1-ylidene]diethylammonium hydroxide), Naphthol green B (trisodium; iron (3+); 5-nitroso-6-oxidonaphthalene-2-sulfonate), Azophloxin (sodium 8-acetamido-1-hydroxy-2-phenylazonaphthalene-3,6-disulphonate), Martius yellow ($C_{10}H_6N_2O_5$), Methyl orange (Sodium 4-[(4-dimethylamino)phenyldiazenyl]benzenesulfonate), Fluorescein (Spiro[isobenzofuran-1(3H),9'-[9H]xanthen]-3-one, 3',6'-dihydroxy-), Coumarin (2H-chromen-2-one), Stilbene ((E)-1, 2-diphenylethene), Umbelliferone (7-Hydroxychromen-2-one), tetracene, Malachite green (4-[(4-dimethylaminophenyl)phenyl-methyl]-N,N-dimethylaniline), Crystal violet (tris(4-(dimethylamino)phenyl)methylium chloride), Congo red (disodium 4-amino-3-[4-[4-(1-amino-4-sulfonato-naphthalen-2-yl)diazenylphenyl]phenyl]diazenyl-naphthalene-1-sulfonate) and Nile red (9-diethylamino-5-benzo[α]phenoxazinone).

The pigment may be any suitable pigment. The pigment may be a nano-crystalline material such as Prussian Blue. Alternatively, the pigment may comprise metal nanoparticles, such as nanoparticles of Au, Ag, Cu, Ni. The metal nanoparticles may be predominantly spherical in shape, or of the form or nanorods or nanoscale particulates, where the particulates may have any specific shape such as star-shaped. The metal nanoparticles may optionally be coated in a thin coating of a dielectric material, such as silica or aluminasilicate. For instance, the pigment may be a pigment selected from Prussian blue (Iron(II,III) hexacyanoferrate (II,III)), Egyptian blue (calcium copper silicate), Ultramarine ($Na_{8-10}Al_6Si_6O_{24}S_{2-4}$), Phthalocyanine Blue BN (copper phthalocyanine), Indian yellow ((2S,3S,4S,5R,6S)-3,4, 5-Trihydroxy-6-(8-hydroxy-9-oxo-9H-xanthen-2-yloxy)-tetrahydro-pyran-2-carboxylic acid), Vermilion (mercury sulphide), Chrome green (chromium oxide), and Titanium yellow ($NiO.Sb_2O_5.20TiO_2$). Optionally, the photoactive layer may comprise semiconductor nano-particles, disposed within the transparent regions of the dewet semiconductor film, for instance nano-particles of CdTe, CdSe, CuSnZnS, SnS, or SnSe.

The substrate typically comprises an electrode material and/or a semiconductor material. The substrate may also comprise a polymer foil with high transparency or glass. For instance, the substrate may comprise a high transparency polymer foil comprising poly(ethylene terephthalate) (PET). The substrate often comprises an electrode material and a semiconductor material, for instance a layer of an electrode material and a layer of a semiconductor material. Often, the electrode material will comprise a transparent or semi-transparent electrically conductive material. For instance, the substrate may comprise a layer of a transparent conducting oxide or a metal, and/or a layer of an n-type semiconductor. The substrate may for example comprise a layer of a transparent conducting oxide or a metal, and a layer of an n-type semiconductor. Transparent conducting oxides include tin oxide, zinc oxide, doped tin oxide and doped zinc oxide. For instance, a transparent conducting oxide may comprise ITO, FTO or AZO. The electrode material may for example comprise ITO (indium tin oxide), FTO (fluorine-doped tin oxide) or AZO (aluminium-doped tin oxide). Typically, it comprises FTO. The electrode material may comprise from 90 to 100 wt % of ITO, FTO or AZO, and in some cases may for instance consist essentially of ITO, FTO or AZO. Usually, the thickness of the layer of electrode material in the substrate is from 200 nm to 600 nm, more typically from 300 to 500 nm. For instance, the thickness may be 400 nm. The layer of an electrode material will often be disposed on a glass substrate. For instance, the substrate may comprise FTO disposed on a glass substrate. If the substrate comprises a semiconductor material, the semiconductor material may be as described anywhere herein. For instance, the semiconductor material may comprise an n-type semiconductor as described below, for instance titanium dioxide. The substrate typically comprises a layer of transparent material (for instance glass or a high transparency polymer film, such as PET), a layer of a transparent conducting oxide (for instance ITO, FTO or AZO), and a compact layer of an n-type semiconductor (for instance $TiO_2$).

Typically, the substrate is transparent or semi-transparent. This is to enable the photoactive layer as a whole to be semi-transparent. Often, the substrate comprises a transparent conducting oxide or a metal. For instance the substrate may comprise a thin film of a metal (1 to 30 nm thick). Usually, the substrate comprises ITO, FTO or AZO. Often the substrate comprises a layer of an n-type semiconductor.

An n-type semiconductor is an electron-transporting semiconductor. The n-type semiconductor may be a single n-type compound or elemental material, or a mixture of two or more n-type compounds or elemental materials, which may be undoped or doped with one or more dopant elements.

Thus, the n-type semiconductor which is employed as a layer (typically a compact layer) in the substrate may be selected from a metal oxide, a metal sulphide, a metal selenide, a metal telluride, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

More typically, the n-type semiconductor is selected from a metal oxide, a metal sulphide, a metal selenide, and a metal telluride.

Thus, the n-type semiconductor may comprise an inorganic material selected from oxide of titanium, tin, zinc, niobium, tantalum, tungsten, indium, gallium, neodymium, palladium, or cadmium, or an oxide of a mixture of two or more of said metals. For instance, the n-type semiconductor may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, $CdO$, amorphous silicon or polycrystalline silicon, for instance $TiO_2$, $SnO_2$, or $ZnO$. The substrate may comprise a compact layer of an n-type semiconductor material.

Typically, the substrate comprises a compact layer of titanium dioxide. The term "compact layer", as used herein, refers to a layer of a material wherein the space occupied by the layer consists essentially of the material comprised in the layer (i.e. there are substantially no spaces within the layer). A compact layer may have low porosity (e.g. less than 10% porosity and typically less than 1%). A compact layer may be essentially homogeneous. A compact layer may be crystalline, or may comprise microcrystalline, nanocrystalline or amorphous material. A compact layer typically has substantially uniform thickness.

The substrate may comprise a layer of a transparent conducting oxide and a compact layer of an n-type semiconductor. The substrate may comprise a layer of a transparent conducting oxide and a compact layer of titanium dioxide. Typically, the substrate comprises a layer of a transparent conducting oxide and a compact layer of titanium dioxide, and wherein the composition which comprises a photoactive material or one or more precursors of a photoactive material, is disposed on the compact layer of titanium dioxide. The layer of an electrode material will often be disposed on a glass substrate. For instance, the substrate may comprise FTO disposed on a glass substrate. Often, the substrate comprises: a layer of glass, a layer of a transparent conducting oxide, and a compact layer of titanium dioxide. The composition comprising a photoactive material, or one or more precursors thereof, is typically disposed on the side of the substrate comprising the compact layer of titanium dioxide. The thickness of the compact layer of a semiconductor is typically from 50 nm to 2 µm.

In some cases, the photoactive layer may be intended to be a component of an "inverted" optoelectronic device (wherein n- and p-type regions are interchanged). Typically, in such "inverted" devices, the substrate comprises a layer of a transparent conducting oxide or a metal, and/or a layer of a p-type semiconductor. Usually, the substrate in such a device comprises a layer of a transparent conducting oxide or a metal, and a layer of a p-type semiconductor. The p-type semiconductor may be as further defined hereinbelow in respect of the optoelectronic devices of the invention.

In the process of the invention, (a) typically comprises disposing on the substrate
  i) a composition comprising the photoactive material;
  ii) a composition comprising a solvent and the photoactive material; or
  iii) a composition comprising a solvent and one or more compounds which are precursors of the photoactive material.

A composition comprising a solvent and one or more other compounds may be a solution or a dispersion.

The composition may be disposed on the substrate by any means. Generally, the composition is disposed on the substrate by spin-coating, spray-coating, slot-die-coating, vacuum deposition or vapour deposition. Typically, the composition is disposed by spin-coating. Spin-coating (as mentioned anywhere herein) may be carried out at from 1000 rpm to 3000 rpm.

Part (a) of the process typically comprises disposing on the substrate a composition comprising:
  (i) a solvent; and
  (ii) a photoactive perovskite or two or more compounds which are precursors of a photoactive perovskite.

For instance, (a) may comprise disposing on the substrate a composition comprising
  a solvent,
  AX, and
  $BX_2$;
wherein
  A is an organic cation,
  B is a divalent metal cation, and
  each X is independently selected from F, Cl, Br and I.

A, B and X may be as described anywhere above for the perovskite. Often B is a divalent metal cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Typically B is a divalent metal cation selected from $Pb^{2+}$ and $Sn^{2+}$. A may be selected from $(R_1R_2R_3R_4N)^+$ or $(R_5R_6N=CH-NR_7R_8)^+$, where $R_1$, $R_2$, $R_3$, $R_4$, $R_5$, $R_6$, $R_7$, and $R_8$ are as defined any where above. A is typically selected from $(MeNH_3)^+$ or $(H_2N=CH-NH_2)^+$.

In some embodiments, if the perovskite being formed is a mixed halide perovskite, each X in $BX_2$ is the same, and the X in AX is different from the X in $BX_2$. For instance, $BX_2$ may be $BX_2$ and AX may be AX' wherein X and X' are different halide anions.

AX may be known as the first precursor and $BX_2$ as the second precursor. The first precursor may comprise lead halide or tin halide and the second precursor may comprise methylammonium halide or ethyl ammonium halide, wherein the halide ion in the first precursor and the second precursor are different. Often, the first precursor comprises tin fluoride and the second precursor comprises methylammonium chloride, methylammonium bromide or methylammonium iodide; the first precursor comprises lead chloride or tin chloride and the second precursor comprises methylammonium bromide or methylammonium iodide; the first precursor comprises lead bromide or tin bromide and the second precursor comprises methylammonium chloride or methylammonium iodide; or the first precursor comprises lead iodide or tin bromide and the second precursor comprises methylammonium chloride or methyl ammonium bromide.

Typically, the first precursor comprises lead chloride and the second precursor comprises methylammonium iodide.

The molar ratio $AX:BX_2$ is typically from 1:1 to 12:1. It may be from 1:1 to 6:1, from 2:1 to 4:1 or typically from 2.5:1 to 3.5:1. It may be around 3:1. An excess of the organic halide can be desirable as this assists dewetting as mass is lost through evaporation of organic and halide components.

The solvent is typically an organic solvent or water.

The term "organic solvent", as used herein, refers to a solvent the molecules of which comprise at least one carbon atom and typically at least one hydrogen atom. The term is well known. The organic solvent may be an alcohol, a thiol, an ether, a ketone, an aldehyde, an alkane, a cycloalkane, an aromatic hydrocarbon, a heterocyclic compound, an aromatic heterocyclic compound, a halogenated hydrocarbon, or an amine. The term "alcohol", as used herein, refers to a compound which comprises one or more hydroxyl groups. Examples of such compounds include $C_1$-$C_8$-alcohols. Di-, tri- and poly-ols are also included (e.g. ethylene glycol or propylene glycol). The term "thiol", as used herein, refers to a compound which comprises one or more thiol (—SH) groups. Examples of such compounds include $C_1$-$C_8$-alkylthiols. The term "ether", as used herein, refers to a compound which comprises one more ether groups (i.e. those of the form $R_3C$—O—$CR_3$). Examples of such compounds include di-$C_1$-$C_8$-alkylethers and saturated heterocycles containing an oxygen atom between two carbon atoms. The term "ketone", as used herein, refers to a compounds which comprise one or more oxo groups (>C=O) at least one of which is not on a terminal carbon. Examples of such compounds include acetone, butanone and acetoacetone. The term "aldehyde", as used herein, refers to compounds comprising a formyl (—CHO) group. Examples of such compounds include formaldehyde and ethanal. The term "alkane", as used herein, refers to a linear or branched saturated hydrocarbon. Typically the alkane is a $C_5$-$C_{10}$-alkane. Examples of such alkane organic solvents are pentane, hexane and heptane. The term "cycloalkane", as used herein, refers to a cyclic alkane molecule, typically cyclopentane or cyclohexane. The term "aromatic hydrocarbon", as used herein, refers to a compound comprising an aromatic hydrocarbon ring, typically a benzene ring. Examples of such compounds include benzene, toluene, and xylene. The term "heterocyclic compound", as used herein, refers to a cyclic compound comprising one or more heteroatom (i.e. an atom which is not carbon). Examples of heterocyclic compounds include tetrahydrofuran, pyrollidine and aromatic heterocyclic compounds. The term "aromatic heterocyclic compound", as used herein, refers to aromatic compounds comprising at least one heteroatom in the aromatic ring. Examples of aromatic heterocyclic compounds include pyrrole and pyridine. The term "halogenated hydrocarbon", as used herein, refers to a hydrocarbon compound (i.e. a compound consisting of only carbon and hydrogen) in which one or more hydrogen atoms have been replaced with halogen atoms. Typically the halogenated hydrocarbon will have between 1 and 8 carbons. Examples of such compounds include chloroform. The term "amine", as used herein, refers to an organic compound which comprises at least one saturated nitrogen atom. Examples of such compounds include tri-$C_1$-$C_8$-alkylamines.

The solvent typically comprises dimethylformamide (DMF) or dimethylsulfoxide (DMSO). The solvent may comprise dimethylformamide (DMF), dimethylsulfoxide (DMSO), n-methyl-2-pyrrolidone (NMP), and gamma-butyrolactone (GBL).

The concentration of AX in the composition is typically from 1.0 to 5.0 M and the concentration of $BX_2$ in the composition is typically from 0.5 to 1.5 M.

In some cases AX is an organic iodide compound and $BX_2$ is a metal chloride or a metal iodide. The metal may be Pb or Sn.

Typically (a) may comprise spin-coating on a substrate a composition comprising solvent, optionally wherein the solvent is dimethylsulfoxide or dimethylformamide, methylammonium iodide, and lead chloride or lead iodide.

For example (a) may comprise spin-coating on a substrate a composition comprising solvent, optionally wherein the solvent is dimethylsulfoxide or dimethylformamide, methylammonium iodide, and lead chloride.

The composition may comprise methylammonium iodide at a concentration of from 2.0 to 3.0 M and lead chloride at a concentration of from 0.5 to 1.2 M The disposition of the composition in (a) may alternatively occur by vapour deposition. Accordingly, the composition to be disposed on the substrate may be in the form of a vapour, which is then deposited on the substrate by vapour deposition. Thus, in one embodiment, (a) comprises disposing the composition by vapour deposition. For example, (a) may comprise (i) exposing the substrate to vapour, which vapour comprises one or more reactants for producing said photoactive material; and (ii) allowing deposition of the vapour onto the substrate, to produce a layer of said photoactive material thereon.

Here, the one or more reactants may be precursor compounds for the photoactive material.

The one or more reactants for producing said photoactive material may comprise either a photoactive perovskite as defined hereinbefore, or AX and $BX_2$ as defined hereinbefore.

The vapour deposition may be a dual source vapour deposition. For example, (a) may comprise (i) exposing the substrate to vapour, which vapour comprises two reactants for producing said photoactive material; and (ii) allowing deposition of the vapour onto the substrate, to produce a layer of said photoactive material thereon;

wherein (i) further comprises producing said vapour comprising two reactants for producing said photoactive material by evaporating a first reactant from a first source and evaporating a second reactant from a second source.

If the photoactive material comprises a photoactive perovskite, the first reactant may comprise a first compound comprising (i) a first cation and (ii) a first anion; and the second reactant may comprise a second compound comprising (i) a second cation and (ii) a second anion.

For instance, the first reactant may be a $C_{1-8}$alkylammonium halide compound and the second reactant may be a lead halide or a tin halide. The first reactant may be AX as defined above and the second reactant may be $BX_2$ as defined above.

In one embodiment of the process, part (a) of disposing the composition, which composition comprises a photoactive material or one or more precursors of a photoactive material, comprises:

disposing the composition by vapour deposition to produce a resulting layer.

In this embodiment, if the photoactive material comprises a perovskite, the step of producing the resulting layer by vapour deposition typically comprises:

(i) exposing the substrate to vapour, which vapour comprises said perovskite or one or more reactants for producing said perovskite; and (ii) allowing deposition of the vapour onto the substrate, to produce the resulting layer.

The perovskite in the vapour may be any of the perovskites discussed hereinbefore, and is typically a perovskite of formula (I), (IA) or (II) as defined hereinbefore.

The one or more reactants for producing said perovskite may comprise the reactant types discussed above for solution deposition of the resulting layer.

The one or more reactants may comprise:

(a) a first compound comprising (i) a metal cation and (ii) a first anion; with (b) a second compound comprising (i) an organic cation and (ii) a second anion;

wherein the metal cation and organic cation may be selected from any of those described hereinbefore when discussing photoactive perovskites. The first anion may be selected from sulfide, selenide, telluride, fluoride, chloride, bromide and iodide. The second anion may be selected from fluoride, chloride, bromide and iodide.

For instance, the one or more reactants may comprise:
(a) a first compound comprising (i) a metal cation and (ii) a first halide anion; with
(b) a second compound comprising (i) an organic cation and (ii) a second halide anion; wherein the first and second halide anions are different halide anions, For instance, when the perovskite being deposited is $CH_3NH_3PbI_2Cl$, the one or more reactants typically comprise (a) $PbI_2$, and (b) $CH_3NH_3Cl$.

The process generally further comprises producing the vapour in the first place by evaporating said perovskite or evaporating said one or more reactants for producing said perovskite. In this step the perovskite or the one or more reactants for producing the perovskite are typically transferred to an evaporation chamber which is subsequently evacuated. The perovskite or the one or more reactants for producing the perovskite are typically then heated.

The resulting vapour is then exposed to and thereby deposited on the substrate, to produce a resulting layer comprising said perovskite thereon. If reactants are used, these react together in situ to produce the perovskite on the substrate.

Typically, the vapour deposition is allowed to continue until the resulting layer comprising the perovskite has a desired thickness, for instance a thickness of from 10 nm to 100 μm, or more typically from 10 nm to 10 μm. Preferably, the vapour deposition is allowed to continue until the resulting layer of perovskite has a thickness of from 50 nm to 1000 nm, or for instance from 100 nm to 700 nm.

The dewetting of the resulting layer formed in (a) may be carried out by any process, but is typically carried out by heating the substrate and the resulting layer. Accordingly, (b) often comprises annealing or heating the resulting layer. Typically, (b) comprises heating the resulting layer. The term "annealing", as used herein, means to heat the substrate and resulting layer at a temperature such that the resulting layer dewets. In the process, (b) typically comprises heating the resulting layer at a temperature of from 50° C. to 250° C. The heating may be at a temperature of from 50 to 100° C., from 50 to 150° C., from 50 to 250° C., from 50 to 400° C. and typically from 50 to 250° C. Dewetting may be carried out for any desired length of time, for instance for from 1 to 360 minutes, from 2 to 60 minutes or from 5 to 20 minutes. Typically, (b) comprises dewetting the resulting layer for from 5 minutes to 120 minutes. For instance, (b) may comprise dewetting the resulting layer for from 5 to 20 minutes. Likewise, the substrate may be heated for any desired length of time, for instance for from 1 to 360 minutes, from 2 to 60 minutes or from 5 to 20 minutes. Thus, typically, (b) comprises heating the resulting layer for from 5 minutes to 120 minutes. For instance, (b) may comprise heating the resulting layer for from 5 to 20 minutes. Annealing or heating may occur by heating the substrate and dewet layer on a hot plate. Typically, (b) is carried out in air or in a nitrogen atmosphere. (b) may be carried out under low pressure, for instance less than 0.1 atm.

The length of time for which and temperature at which the dewetting is carried out allows control of the extent of dewetting. For instance, (b) may comprise dewetting the resulting layer until a dewet layer of the photoactive material having a coverage of the photoactive material of from 20% to 90% is formed. The coverage may be as defined hereinbefore. Typically the coverage will be from 40% to 60%. Alternatively, or additionally, (b) may comprise dewetting the resulting layer (e.g. by heating the resulting layer at said temperature) until a dewet layer of the photoactive material having an average transmission of from 10% to 90% for light with a wavelength of from 370 nm to 740 nm is formed. The average transmission may be as defined hereinbefore, for instance 20% to 80%. Further, (b) may comprise dewetting the resulting layer (e.g. by heating the resulting layer at said temperature) until a dewet layer of the photoactive material having a length scale (as defined above) of from 400 nm to 300 μm, typically from 1 μm to 30 μm, is formed. In either case, the point at which to stop dewetting may be evaluated by taking SEM images of the dewetting layer to assess its properties as regards surface coverage and structure.

Once semi-transparent films have been created by dewetting the layer of the photoactive material, it may be necessary to block the contact between the now bare $TiO_2$ compact layer with any additional layer which is further disposed on the substrate (for instance a hole transport material) to form a subsequent layer. Any contact between electron selective and hole selective contacts in a device comprising the semi-transparent photoactive layer may act as a diode in parallel to the primary photovoltaic diode comprised of the photoactive layer sandwiched between the n-type and p-type charge collection layers. This parallel diode will lead to a reduction on shunt resistance in the solar cell, ultimately causing a loss in fill factor and open-circuit voltage. To minimise this impact the inventors have provided four routes:

1) treating the surface of the substrate with a molecule which will form a self assembled monolayer (or multilayer), thus electronically blocking contact between the substrate and any subsequent layers disposed after the formation of the dewet layer of the photoactive material;
2) filling the holes between the absorbing regions of the dewet layer with an insulating polymer, such as polystyrene. The polymer may then optionally be made insoluble by cross-linking the polymer, prior to disposing a subsequent layer on the photoactive layer;
3) mixing an additional insulating component into a composition containing a material which will form a subsequent layer. The additional insulating component is chosen so that it preferentially wets and coats the bare regions of the substrate, electronically insulating the substrate from the material which forms the subsequent layer; or
4) treating the surface of the substrate prior to coating with the photoactive material, with the intention of minimising the dark leakage current through transparent regions of the dewet layer, while still allowing electron transfer from the substrate to the absorbing regions of the dewet layer.

Figure 13:
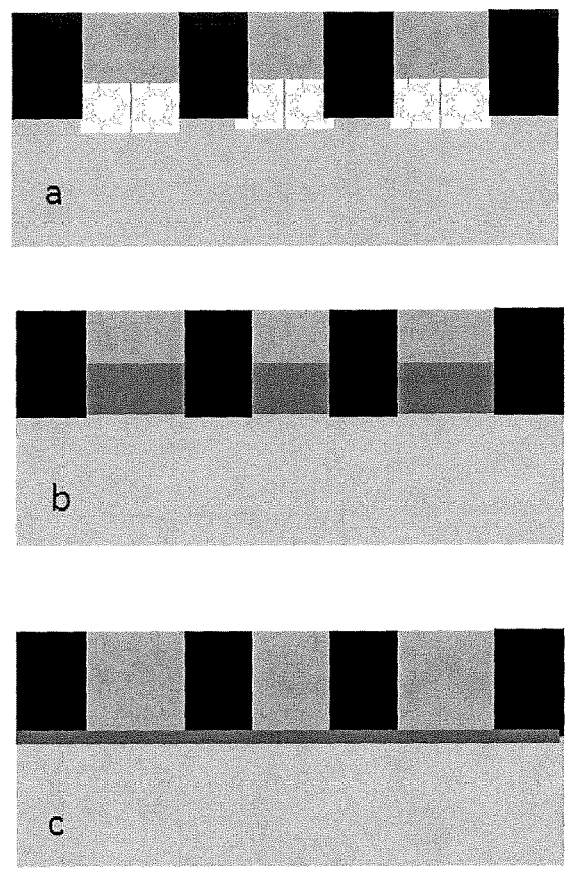
FIG. 13 shows three schematic diagrams representing ways to limit parallel shunt currents between the substrate and hole transport material through transparent regions. The top two diagrams show blocking the contacts with (a) a self assembled monolayer of molecules and (b) an insulating polymer. Diagram (c) shows a pre-treatment of the substrate.

FIG. 13 shows three schematic diagrams representing three of these ways to limit parallel shunt currents between the substrate and hole transport material through transparent regions. The top two diagrams show blocking the contacts with (a) a self assembled monolayer of molecules and (b) an insulating polymer. Diagram (c) shows a pre-treatment of the substrate.

Accordingly, in one embodiment of the invention, the process for producing a semi-transparent photoactive layer further comprises c) blocking transparent regions of the dewet layer of the photoactive material with an electronic blocking material suitable for reducing the flow of current through transparent regions from a region on a first side of the semi-transparent photoactive layer to a region on a second side of semi-transparent photoactive layer.

The term "electronic blocking material", as used herein, refers to a material which has a low conductivity and does not allow electrons to flow through it easily. For instance, an electronic blocking material may be a material with a conductivity of less than $10^{-6}$ Scm$^{-1}$ or less than $10^{-8}$ Scm$^{-1}$. The electronic blocking material may be a dielectric material. The electronic blocking material may be organic or inorganic.

It is desirable that the electronic blocking material only blocks the contact between the transparent regions (i.e. those regions with exposed substrate) and any further layer disposed on the photoactive layer and does not block the contact between the absorbing regions (those comprising the photoactive material) and any further layer disposed on the photoactive layer. The electronic blocking material should fill the holes in the dewet layer of the photoactive material. This can be seen in FIG. 23. The phrase "blocking the transparent regions" refers to any process wherein the electronic blocking material is disposed on the transparent regions in the dewet layer. This may occur by spin-coating or vapour deposition of the electronic blocking material, for instance.

The electronic blocking material may comprise a self assembled monolayer or multilayer of a molecule. The molecule may be chosen to be a molecule which self assembles in the holes that are the transparent regions while leaving the absorbing regions uncovered. The molecules may contain groups which bind selectively (covalently, ionically, or by a dispersion attraction) to a material comprised in the substrate. For instance, often the substrate comprises a layer of an n-type semiconductor and the electronic blocking material comprises molecules which comprise groups which bind selectively to the n-type semiconductor (and typically do not bind to the photoactive material).

Typically, therefore, the electronic blocking material comprises a self assembled monolayer or multilayer of a molecule, wherein the molecule binds selectively to the substrate. Molecules comprising acidic groups may be selective for substrates comprising inorganic oxides such as $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$.

Often, the electronic blocking material comprises a molecule comprising one or more groups selected from carboxylic acid (—$CO_2H$), phosphonic acid (—$PO(OH)_2$), or sulfonic acid (—$SO_3H$). Often, the electronic blocking material comprises an organic molecule comprising a group selected from carboxylic acid (—$CO_2H$), phosphonic acid (—$PO(OH)_2$), or sulfonic acid (—$SO_3H$). For instance, the electronic blocking material may comprise an organic molecule with a molar mass of less than 3000 g/mol, or less than 2000 g/mol, comprising a group selected from carboxylic acid (—$CO_2H$), phosphonic acid (—$PO(OH)_2$), or sulfonic acid (—$SO_3H$). Usually the molecule is an organic molecule which is not conjugated. The acidic group in the molecules of electronic blocking material can bind selectively to the substrate (for instance comprising $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$, or a compact layer thereof) causing a self assembled mono- or multi-layer to form. The resulting monolayer or multilayer is typically insulating.

The electronic blocking material may comprise a carboxylated cyclodextrin, a succinyl cyclodextrin, cyanoacrylic end functionalised penta(3-hexylthiophene), iodotetrafluorobenzene carboxylic acid, 4-guanidinobutyric acid, a $C_{10-30}$-alkylphosphonic acid, (dicyanomethylene)-2-methyl-6-(4-dimethylaminostyryl)-4H-pyran or polyethylene glycol. A $C_{10-30}$ alkyl group is an unsubstituted or substituted, straight or branched chain saturated hydrocarbon radical having 10 to 30 carbon atoms. It may be substituted (as defined above) or unsubstituted. It is typically unsubstituted. For instance it may be a $C_{15-20}$ alkyl group, which is optionally linear. The $C_{10-30}$ alkyl group may be selected from decyl, undecyl, dodecyl, tridecyl, tetradecyl, pentadecyl, hexadecyl, heptadecyl, octcdecyl, nonadecyl or eicosyl. Cyclodextrins are cyclic oligosaccharides.

Often, the electronic blocking material comprises carboxylated α-cyclodextrin, carboxylated β-cyclodextrin, carboxylated γ-cyclodextrin, succinyl α-cyclodextrin, succinyl β-cyclodextrin, succinyl γ-cyclodextrin, cyanoacrylic end functionalised penta(3-hexylthiophene), iodotetrafluorobenzene carboxylic acid, octadecylphosphonic acid, (dicyanomethylene)-2-methyl-6-(4-dimethylaminostyryl)-4H-pyran, or 4-guanidinobutyric acid.

The electronic blocking material may typically comprise cyanoacrylic end functionalised penta(3-hexylthiophene), (dicyanomethylene)-2-methyl-6-(4-dimethylaminostyryl)-4H-pyran or octadecylphosphonic acid.

Usually, if the electronic blocking material comprises a molecule as described above, (c) comprises blocking the transparent regions of dewet layer of the photoactive material with an electronic blocking material by treating the dewet layer of the photoactive material with a composition comprising a solvent and the electronic blocking material. Often, (c) comprises blocking the transparent regions of dewet layer of the photoactive material with an electronic blocking material by treating the dewet layer of the photoactive material with a composition comprising a solvent and the electronic blocking material for from 1 minute to 20 hours. Optionally, the treatment is for from 2 minutes to 10 minutes, or from 16 hours to 19 hours.

The solvent may be any solvent as defined herein before, but the solvent is typically chlorobenzene.

The concentration of the electronic blocking material is typically from 0.1 to 10 mM, or from 0.5 to 2 mM.

Treating the dewet layer of the photoactive material with a composition comprising a solvent and the electronic blocking material may comprise submerging or soaking the substrate comprising the dewet layer of a photoactive material in the composition comprising the solvent and the electronic blocking material.

Other insulating materials may also be used to block the transparent regions to prevent current leakage. In one embodiment, the electronic blocking material comprises an insulating polymer. Insulating polymers are good blocking materials as they are inert and can act as a matrix to hold other components such as dyes, pigments or materials which re-emit or scatter light. If a composition comprising a solvent and an insulating polymer is disposed (e.g. by spin-coating) on the dewet layer it will preferentially fill the holes in the dewet layer (i.e. the transparent regions) as these are the lowest points on the substrate. This leaves the upper surface of the absorbing regions exposed so that current may pass through them to any additional layers disposed on the photoactive layer.

Any insulating polymer may be used, and typically those which are soluble. The electronic blocking material may comprise polystyrene, poly(ethylene glycol) diacrylate (PEGDA), poplyethylene, polypropylene, polyethylene terephthalate, polyvinyl acetate or polyvinyl chloride. For instance, the electronic blocking material may comprise polystyrene or poly(ethylene glycol) diacrylate.

It is often desirable that the insulating polymer is cross-linked. This is because a cross-linked polymer will have a reduced solubility, which means that the polymer electronic blocking layer will not be dissolved and removed if any further processes are carried out, for instance the disposition of further solution-cast layers on the photoactive layer.

Usually, when the electronic blocking material is a polymer, (c) comprises blocking the transparent regions of the semi-transparent layer with an electronic blocking material by disposing on the dewet layer of the photoactive material a composition comprising a solvent and the insulating a polymer. The insulating polymer may be dissolved or dispersed in the solvent, and is typically dissolved in the solvent. Sometimes, the composition further comprises 2,2-dimethoxy-2-phenylacetophenone in an amount of from 0.5 to 5% by weight of the insulating polymer. 2,2-dimethoxy-2-phenylacetophenone acts as a radical initiator which can cross-link the insulating polymer.

The composition may be disposed by any method such as those described hereinbefore. Typically, the composition comprising a solvent and the insulating polymer is spin-coated on the dewet layer of the photoactive material. Spin-coating allows the composition to fill the holes (transparent regions) in the dewet layer while leaving the absorbing regions uncovered.

Figure 11:
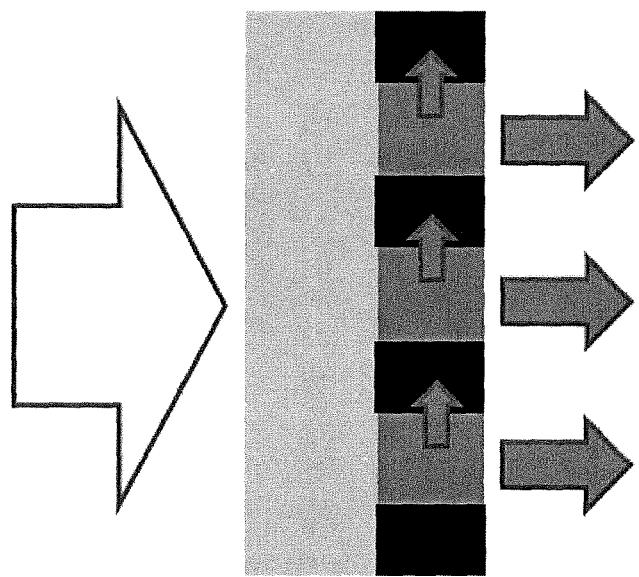
FIG. 11 shows a schematic diagram of a dewet perovskite photoactive layer comprising a dye in the transparent regions which absorbs light passing through these regions. In one embodiment this "dye" is highly emissive or phosphorescent, so that the light absorbed in the dye is reemitted and a large fraction of the reemitted light passes laterally through the regions contains the perovskite islands, where the light is absorbed in the perovskite and subsequently contributes to photocurrent generation in the solar cell. In another embodiment, the dye strongly scatters visible light of specific wavelengths, and a large fraction of the scattered light passes laterally through the regions containing the perovskite islands, where the light is absorbed in the perovskite and subsequently contributes to photocurrent generation in the solar cell.

The inventors have also realised that it is possible to capture some of the light which passes through the transparent regions by adding a material which either absorbs and re-emits or scatters light passing through the transparent regions and causes at least some of the light to go into the absorbing regions (FIG. 11). In one embodiment, the electronic blocking material further comprises a dye, a pigment or a material which re-emits or scatters light. Accordingly, in the process for disposing the electronic blocking material, the composition comprising a solvent and the insulating polymer may further comprise a dye (for instance an emissive dye), a pigment or a material which scatters light. The dye may be any dye. For instance the dye may be an indoline dye D102, an organic "push-pull" dye such as those described in T. Horiuchi et al. ("High Efficiency of Dye-Sensitized Solar Cells Based on Metal-Free Indoline Dyes", J. Am. Chem. Soc. 126, 12218-12219 (2004)), a ruthenium complex dye, an organic dyes such as those described in W. Zeng, et al. ("Efficient Dye-Sensitized Solar Cells with an Organic Photosensitizer Featuring Orderly Conjugated Ethylenedioxythiophene and Dithienosilole Blocks", Chem. Mater. 22, 1915-1925 (2010)) a rylene based dye such as those described in US 2012/0017995, Rhodamine dyes (including rhodamine B (9[9-(2-carboxyphenyl)-6-diethylamino-3-xanthenylidene]-diethylammonium chloride) and Rhodamine 6G ($C_{27}H_{29}ClN_2O_7$)), DCM (4-(dicyanomethylene)-2-methyl-6-(4-dimethylaminostyryl)-4H-pyran), Sulphan blue ([4-(α-(4-diethylaminophenyl)-5-hydroxy-2,4-disulfophenylmethylidene)-2,5-cyclohexadien-1-ylidene]diethylammonium hydroxide), Naphthol green B (trisodium; iron (3$^+$); 5-nitroso-6-oxidonaphthalene-2-sulfonate), Azophloxin (sodium 8-acetamido-1-hydroxy-2-phenylazonaphthalene-3,6-disulphonate), Martius yellow ($C_{10}H_6N_2O_5$), Methyl orange (Sodium 4-[(4-dimethylamino)phenyldiazenyl]benzenesulfonate), Fluorescein (Spiro[isobenzofuran-1(3H),9'-[9H]xanthen]-3-one, 3',6'-dihydroxy-), Coumarin (2H-chromen-2-one), Stilbene ((E)-1,2-diphenylethene), Umbelliferone (7-Hydroxychromen-2-one), tetracene, Malachite green (4-[(4-dimethylaminophenyl)phenyl-methyl]-N,N-dimethylaniline), Crystal violet (tris(4-(dimethylamino)phenyl)methylium chloride), Congo red (disodium 4-amino-3-[4-[4-(1-amino-4-sulfonato-naphthalen-2-yl)diazenylphenyl]phenyl]diazenyl-naphthalene-1-sulfonate) and Nile red (9-diethylamino-5-benzo[α]phenoxazinone).

The pigment may be any suitable pigment. The pigment may be a nano-crystalline material such as Prussian Blue. Alternatively, the pigment may comprise metal nanoparticles, such as nanoparticles of Au, Ag, Cu, Ni. The metal nanoparticles may be predominantly spherical in shape, or of the form or nanorods or nanoscale particulates, where the particulates may have any specific shape such as star-shaped. The metal nanoparticles may optionally be coated in a thin coating of a dielectric material, such as silica or aluminasilicate. For instance, the pigment may be a pigment selected from Prussian blue (Iron(II,III) hexacyanoferrate (II,III)), Egyptian blue (calcium copper silicate), Ultramarine ($Na_{8-10}Al_6Si_6O_{24}S_{24}$), Phthalocyanine Blue BN (copper phthalocyanine), Indian yellow ((2S,3S,4S,5R,6S)-3,4,5-Trihydroxy-6-(8-hydroxy-9-oxo-9H-xanthen-2-yloxy)-tetrahydro-pyran-2-carboxylic acid), Vermilion (mercury sulphide), Chrome green (chromium oxide), and Titanium yellow ($NiO.Sb_2O_5.20TiO_2$). Optionally, the photoactive layer may comprise semiconductor nano-particles, disposed within the transparent regions of the dewet semiconductor film, for instance nano-particles of CdTe, CdSe, CuSnZnS, SnS, or SnSe.

The material which scatters light may be any material, and is typically a particulate material. For instance, the material which scatters light may comprise particles with a diameter of from 1 nm to 300 nm, or from 5 nm to 100 nm. The material may comprise particles of an inert material, such as a dielectric material such as alumina, zirconia, titania or polymer spheres such as polystyrene spheres. For instance, the material which scatters light may comprise metal nanoparticles. The material may have a refractive index which differs by more than 50% from that of the photoactive material.

Typically, the step (c) further comprises removing the solvent. The solvent may be removed by heating, vacuum evaporation or by allowing the solvent to evaporate. Often, the process further comprises cross-linking the insulating polymer by heating, irradiating the substrate, or by treating the polymer with a radical initiator. Cross-linking is the process whereby bonds are formed between polymer chains, typically reducing the solubility of the polymer.

The solvent here may be any solvent as described herein before. The solvent is typically chlorobenzene. The concentration of the insulating polymer may be from 10 to 100 mg/ml. The concentration of the insulating polymer in the composition in step (c) may be from 20 to 40 mg/ml. The solvent is often chlorobenzene and/or the concentration of the insulating polymer is from 10 to 100 mg/ml. The solvent may be chlorobenzene and the concentration of the insulating polymer may be from 10 to 100 mg/ml. In one embodiment, the polymer is PEGDA, and the composition comprises chlorobenzene, from 0.5 to 2% by weight 2,2-dimethoxy-2-phenylacetophenone, and PEGDA at a dilution of from 20:1 to 8:1.

The thickness of the electronic blocking material in the transparent regions may be from 10 nm to 1 μm.

The inventors have also found that current leakage through the transparent regions of the dewet layer can be blocked by mixing an additional insulating component, which preferentially wets and coats the transparent regions, into any composition which is used for forming a further layer upon the photoactive material.

Therefore, in one embodiment of the invention, the process for producing a semi-transparent photoactive layer further comprises c) disposing on the photoactive layer a composition comprising an insulating component which preferentially wets transparent regions of the photoactive layer and which is suitable for reducing the flow of current through transparent regions from a region on a first side of the semitransparent photoactive layer to a region on a second side of semi-transparent photoactive layer.

The insulating component typically comprises a molecule that preferentially wets the transparent regions of the photoactive layer. Preferential wetting by the insulating component will occur when the insulating component binds more strongly to the substrate (which is exposed in the transparent regions) than other components present in the composition. The composition typically comprises the insulating component and a material for forming a subsequent layer on the photoactive material. The material for forming a subsequent layer is typically a p-type semiconductor. The p-type semiconductor may be as defined anywhere herein. For example, the p-type semiconductor may comprise spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]) or PVK (poly(N-vinylcarbazole)). Typically, the p-type semiconductor comprises spiro-OMeTAD.

The insulating component may comprise a molecule as described above for the method of reducing current leakage using a molecule which forms a mono-layer or a multi-layer. For instance the insulating component may comprise carboxylated α-cyclodextrin, carboxylated β-cyclodextrin, carboxylated γ-cyclodextrin, succinyl α-cyclodextrin, succinyl β-cyclodextrin, succinyl γ-cyclodextrin, cyanoacrylic end functionalised penta(3-hexylthiophene), iodotetrafluorobenzene carboxylic acid, octadecylphosphonic acid, (dicyanomethylene)-2-methyl-6-(4-dimethylaminostyryl)-4H-pyran or 4-guanidinobutyric acid. Typically, the insulating component comprises (dicyanomethylene)-2-methyl-6-(4-dimethylaminostyryl)-4H-pyran.

In one embodiment, the composition comprising an insulating component which preferentially wets the transparent regions of the photoactive layer comprises a solvent, a p-type semiconductor and (dicyanomethylene)-2-methyl-6-(4-dimethylaminostyryl)-4H-pyran. The solvent may be as defined anywhere herein and typically comprises chlorobenzene. The p-type semiconductor may be as defined anywhere herein and typically comprises spiro-OMeTAD. For instance, the composition may comprise a solvent, spiro-OMeTAD and (dicyanomethylene)-2-methyl-6-(4-dimethylaminostyryl)-4H-pyran. For instance, the composition may comprise chlorobenzene, spiro-OMeTAD and (dicyanomethylene)-2-methyl-6-(4-dimethylaminostyryl)-4H-pyran. The concentration of spiro-OMeTAD may be from 0.5 to 1.0 M and/or the concentration of (dicyanomethylene)-2-methyl-6-(4-dimethylaminostyryl)-4H-pyran may be from 2.0 to 25 mg/ml. The composition may further comprise additives. For instance, the composition may further comprise tert-butylpyridine and LiTFSI (optionally in acetonitrile solution). For example, from 0.015 to 0.02 lithium bis(trifluoromethanesulfonyl)imide (optionally in from 0.5 to 1.0 M acetonitrile solution) and from 0.05 to 0.1 M 4-tert-butylpyridine may be added. The composition may be disposed by any method but is typically disposed by spin-coating.

As an alternative to preventing current leakage by blocking the transparent regions with an electronic blocking material, the inventors have found that it is possible to pre-treat the substrate to form a thin layer of an insulating material prior to disposing the layer of the photoactive material. The thickness of the thin layer of the insulating material may be less than 1 nm, for instance a single atomic layer, or from 0.3 to 3 nm in thickness. The thin layer of an insulating material reduces the current flowing through the transparent regions to any subsequent layer disposed on top of the dewet layer of the photoactive material, but allows current to flow from the substrate to the absorbing regions of the dewet layer. The current can flow, for instance, by electrons tunnelling through the thin insulating material from the substrate to the photoactive material. The tunnelling rate between the substrate and a material which is further disposed on top of the dewet layer may be lower, which reduces current leakage through regions which do not comprise the photoactive material (i.e. the transparent regions). This can be due to energetic considerations such as proximity of energy levels in each material.

Accordingly, in one embodiment, the process according to the invention further comprises a step (z), performed before step (a), wherein (z) comprises treating the substrate with an insulator material, which insulator material is suitable for reducing the flow of current through transparent regions in the dewet layer of the photoactive material and suitable for allowing the flow of current through absorbing regions in the dewet layer of the photoactive material, wherein the flow of current is from a region on a first side of the semi-transparent photoactive layer to a region on a second side of semi-transparent photoactive layer.

Several insulating materials may be used. They are typically dielectric or insulating materials. The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 3.4 eV. (The band gap of titania is about 3.2 eV.) The skilled person of course is readily able to measure the band gap of a semiconductor, by using well-known procedures which do not require undue experimentation. For instance, the band gap of the semiconductor can be estimated by constructing a photovoltaic diode or solar cell from the semiconductor and determining the photovoltaic action spectrum. The band gap can alternatively be determined by taking the transmission spectrum through a thin film of the material, and determining the absorption onset which equates to the band gap in electron volts.

For instance, the thin layer of an insulating material may comprise a dielectric metal oxide, an insulating molecule or an insulating polymer. The thin layer of an insulating material may comprise an oxide of aluminium, zirconium, silicon, yttrium, ytterbium, beryllium, magnesium or calcium, an insulating molecule or an insulating polymer.

Often, the insulating material comprises a material selected from yttrium (III) oxide, magnesium oxide and an insulating polymer. Typically, the insulating material comprises a material selected from yttrium (III) oxide, magnesium oxide, polystyrene and poly(ethylene glycol) diacrylate.

Typically, (z) comprises disposing on the substrate a thin layer of the thin insulating material with a thickness of from 0.3 to 100 nm, from 0.3 to 20 nm or from 0.3 to 10 nm. For instance, (z) may comprise disposing on the substrate a layer of the insulating material with a thickness of from 0.3 to 3 nm.

Often, (z) comprises submerging the substrate in, or treating the substrate with, a composition comprising a solvent and the insulating material or one or more precursors of the insulating material. The solvent may be as described anywhere hereinbefore, but typically comprises water or an alcohol, for instance methanol, ethanol, propanol or isopropanol. The concentration of the electronic junction material may be from 1 mM to 100 mM.

In one embodiment, (z) comprises (i) submerging the substrate in, or treating the substrate with, a composition comprising water, yttrium nitrate and sodium hydroxide, or (ii) submerging the substrate in, or treating the substrate with, a composition comprising ethanol and magnesium acetate.

The term "submerging", as used herein, refers to a process wherein the substrate is covered with the composition, for instance by dipping the substrate in a receptacle filled with the composition.

Typically, the concentration of yttrium nitrate is from 5 mM to 20 mM and the concentration of sodium hydroxide is from 20 mM to 80 mM, or the concentration of magnesium acetate is from 5 mM to 20 mM.

It may be desirable to include a dye or a pigment in the photoactive layer produced by the process of the invention, this can be to colour the light passing through the photoactive layer. Accordingly, the process may further comprise disposing in the transparent regions in the dewet layer of the photoactive material a dye, a pigment or a material which re-emits or scatters light. The dye, pigment or material which re-emits or scatters light may as described anywhere hereinbefore. The dye, pigment or material which re-emits or scatters light may be disposed by any process, for instance by vapour deposition or by spin-coating a composition comprising the dye or pigment on the photoactive layer before or after the disposition of the dewet layer of the photoactive material. For instance, the dye may comprise rhodamine B.

The dye, pigment or material which re-emits or scatters light may be incorporated in an inert matrix. The inert matrix may be an insulating polymer such as those described herein.

The dye, pigment or material which re-emits or scatters light may be incorporated in any layer which is subsequently disposed on the photoactive layer. For instance, the dye, pigment or material may be added to a composition comprising a hole transport material which is subsequently disposed on the photoactive layer. The hole transport material may comprise spiro-OMeTAD.

The invention provides a semi-transparent photoactive layer which is obtainable by any process according to the invention for producing a semi-transparent photoactive layer as described herein.

The invention also provides a semi-transparent photoactive layer comprising a substrate and, disposed on the substrate, a dewet layer of a photoactive material, wherein the dewet layer of a photoactive material comprises:

a plurality of absorbing regions which comprise the photoactive material; and a plurality of transparent regions which do not substantially comprise the photoactive material.

Any of the terms may be as defined above. Any of the materials or regions, for instance the substrate, may be as described anywhere herein.

In the semi-transparent photoactive layer according to the invention, the dewet layer of the photoactive material typically comprises:

i) a plurality of unconnected absorbing regions of the photoactive material, wherein the average radius of the absorbing regions is from 0.4 µm to 100 µm and the average distance between the centres of two adjacent absorbing regions is from 1 µm to 300 µm; or ii) a plurality of unconnected transparent regions which do not comprise the photoactive material, wherein the average diameter of the transparent regions is from 0.4 µm to 300 µm.

The average radii and distances may be as defined above for the process according to the invention.

Often, the average thickness of the dewet layer of the photoactive material is from 50 nm to 2 µm. The average thickness may as defined above for the process of the invention Typically, the dewet layer of a photoactive material has a coverage of the photoactive material of from 20% to 90%. The coverage may typically be from 40% to 60%. The dewet layer of a photoactive material may have a coverage of the photoactive material as described above for the process of the invention.

Dewetting may produce a (typically random) microstructured array of isolated absorbing regions or transparent regions. Typically, an array of isolated absorbing regions of the photoactive material is formed. Such a dewetting process may be as described anywhere above for the process of the invention. The dewet layer which is obtainable may be as described anywhere above.

Typically, the dewet layer of a photoactive material has an average transmission of from 10% to 90% for light with a wavelength of from 370 nm to 740 nm. Often, the dewet layer of the photoactive material has an average transmission of from 20% to 80%, or from 30% to 75% for light with a wavelength of from 370 nm to 740 nm. In some cases, the average transmission is from 40% to 60% for these wavelengths of light. The average transmission may be for light with a wavelength of from 200 nm to 800 nm. The average transmission of the dewet layer may be as described above for the process of the invention.

The length scale of the dewet layer is typically from 400 nm to 300 µm. The length scale of the dewet layer is more typically from 1 µm to 30 µm The length scale is as defined above, and may be any of the values of length scale given above for the process of the invention.

The photoactive material in the photoactive layer according to the invention may be as defined anywhere above for the process according to the invention. The photoactive material typically comprises a photoactive perovskite such as those of formulae (I), (IA), (II) or (IIA). For instance, the photoactive material may comprise one or more perovskites selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, $CH_3NH_3SnF_2Cl$, $(H_2N=CH-NH_2)PbI_3$, $(H_2N=CH-NH_2)PbBr_3$ or $(H_2N=CH-NH_2)PbI_{3z}Br_{3(1-z)}$, wherein z is from 0.0 to 1.0. In some embodiments, z is greater than 0.0 and less than 1.0.

The substrate in the photoactive layer according to the invention may be as defined anywhere above for the process according to the invention. For instance, the substrate may comprise a layer of a transparent conducting oxide and a layer of an n-type semiconductor (each as defined above). Often, the substrate comprises a layer of FTO (optionally disposed on glass) and a compact layer of titanium dioxide. The dewet layer is typically disposed on the side of the substrate on which the layer on an n-type semiconductor is located. In some cases, the photoactive layer may be intended to be a component of an "inverted" optoelectronic device (wherein n- and p-type regions are interchanged). For instance, the substrate may comprise a layer of a transparent conducting oxide or a metal, and/or a layer of a p-type semiconductor. The substrate may for example comprise a layer of a transparent conducting oxide or a metal, and a layer of a p-type semiconductor. The p-type semiconductor may be any p-type semiconductor as defined hereinbelow for the optoelectronic devices of the invention.

In the semi-transparent photoactive layer, the plurality of transparent regions typically comprise an electronic blocking material which reduces the flow of current through the plurality of transparent regions from a region on a first side of the semi-transparent photoactive layer to a region on a second side of semi-transparent photoactive layer.

The electronic blocking material may be as defined anywhere above. For instance the electronic blocking material may comprise carboxylated α-cyclodextrin, carboxylated β-cyclodextrin, carboxylated γ-cyclodextrin, succinyl α-cyclodextrin, succinyl β-cyclodextrin, succinyl γ-cyclodextrin, cyanoacrylic end functionalised penta(3-hexylthiophene), iodotetrafluorobenzene carboxylic acid, octadecylphosphonic acid, (dicyanomethylene)-2-methyl-6-(4-dimethylaminostyryl)-4H-pyran) or 4-guanidinobutyric acid. Alternatively, the electronic blocking material may comprise polystyrene or PEGDA, which may be optionally cross-linked.

The electronic blocking material may further comprise a dye, a pigment or a material which scatters light, any of which may be as described above for the process according to the invention. For instance the dye may comprise a rhodamine dye, for instance rhodamine B. The electronic blocking material may comprise polystyrene and rhodamine B.

The dye may additionally be an electron blocking material. For instance the dye may be (dicyanomethylene)-2-methyl-6-(4-dimethylaminostyryl)-4H-pyran), which the inventors have discovered also acts as an electron blocking material.

Alternatively (or additionally), the semi-transparent photoactive layer may comprise a thin layer of an insulating material as defined anywhere above for a process of the invention disposed between the substrate and the dewet layer of the photoactive material. For instance, the photoactive layer of the invention may comprise a thin layer of an insulating material selected from yttrium (III) oxide, magnesium oxide, polystyrene and poly(ethylene glycol) diacrylate, wherein the layer is disposed between the substrate and the dewet layer of a photoactive material. The layer may be of thickness from 0.3 to 10 nm, typically 0.3 to 3 nm.

Optionally, the transparent regions in the dewet layer of the photoactive material comprise a dye or a pigment. They may comprise a layer of the dye or pigment, or the dye or pigment may be dispersed in a material which fills the transparent regions, for instance an inert matrix. The inert matrix may be an insulating polymer as defined above. The dye or pigment may be as defined above.

The invention also provides a process for producing an optoelectronic device comprising
a) producing a semi-transparent photoactive layer by a process comprising
   i) disposing on a substrate a composition, which composition comprises a photoactive material or one or more precursors of a photoactive material, to form a resulting layer, and
   ii) dewetting the resulting layer to form a dewet layer of the photoactive material, wherein the dewet layer of the photoactive material is semi-transparent; and
   b) disposing on the semi-transparent photoactive layer a layer of a semiconductor.

The semiconductor is typically a p-type semiconductor. Thus, typically, step (b) comprises disposing on the semi-transparent photoactive layer a layer of a p-type semiconductor. Any suitable p-type semiconductor may be employed, for instance any of the p-type semiconductors discussed hereinbelow in relation to the optoelectronic device of the invention.

However, the optoelectronic device being produced may be an "inverted" optoelectronic device (wherein n- and p-type regions are interchanged), in which case the semiconductor may be an n-type semiconductor (and step (b) may thus comprise disposing on the semi-transparent photoactive layer a layer of an n-type semiconductor). Any suitable n-type semiconductor may be employed, for instance any of the n-type semiconductors discussed hereinbefore in relation to the semitransparent photoactive layer of the invention.

Step (a) may be as defined anywhere hereinbefore.

In this process, (b) may comprise disposing on the dewet layer of the photoactive material a layer of a p-type semiconductor.

When the layer of the semiconductor is disposed on the semi-transparent photoactive layer, it is typically disposed on the side of the photoactive layer which comprises the dewet layer of the photoactive material. It is typically not disposed on the side of the photoactive layer which principally comprises the substrate.

The term "optoelectronic device", as used herein, refers to a device which sources, controls or detects light. Light is understood to include any electromagnetic radiation, but typically visible light. Examples of optoelectronic devices include photodiodes (including solar cells), phototransistors, photomultipliers, photoresistors, and light emitting diodes. For instance the optoelectronic device may be a photovoltaic device or a solar cell.

A p-type semiconductor is a hole-transporting semiconductor. The p-type semiconductor may be a single p-type compound or elemental material, or a mixture of two or more p-type compounds or elemental materials, which may be undoped or doped with one or more dopant elements. The p-type semiconductor may comprise an inorganic or an organic p-type semiconductor.

Suitable p-type semiconductors may be selected from polymeric or molecular hole transporters.

Suitable p-type semiconductors include molecular hole transporters, polymeric hole transporters and copolymer hole transporters. The p-type semiconductor may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, the p-type layer employed in the optoelectronic device of the invention may for instance comprise any of the aforementioned molecular hole transporting materials, polymers or copolymers.

In one embodiment, the p-type semiconductor is a hole transport material.

In one embodiment, the p-type semiconductor comprises spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly[2,1,3-benzothiadiazole-4,7-diyl [4,4-bis(2-ethylhexyl)-4H-cyclopenta[2,1-b:3,4-b'] dithiophene-2,6-diyl]]), PVK (poly(N-vinylcarbazole)), poly(3-hexylthiophene), poly[N,N-diphenyl-4-methoxyphenylamine-4',4"-diyl], sexithiophene, 9,10-bis(phenylethynyl)anthracene, 5,12-bis(phenylethynyl)naphthacene, diindenoperylene, 9,10-diphenylanthracene, PEDOT-TMA, PEDOT:PSS, perfluoropentacene, perylene, poly(p-phenylene oxide), poly(p-phenylene sulfide), quinacridone, rubrene, 4-(dimethylamino)benzaldehyde diphenylhydrazone, 4-(dibenzylamino)benzaldehyde-N,N-diphenylhydrazone or phthalocyanines.

In one embodiment, the p-type semiconductor comprises spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b'] dithiophene-2,6-diyl]]) or PVK (poly(N-vinylcarbazole)). Typically, the p-type semiconductor comprises (or consists of) spiro-OMeTAD.

The substrate typically comprises a first electrode material and a layer of an n-type semiconductor. In come cases, however, the device may be an "inverted" device, and accordingly the substrate may comprise a first electrode material and a layer of a p-type semiconductor. In such cases, where the device is an "inverted" device, the semiconductor disposed on the semi-transparent photoactive layer in step (b) of the process of the invention for producing the optoelectronic device is generally an n-type semiconductor. The n- and p-type semiconductors maybe as further defined anywhere herein. The p-type semiconductor in an inverted device may comprise PEDOT:PSS (poly(3,4-ethylenedioxythiophene) poly(styrenesulfonate)). The n-type semiconductor may comprise a compact layer of $TiO_2$ and a layer of PC[60]BM ([6,6]-phenyl-C61-butyric acid methyl ester).

The first electrode material usually comprises a transparent conducting oxide or a metal. The transparent conducting oxide or metal may be as defined above.

Often, the first electrode material comprises ITO, FTO or AZO. The first electrode material may be disposed on a glass substrate. Typically the first electrode material forms a layer.

Typically, the layer of an n-type semiconductor is a compact layer of titanium dioxide.

Typically, (b) comprises disposing on the semi-transparent photoactive layer a composition comprising a solvent and the semiconductor material, which is usually a p-type semiconductor material. The composition may be disposed by any means described above, and is typically disposed by spin-coating. The solvent may be any solvent as described above. Typically the solvent is chlorobenzene. Typically, (b) further comprises removing the solvent by heating, vacuum evaporation or allowing the solvent to evaporate.

Often, (b) comprises disposing a composition comprising chlorobenzene and the p-type organic semiconductor on the semitransparent photoactive layer, and removing the solvent.

The concentration of the p-type semiconductor in the solvent is typically from 0.5 M to 1 M.

Typically, the p-type semiconductor is spiro-OMeTAD. The composition often further comprises additives such as lithium bis(trifluoromethylsulfonylimide) (LiTFSI) and 4-tertbutylpyridine (tBP). For instance, (b) may comprise disposing a composition comprising chlorobenzene, spiro-OMeTAD, LiTFSI and tBP. The solvent may additionally comprise acetonitrile. For example, from 0.015 to 0.02 lithium bis(trifluoromethanesulfonyl)imide (optionally in from 0.5 to 1.0 M acetonitrile solution) and from 0.05 to 0.1 M 4-tert-butylpyridine may be added.

The thickness of the layer of the p-type semiconductor may be from 50 nm to 2000 nm, from 100 nm to 1000 nm, or from 400 nm to 800 nm.

Usually the process for producing an optoelectronic device according to the invention further comprises c) disposing on the layer of the semiconductor (which is typically a p-type semiconductor but, in the case of an "inverted" device, may be an n-type semiconductor) a layer of a second electrode material.

The second electrode material may be disposed by thermal evaporation or vacuum deposition.

Often, the second electrode material comprises a metal or a transparent conducting oxide. For instance, ITO, FTO, or AZO, or Ag, Au, Cu, Pt, Pd, W, Al or Fe. Typically, the second electrode material comprises silver, gold, platinum or palladium.

The layer of a second electrode material may have a thickness of from 2 to 100 nm, from 2 to 50 nm, or from 2 to 20 nm. For instance, the layer of a second electrode material may have a thickness of from 2 to 20 nm.

The invention also provides an optoelectronic device which is obtainable by any process for producing an optoelectronic device according to the invention as defined hereinbefore.

The invention also provides an optoelectronic device comprising a semi-transparent photoactive layer wherein the semi-transparent photoactive layer comprises a substrate and, disposed on the substrate, a dewet layer of a photoactive material, wherein the dewet layer of a photoactive material comprises:

a plurality of absorbing regions which comprise the photoactive material; and a plurality of transparent regions which do not substantially comprise the photoactive material.

The semi-transparent photoactive layer may be as defined anywhere herein, or the semi-transparent photoactive layer may be obtainable by a process for producing a semi-transparent layer as defined anywhere herein.

For instance, the optoelectronic device according to the invention may comprise the following layers in the following order:

I. a layer of a first electrode material;
II. a layer comprising an n-type semiconductor;
III. said dewet layer of a photoactive material;
IV. a layer comprising a p-type semiconductor; and
V. a layer of a second electrode material.

The dewet layer of a photoactive material may be obtainable by a process as described anywhere herein.

The term "the following regions in the following order", as used herein, means that each of the regions listed will be present, and that the ordering of each of the present layers will be in the given order. For instance, in the above case (I, II, III, IV, V), II succeeds I, and precedes III, and II alone is between I and III (i.e. neither IV nor V are between I and III, but II is). This is the normal understanding of "in the following order". The order does not, however, define the orientation in space of the collection of regions: I, II, III is equivalent to III, II, I (i.e. "up" and "down" or "left" and "right" are undefined). Additional layers or regions may be present between each of these regions. For instance, I, II, III includes I, Ia, II, IIa, III and I, Ia, Ib, II, III. Typically, however, each region (e.g. I to V) is in contact with both the preceding and the succeeding region.

Additional layers or regions may be present between each of these regions. Typically, however, each region I to V is in contact with both the preceding and the succeeding region. Each of the regions (a first electrode, an n-type region, a layer of a perovskite semiconductor without open porosity, a p-type region and a second electrode) may be as defined anywhere herein.

Typically, the layer of the first electrode material may have a thickness of from 50 nm to 1 μm and or the layer of an n-type semiconductor may have a thickness of from 50 to 200 nm and/or the layer of a p-type semiconductor may have a thickness of from 200 to 500 nm and/or the layer of the second electrode may have a thickness of from 5 to 50 nm (for instance 5 to 10 nm).

The first electrode material, the n-type semiconductor, the p-type semiconductor, and the second electrode material may be as defined anywhere herein.

In one embodiment, the optoelectronic device may comprise the following layers in the following order:
I. a layer comprising ITO, FTO or AZO;
II. a compact layer comprising titanium dioxide;
III. said dewet layer of a photoactive material;
IV. a layer comprising spiro-OMeTAD; and
V. a layer comprising silver, gold, platinum or palladium.

Layer V may for instance comprise gold.

The photoactive material may be as described anywhere hereinbefore, and is typically a perovskite. For instance, the photoactive material typically comprises a photoactive perovskite such as those of formulae (I), (IA), (II) or (IIA). For instance, the photoactive material may comprise one or more perovskites selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbI_2Br$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, $CH_3NH_3SnF_2Cl$, $(H_2N=CH-NH_2)PbI_3$, $(H_2N=CH-NH_2)PbBr_3$ or $(H_2N=CH-NH_2)PbI_{3z}Br_{3(1-z)}$, wherein z is from 0.0 to 1.0.

Occasionally, the optoelectronic device according to the invention may be an inverted optoelectronic device and may comprise the following layers in the following order:
I. a layer of a first electrode material;
II. a layer comprising a p-type semiconductor;
III. a dewet layer of a photoactive material as defined anywhere herein;
IV. a layer comprising an n-type semiconductor; and
V. a layer of a second electrode material.

The dewet layer of a photoactive material may be obtainable by a process as described anywhere herein. The layers and layer components may be as described anywhere herein. The layer of a p-type semiconductor may comprise PEDOT: PSS. The layer of an n-type semiconductor may comprise a compact layer of $TiO_2$ and a layer of PC[60]BM.

The semi-transparent photoactive layers and devices produced and described herein have considerable potential for use in building integrated photovoltaics (BIPV). This is due to both their easy manufacturability and their optical properties such as neutral colouration and facile method to introduce colour tinting.

The invention also provides a process for producing a building component or an automotive component, which process comprises: a process for producing a semi-transparent photoactive layer according to the invention as defined hereinbefore, or a process for producing an optoelectronic device according to the invention as defined hereinbefore.

Also provided is a building component or an automotive component, which building component or automotive component comprises: comprising a semi-transparent photoactive layer as defined hereinbefore, or an optoelectronic device as defined hereinbefore.

The building component may be any object or material used in the construction of structures and buildings. Typically, the building component will comprise a transparent, translucent or semi-transparent area. In one embodiment, the building component is a door, a window, a skylight, a roof panel, a thermal shield, or a vent. Often, the building component will be a window, for instance a window in a glass façade of a building or window panes in a greenhouse. A window may be a tinted window. The automotive component may be any object or component used in the construction of an automobile or vehicle, for instance a car, van, lorry or train. In particular, the automotive component may be a window or a tinted window. Typically, the building component or the automotive component is a door, a window, a tinted window, a skylight, a sunroof, a roof panel, a thermal shield, or a vent. The invention will be further described in the examples which follow.

EXAMPLES

Example 1

Formation of Dewet Perovskite Film

Figure 4:
FIG. 4 shows an SEM image of a ~50% transmission perovskite film, with 56% perovskite coverage, showing the self-assembled perovskite islands that generate power.

A dewet layer of perovskite, $CH_3NH_3PbI_{3-x}Cl_x$, was formed on a glass substrate. $CH_3NH_3I$ and $PbCl_2$ were mixed together in Dimethyl sulfoxide (DMSO) at a molar ratio of 3:1 $CH_3NH_3I$:$PbCl_2$, to form a precursor solution. 100 μl of the precursor solution was deposited onto a clean glass slide and spin-coated at 2000 rpm for 60 seconds. The as-spun film is clear and uniform in appearance. The coated glass slide is then placed into an oven set at 150° C. for 10 minutes. During the period of time in the oven, excess solvent and organic component are lost, and crystallisation of the perovskite absorber, $CH_3NH_3PbI_{3-x}Cl_x$, occurs. In addition to crystallisation, dewetting of the perovskite film occurs while solvent and excess organic components are lost. The dewet layer has a ~50% transmission with 56% perovskite coverage. FIG. 4 shows an SEM image of the dewet layer showing the self-assembled perovskite islands that can generate power.

Figure 6:
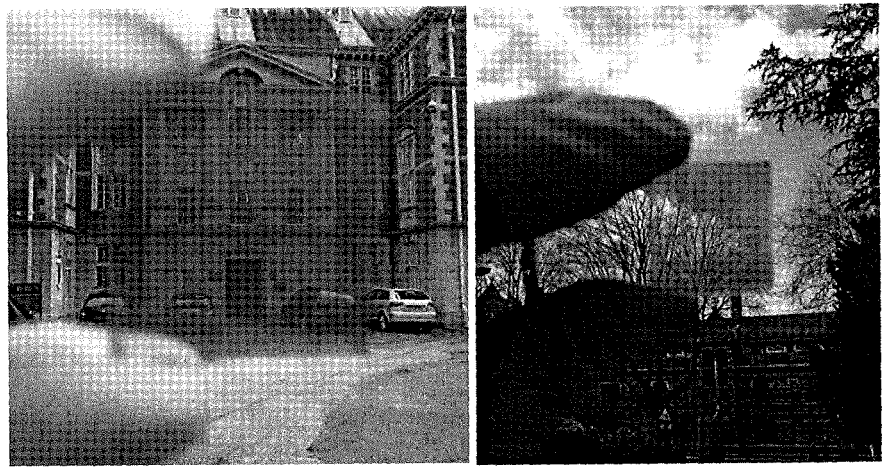
FIG. 6 shows photographs of a semi-transparent photoactive layer comprising a dewet layer of perovskite processed on a glass slide.

FIG. 6 shows photographs of a semi-transparent photoactive layer comprising a dewet layer of perovskite processed on a glass slide, The perovskite is $CH_3NH_3PbI_{3-x}Cl_x$, processed from DMSO solution and annealed at 150° C.

Study of Different Annealing Times

Figure 2:
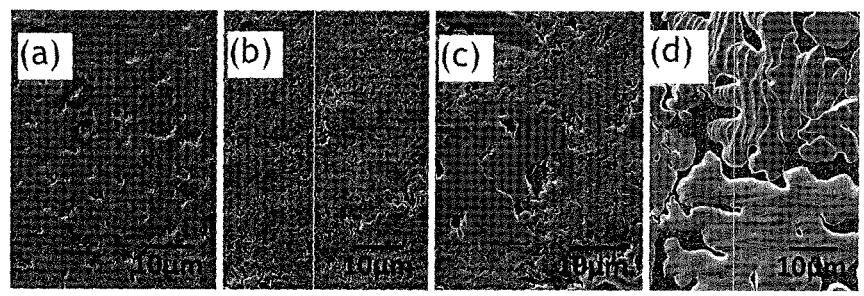
FIG. 2 shows scanning electron microscopy (SEM) micrographs of perovskite films on compact $TiO_2$-coated FTO glass, spin-coated from a DMF solution and left to dry in a nitrogen filled glove box at room temperature for 30 minutes prior to annealing. The films were then annealed for different lengths of time at 100° C., in a nitrogen atmosphere, at anneal times of (a) 0 minutes, (b) 10 minutes, (c) 25 minutes and (d) 60 minutes.

Perovskite films were spin-coated from a DMF solution on compact $TiO_2$-coated FTO glass and left to dry in a nitrogen filled glove box at room temperature for 30 minutes prior to annealing. The films are then annealed for different lengths of time at 100° C. They were prepared in a nitrogen atmosphere at anneal times of (a) 0 minutes, (b) 10 minutes, (c) 25 minutes and (d) 60 minutes. Scanning electron microscopy (SEM) micrographs of the resulting layers are shown in FIG. 2.

Semi-transparent Device Construction

Substrate preparation—Devices were fabricated on fluorine-doped tin oxide (FTO) coated glass. Initially FTO was removed from regions under the anode contact, to prevent shunting upon contact with measurement pins. This was done by etching the FTO with 2M HCl and zinc powder. Substrates were then cleaned sequentially in hallmanex, acetone, propan-2-ol and oxygen plasma.

Compact layer coating—A hole-blocking layer of compact $TiO_2$ was deposited by spin-coating a mildly acidic solution of titanium isopropoxide in ethanol (350 ul added to 5 ml EtOH), and annealed at 500° C. for 30 minutes. Spin-coating was carried out at 2000 rpm for 60 seconds, with a ramp of 2000 rpm/s.

Perovskite coating via solution deposition—The dewetting perovskite layer was deposited by spin-coating a non-stoichiometric precursor solution of methylammonium iodide and lead (II) chloride (3:1 molar ratio in DMSO, final concentrations 0.88M lead chloride and 2.64M methylammonium iodide) in air, followed by annealing at 150° C. on a hotplate for 10 minutes to dewet the layer. Spin-coating was carried out in air at 2000 rpm for 60 seconds, with a ramp of 1000 rpm/s.

Hole-transporter coating—A hole-transporting layer was then deposited via spin-coating a 0.788M solution in chlorobenzene of 2,2',7,7'-tetrakis-(N,N-di-p-methoxyphenylamine)9,9'-spirobifluorene (spiro-OMeTAD), with additives of 0.0184 lithium bis(trifluoromethanesulfonyl)imide (added in 0.61M acetonitrile solution) and 0.0659M 4-tert-butylpyridine. Spin-coating was carried out in air at 2000 rpm for 60 seconds, with a ramp of 2000 rpm/s.

Thermal evaporation of electrodes—Gold electrodes were thermally evaporated under vacuum of ~$10^{-6}$ Torr, at a rate of ~0.1 nm/s, to complete the devices. For semi-transparent contacts, 7 nm was deposited, and for reflective contacts 50 nm was deposited.

Device Characterisation

Figure 7:
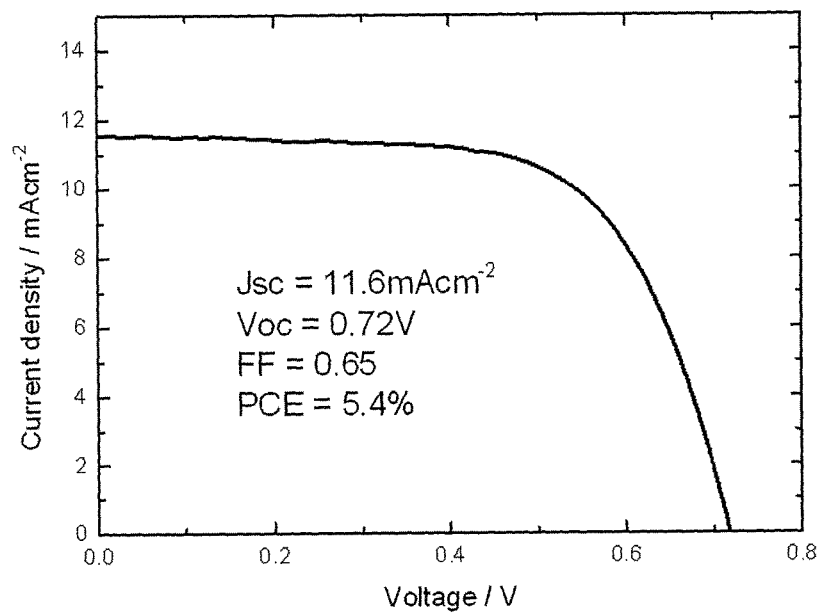
FIG. 7 shows current-voltage characteristics of an efficient solar cell fabricated with a semi-transparent perovskite absorber, though with 50 nm Au electrodes which are non-transparent, measured under simulated AM1.5 sunlight of 100 mWcm$^{-2}$.

Current-voltage characteristics of an efficient solar cell fabricated with a semi-transparent perovskite absorber and 50 nm Au electrodes (which are non-transparent) were measured under simulated AM1.5 sunlight of 100 mWcm$^{-2}$. The results are shown in FIG. 7.

Effect of Extent of Dewetting on Device Performance

Figure 8:
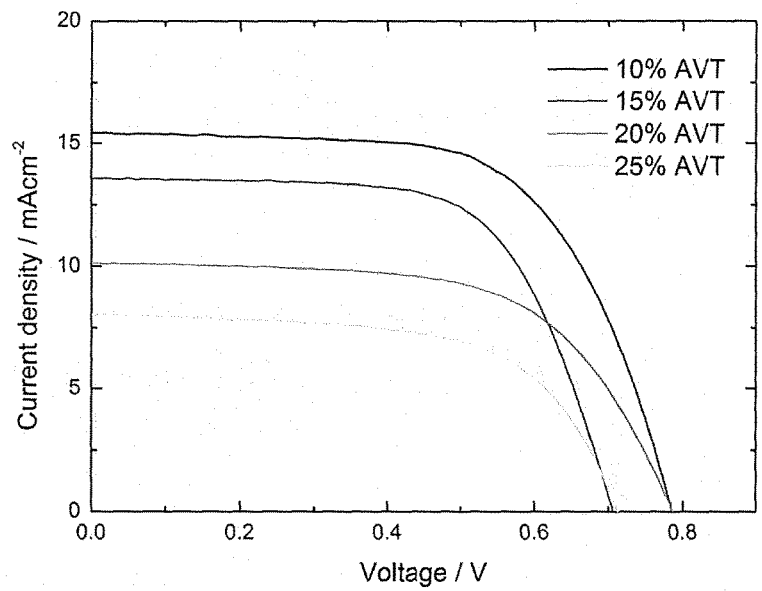
FIG. 8 shows current-voltage curves measured under simulated AM1.5 sunlight of 100 mWcm$^{-2}$ for solar cells of the invention comprising dewet perovskite films with differing levels of dewetting. The precise cell structure is FTO/compact $TiO_2$/dewet perovskite film/spiro-OMeTAD/10 nm thick semi-transparent Au electrode. The solar cells all have different levels of average visible transmittance (AVT), averaged between 370 and 740 nm.

Cells were constructed with the following structure: FTO/compact TiO$_2$/dewet perovskite film/spiro-OMeTAD/10 nm thick semi-transparent Au electrode. The solar cells all have different levels of average visible transmittance (AVT), averaged between 370 and 740 nm. FIG. 8 shows current-voltage curves measured under simulated AM1.5 sunlight of 100 mWcm$^{-2}$ for the produced solar cells comprising dewet perovskite films with differing levels of dewetting (measured by their AVTs of 10%, 15%, 20% or 25%).

Blocking Methods

Oxide pre-treatment—In some cases it is desirable to pre-treat the substrate with an insulating material prior to producing the dewet photoactive layer. Yttrium oxide or magnesium oxide treatments were applied by soaking the substrates, after annealing the compact layer, in solutions of 10 mM yttrium nitrate+40 mM sodium hydroxide in H$_2$O at room temperature, or 20 mM magnesium acetate in ethanol at 100° C., respectively.

Figure 23:
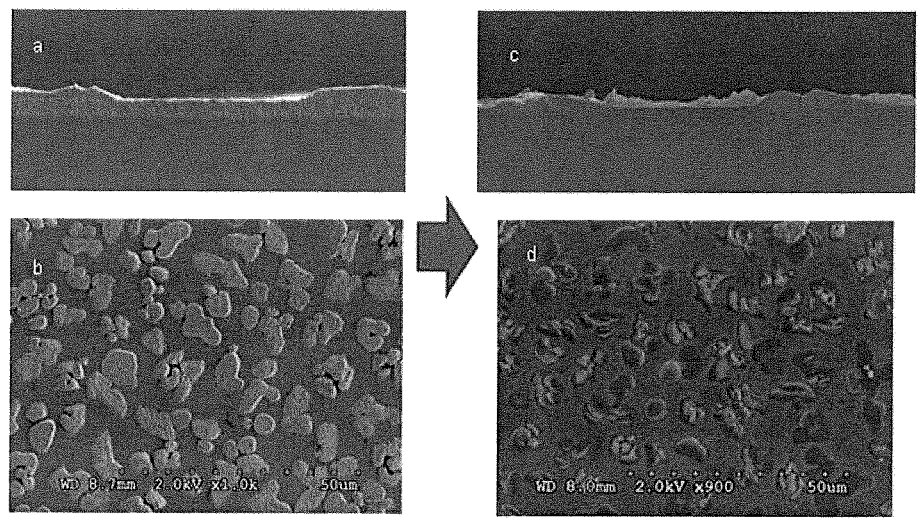
FIG. 23 shows SEM micrographs of polystyrene pore-filling. (a) shows a cross-sectional image and (b) shows a top image of untreated perovskite film with perovskite islands visible. (c) shows a cross-sectional image and (d) shows a top view of an equivalent film after also spin-coating a polystyrene film. Polystyrene is seen to fill in the voids but leave the top of the perovskite islands clear, enabling selective electrical contact to the top of the perovskite islands.

Insulating polymer blocking treatment—In some cases the transparent regions are blocked with an insulating polymer. Here, polystyrene or cross-linked PEGDA were used. Polystyrene was spin-coated at 30 mg/ml in chlorobenzene after the perovskite was annealed. PEGDA (polyethylene glycol diacrylate) was spin-coated after perovskite annealing with 1% by weight DMPA (2,2-Dimethoxy-2-phenylacetophenone) at a 19:1 or 9:1 dilution in chlorobenzene. FIG. 23 shows SEM micrographs of pore-filling with polystyrene. (a) shows a cross-sectional image and (b) shows a top image of untreated perovskite film with perovskite islands visible. (c) shows a cross-sectional image and (d) shows a top view of equivalent film after also spin-coating a polystyrene film. Polystyrene is seen to fill in the voids but leave the top of the perovskite islands clear, enabling selective electrical contact to the top of the perovskite islands.

Figure 14:
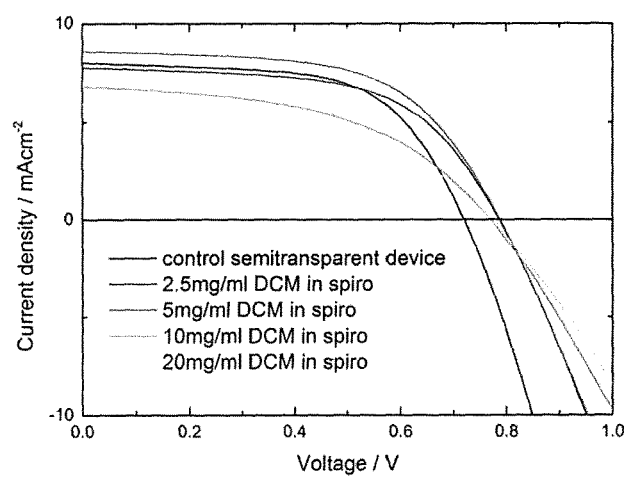
FIG. 14 shows current voltage curves for solar cells comprising a dewet perovskite film, with the addition of (4-(dicyanomethylene)-2-methyl-6-(4-dimethylaminostyryl)-4H-pyran) (DCM) to the spiro-OMeTAD hole-transporter matrix. DCM is a red dye which strongly tints the transmission of light through the device. Here in addition to increasing the photocurrent, there is a significant increase in open-circuit voltage with a small addition of DCM. This increase in voltage is consistent with DCM preferentially wetting and coating the $TiO_2$ compact layer, in preference to spiro-OMeTAD, resulting in reduced dark current leakage through the shunting path. Hence in this example, the DCM acts as both an electronic blocking layer and as a colour tinting dye.
Figure 15:
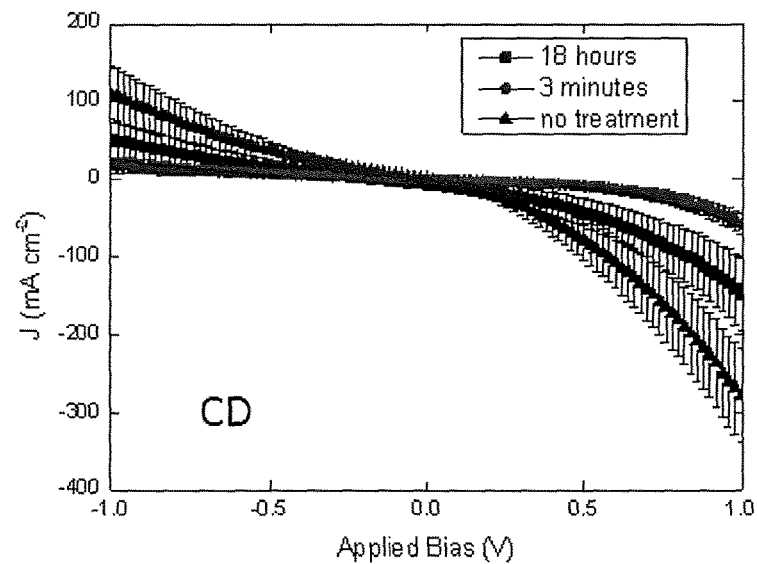
FIG. 15 shows dark current density-voltage characteristics for diodes comprising glass/FTO/compact $TiO_2$/carboxylated β-cyclodextrin (CD)/spiro-OMeTAD/Ag. The magnitude of the dark current indicates the extent to which dark leakage current through the parallel shunt diode will occur in the complete solar cell comprising the dewet perovskite layer.
Figure 16:
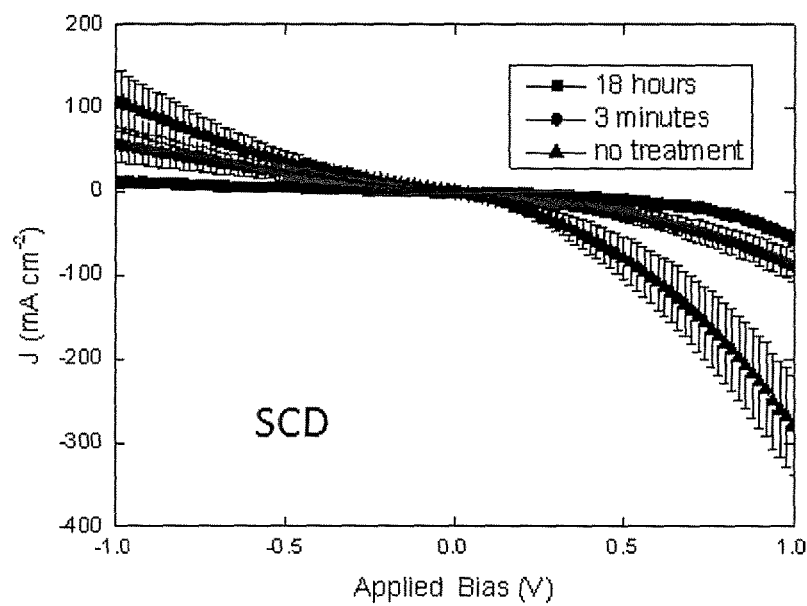
FIG. 16 shows dark current density-voltage characteristics for diodes comprising glass/FTO/compact $TiO_2$/succinyl α-cyclodextrin (SCD)/spiro-OMeTAD/Ag.
Figure 17:
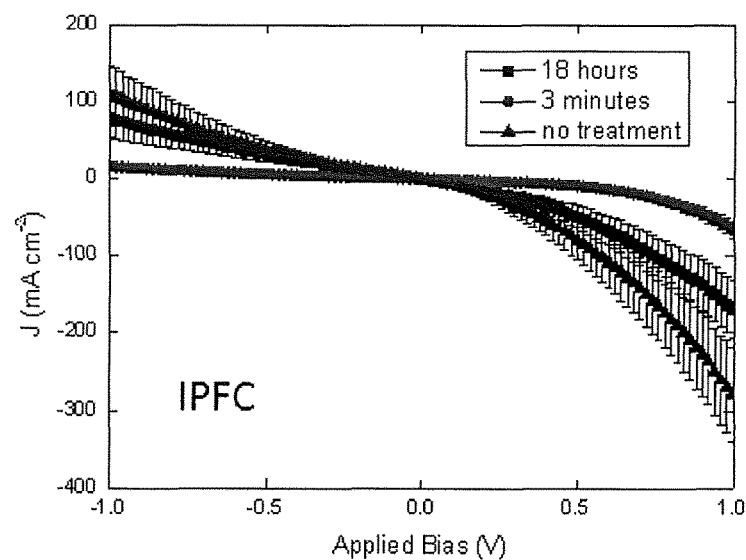
FIG. 17 shows dark current density-voltage characteristics for diodes comprising glass/FTO/compact $TiO_2$/iodotetrafluorobenzene carboxylic acid (ITFC)/spiro-OMeTAD/Ag.
Figure 18:
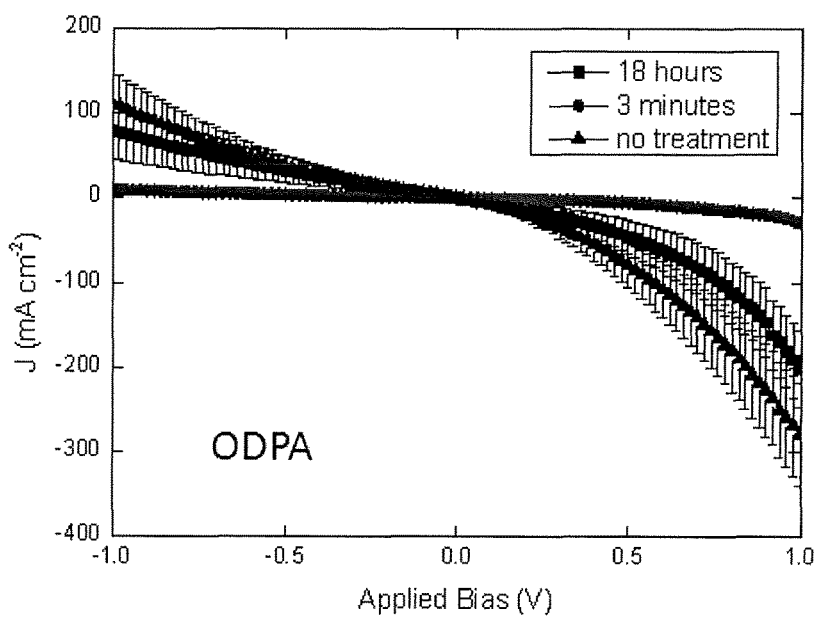
FIG. 18 shows dark current density-voltage characteristics for diodes comprising glass/FTO/compact $TiO_2$/octadecylphosphonic acid (ODPA)/spiro-OMeTAD/Ag.
Figure 19:
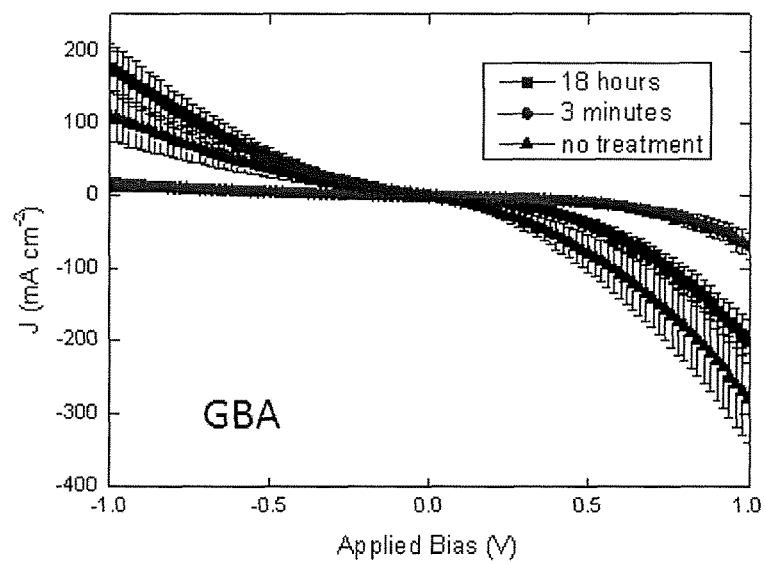
FIG. 19 shows dark current density-voltage characteristics for diodes comprising glass/FTO/compact $TiO_2$/4-guanidinobutyric acid (GBA)/spiro-OMeTAD/Ag.
Figure 20:
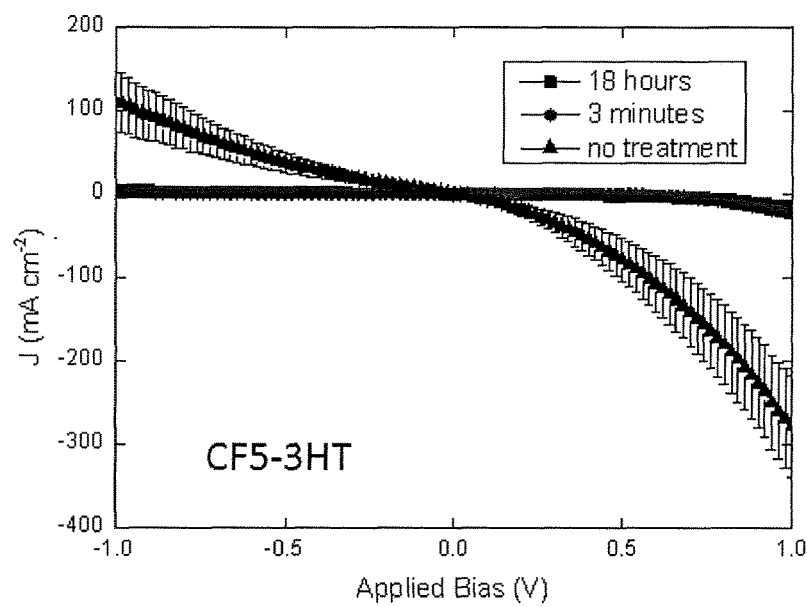
FIG. 20 shows current density-voltage characteristics for diodes comprising glass/FTO/compact $TiO_2$/cyanoacrylic end functionalised penta(3-hexylthiophene) (cf5-3HT)/spiro-OMeTAD/Ag.

Simultaneous blocking layer and hole transporter deposition—A hole-transporting layer containing an electron blocking molecule was then deposited via spin-coating. DCM is dissolved in chlorobenzene at concentrations ranging from 2.5 to 20 mg/ml. To these solutions 2,2',7,7'-tetrakis-(N,N-di-p-methoxyphenylamine)9,9'-spirobifluorene (spiro-OMeTAD) is added at 0.788M, with additives of 0.0184 lithium bis(trifluoromethanesulfonyl)imide (added in 0.61M acetonitrile solution) and 0.0659M 4-tert-butylpyridine. Spin-coating was carried out in air at 2000 rpm for 60 seconds, with a ramp of 2000 rpm/s. Results are shown in FIG. 14.

Surface absorbed mono-layer blocking treatment—Alternatively, a monolayer treatment was used to prevent current leakage. Devices were fabricated on cleaned glass substrates coated with fluorine doped tin oxide (FTO). A compact layer of TiO$_2$ was coated onto the substrate by spin coating of a mildly acidic solution of titanium isopropoxide in ethanol, followed by heating to 500° C. Various surface treatments were applied to the compact layer to insulate the interface. Solutions of molecules for surface treatments were prepared in chlorobenzene at a concentration of 1 mM. The TiO$_2$ surface was functionalised by submersion of the substrate in these solutions for either 18 hours or 3 minutes. The following molecules were used: carboxylated β-cyclodextrin (CD), succinyl α-cyclodextrin (SCD), cyanoacrylic end functionalised penta(3-hexylthiophene) (cf5-3HT), iodotetrafluorobenzene carboxylic acid (ITFC), octadecylphosphonic acid (ODPA), and 4-guanidinobutyric acid (GBA). A comparison was made with pure solvent treatment to control for its effect on the surface. After surface treatment, the substrates were rinsed with chlorobenzene to remove any residue, and dried with a stream of nitrogen. The hole transporting layer was deposited by spin coating a solution of spiro-OMeTAD (2,2(,7,7(-tetrakis-(N,N-di-pmethoxyphenylamine)9,9(-spirobifluorene) in chlorobenzene containing lithium-bis(trifluoromethanesulfonyl)imide (LiTFSI) and 4-tert-butylpyridine (tBP) as additives. Finally, a metallic contact electrode was formed by evaporation of a bilayer of gold and silver with thicknesses of 40 nm and 150 nm respectively.

Figure 21:
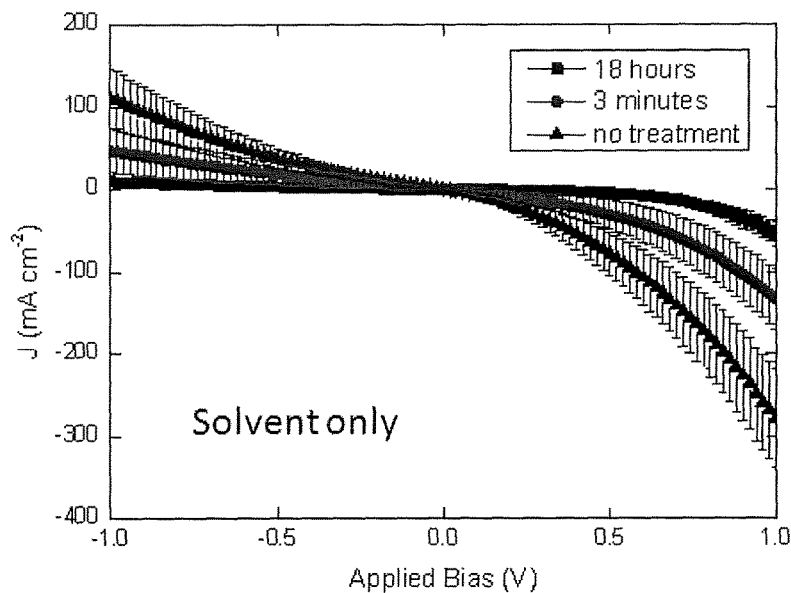
FIG. 21 shows current density-voltage characteristics for diodes comprising glass/FTO/compact $TiO_2$/spiro-OMeTAD/Ag, where the compact $TiO_2$ layer is treated by rinsing in solvent (chlorobenzene) prior to the step of coating with spiro-OMeTAD.
Figure 22:
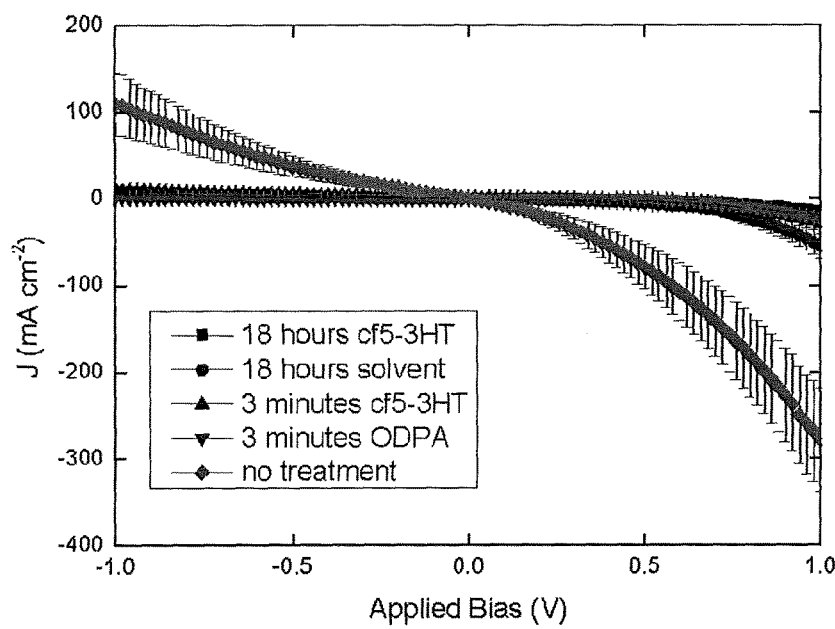
FIG. 22 shows a comparison of current voltage characteristics for diodes that reduce the leakage current further than 18 hours of solvent treatment.

The current densities through the diodes as a function of bias are shown in FIGS. 15 to 20. The curves give the mean and standard error of the current based on 12 unique devices. Of the treatments, it was found that ODPA and cf5-3HT reduce the current through the diodes to a greater extent than solvent treatment suggesting that this method is adequate for blocking this competing diode in solar cells. Treatments with solvent only are shown in FIG. 21. A comparison of diode characteristics for 18 hours with cf5-3HT, 18 hours with solvent, 3 minutes with cf5-3HT, 3 minutes with ODPA and no treatment are shown in FIG. 22.

Transmission Measurements

Figure 5:
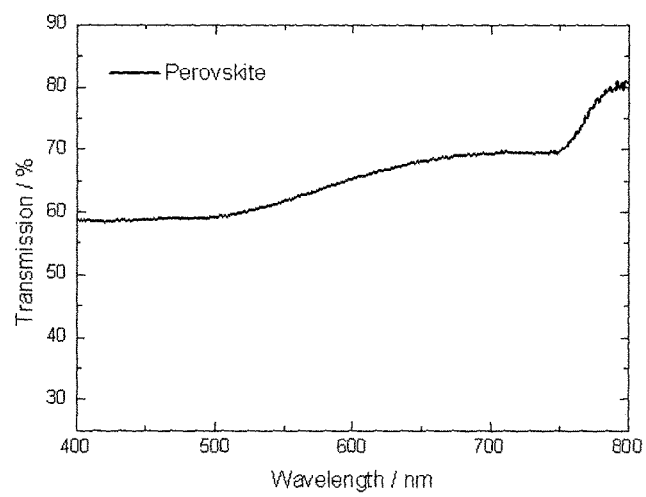
FIG. 5 shows a transmission spectrum of a dewet layer of perovskite on glass, measured in an integrating sphere. Such a layer shows exceptional transmission (between 60% and 70% in the visible region), and is used as the photoactive layer in a typical semi-transparent solar cell such as described herein, and with performance as characterised in FIG. 7.

FIG. 5 shows a transmission spectrum of a dewet layer of perovskite on glass, measured in an integrating sphere. Such a layer shows exceptional transmission (between 60% and 70% in the visible region), and is used as the photoactive layer in a typical semi-transparent solar cell such as described herein.

Vapour Deposition of Perovskite

Perovskite coating via vapour deposition: single source—It is also possible to dispose a layer of perovskite by vapour deposition. A 1:1 molar ratio of PbI$_2$ and CH$_3$NH$_3$Cl was ground with a pestle and mortar for 15 minutes to form a bulk perovskite powder. This formed a powder which was desiccated in a nitrogen environment for >12 hours. A crucible of perovskite powder was transferred to an evaporation chamber which was subsequently evacuated. The crucible was slowly heated to 300° C. When the source temperature reached 100° C., a shutter was opened to commence deposition onto the substrates. The heater was periodically switched off to maintain a pressure of $10^4$ mbar in the chamber. Evaporation continued until a thin film of approximately 100-300 nm had been deposited onto the substrates.

Perovskite coating via vapour deposition: dual source—It is also possible to deposit the perovskite via vapour deposition from two separate sources. The perovskite absorber was deposited employing a dual-source evaporation system (Kurt J. Lesker Mini Spectros) with ceramic crucibles (organic light emitting diode (OLED) sources) in a nitrogen-filled dry glovebox. This evaporation system is able to independently and simultaneously control the heating sources, and monitor the deposition rate of the organic and inorganic source. The vapour deposited perovskite devices were fabricated on fluorine-doped tin oxide (FTO)-coated glass. A compact layer of $TiO_2$ acted as an electron selective layer and was deposited on the FTO glass by spin-coating a mildly acidic solution of titanium isopropoxide in ethanol, and subsequently the perovskite layer was deposited through dual-source evaporation upon the compact $TiO_2$ coated FTO substrates. Methylammonium iodide ($CH_3NH_3I$) and lead chloride ($PbCl_2$) were the organic and inorganic precursors, evaporated simultaneously under $10^{-5}$ bar with an as deposited molar ratio of 4:1 based on the reading of sensors positioned above the crucibles.

Effect of Average Visible Transmittance (AVT) on Power Conversion Efficiency

Figure 9:
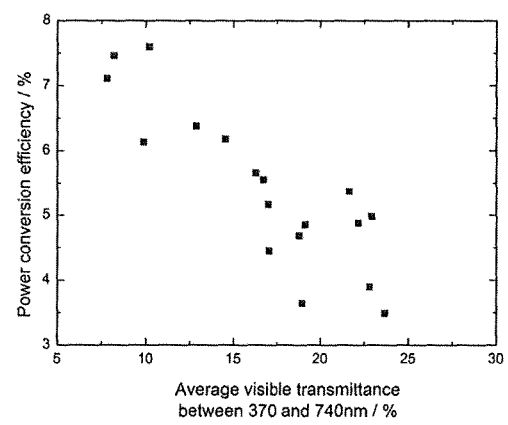
FIG. 9 shows the power conversion efficiency, determined from measuring current-voltage curves under simulated AM1.5 sun light of 100 mWcm$^{-2}$, as a function of average visible transmittance (AVT).

A number of cells with different AVTs were constructed. FIG. 9 shows the power conversion efficiency, determined from measuring current-voltage curves under simulated AM1.5 sun light of 100 mWcm$^{-2}$, as a function of average visible transmittance (AVT), which was determined by UV-Vis spectrophotometry.

Coverage Versus AVT

Figure 10:
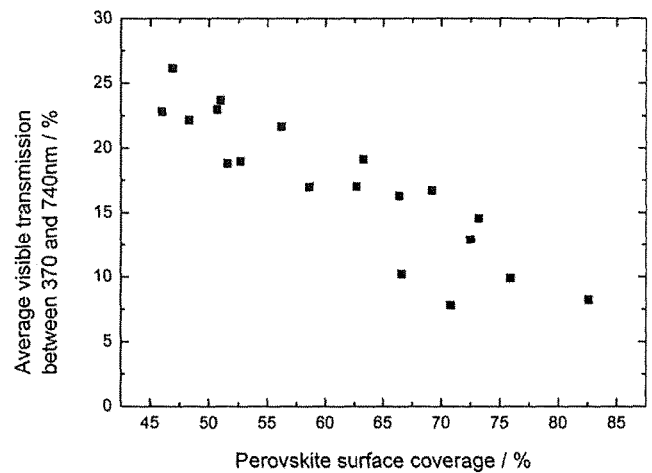
FIG. 10 shows the average visible transmittance (AVT) versus the fractional surface coverage of the perovskite absorber (ratio of coated to non-coated regions). The solar cell structure is glass/FTO/compact $TiO_2$/dewet perovskite film/spiro-OMeTAD/10 nm thick semi-transparent Au electrode. The 10 nm thick Au electrode offers a certain degree of semi-transparency.

FIG. 10 shows the average visible transmittance (AVT) versus the fractional surface coverage of the perovskite absorber (ratio of coated to non-coated regions). The solar cell structure is glass/FTO/compact $TiO_2$/dewet perovskite film/spiro-OMeTAD/10 nm thick semi-transparent Au electrode and the cells were constructed by a process according to the invention. The 10 nm thick Au electrode offers a certain degree of semi-transparency.

Effect of a Rhodamine B Dye on Transmission Spectrum

Figure 12:
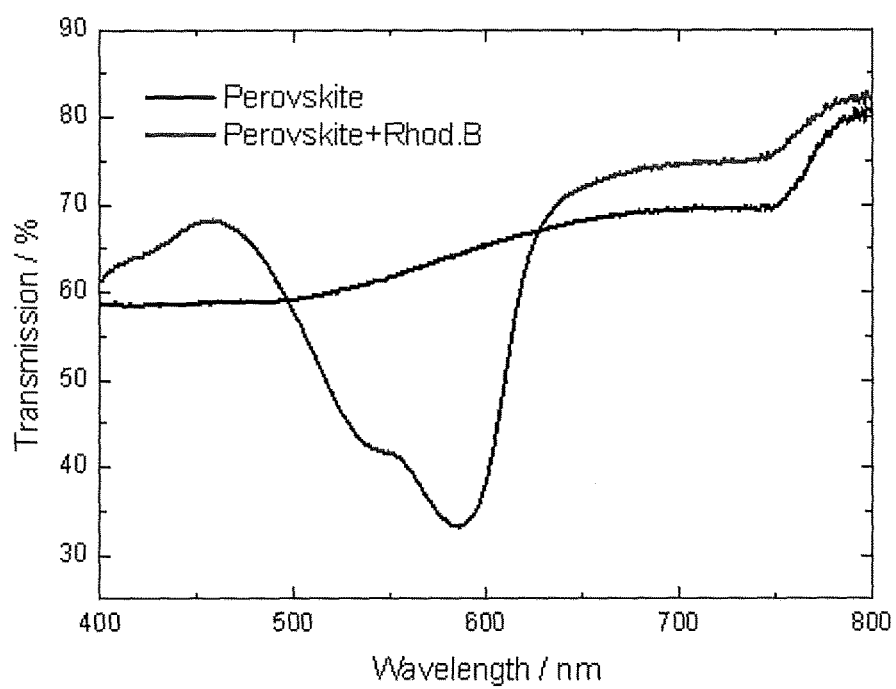
FIG. 12 demonstrates the ability to tune the colour of the transmitted light passing through the dewet perovskite films via the addition of dye.

FIG. 12 demonstrates the ability to tune the colour of the transmitted light passing through the dewet perovskite films via the addition of dye. This figure shows total transmission of a semi-transparent perovskite film (black) and a semi-transparent perovskite film with a spin-coated layer of Rhodamine B dye in a polystyrene matrix (grey), measured with a UV-Vis spectrophotometer and an integrating sphere. The contribution of the dye to the transmission spectrum is clearly seen, between 450 and 650 nm.

Effect of Surface Treatments on Device Characteristics

Figure 24:
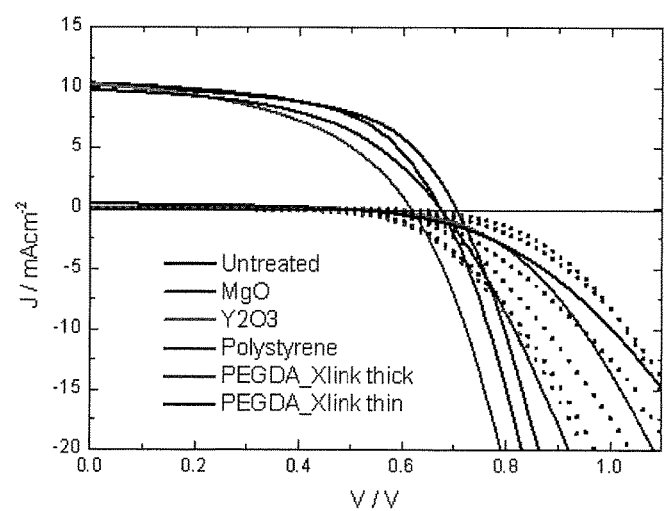
FIG. 24 shows average current-voltage characteristics for semitransparent perovskite solar cells prepared with a range of surface treatments, measured under simulated AM1.5 sunlight. It is observed that treatments such as magnesium oxide can increase the open-circuit voltage of dewet perovskite solar cells under operation.

Average current-voltage characteristics were evaluated for semitransparent perovskite solar cells prepared with a range of surface treatments according to the invention, measured under simulated AM1.5 sunlight. The results are shown in FIG. 24. It is observed that treatments such as magnesium oxide can increase the open-circuit voltage of dewet perovskite solar cells under operation.

Figure 25:
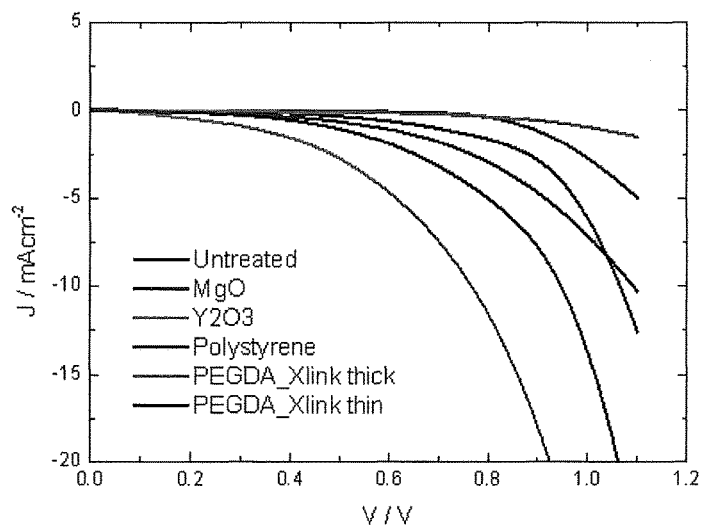
FIG. 25 shows average current-voltage curves for glass/FTO/Compact $TiO_2$/spiro-OMeTAD/Ag diodes with surface treatments of the compact $TiO_2$ applied before spin-coating spiro-OMeTAD.

Glass/FTO/Compact $TiO_2$/spiro-OMeTAD/Ag diodes were constructed with surface treatments of the compact $TiO_2$ applied before spin-coating spiro-OMeTAD. FIG. 25 shows average current-voltage curves for these diodes. The difference in the magnitude of the dark current under forward bias gives information about current blocking effectiveness of the surface treatments.

Figure 26:
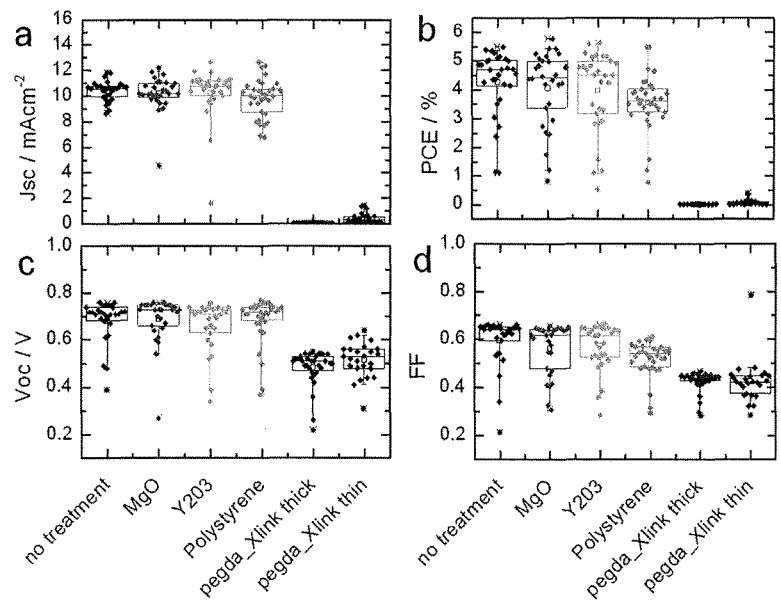
FIG. 26 shows solar cell performance parameters (a) short-circuit current, (b) power conversion efficiency, (c) open-circuit voltage and (d) fill factor, extracted from current voltage curves measured under simulated AM1.5 sun light of 100 $mWcm^{-2}$, for solar cells fabricated with a range of surface treatments labelled on the x-axis.

Further solar cell performance parameters are shown in FIG. 26 ((a) short-circuit current, (b) power conversion efficiency, (c) open-circuit voltage and (d) fill factor, extracted from current voltage curves measured under simulated AM1.5 sun light of 100 mWcm$^{-2}$), for solar cells fabricated with a range of surface treatments labelled on the x-axis. The solar cell structure was Glass/FTO/Compact $TiO_2$/optional surface treatment/dewet perovskite film/spiro-OMeTAD/Ag Example 2

Methods

Materials. Unless otherwise stated, all materials were purchased from Sigma-Aldrich or Alfa Aesar and used as received. Spiro-OMeTAD was purchased from Borun Chemicals. $CH_3NH_3I$ was synthesised according to a reported procedure.

Semi-Transparent Perovskite Solar Cell Preparation. Devices were fabricated on fluorine-doped tin oxide (FTO) coated glass (Pilkington, 7Ω ☐$^{-1}$). Initially FTO was removed from regions under the anode contact by etching the FTO with 2M HCl and zinc powder. Substrates were then cleaned sequentially in hallmanex detergent, acetone, propan-2-ol and oxygen plasma. A ~50 nm hole-blocking layer of compact TiO2 was deposited by spin-coating a mildly acidic solution of titanium isopropoxide in ethanol (350 ul in 5 ml ethanol with 0.013M HCl) at 2000 rpm, and annealed at 500° C. for 30 minutes. The dewet perovskite layers were deposited by spin-coating a non-stoichiometric precursor solution of methylammonium iodide and lead chlorine (3:1 molar ratio, final concentrations 0.88M lead chloride and 2.64M methylammonium iodide) in either dimethylsulfoxide (DMSO), n-methyl-2-pyrrolidone (NMP) or N,N-dimethylformamide (DMF) (not mixtures of). The films were then annealed to dewet and crystallise the perovskite. Details of the conditions used to produce a certain active layer transmittance are discussed below. Spin-coating and annealing was carried out in either air or a moisture and oxygen-free glovebox ($H_2O$<1 ppm), at 2000 rpm. Annealing was carried out at a range of temperatures between 90° C. and 150° C. The hole-transporting layer was then deposited via spin-coating a 0.788M solution in chlorobenzene of 2,2',7,7'-tetrakis-(N,N-di-p-methoxyphenylamine)9,9'-spirobifluorene (spiro-OMeTAD), with additives of 0.0184 lithium bis(trifluoromethanesulfonyl)imide (added in 0.61M acetonitrile solution) and 0.0659M 4-tert-butylpyridine. Spin-coating was carried out in air at 2000 rpm. Gold electrodes were thermally evaporated under vacuum of ~10$^{-6}$ Torr, at a rate of ~0.1 nm/s, to complete the devices. For semi-transparent contacts, ~10 nm was deposited.

Device Characterisation. The current density-voltage (J-V) curves were measured (2400 Series SourceMeter, Keithley Instruments) under simulated AM 1.5 sunlight at 100 mWcm$^{-2}$ irradiance generated by an Abet Class AAB sun 2000 simulator, with the intensity calibrated with an NREL calibrated KG5 filtered Si reference cell. The mismatch factor was calculated to be less than 1%. The solar cells were masked with a metal aperture to define the active area, typically 0.09 cm$^{-2}$ (measured individually for each mask) and measured in a light-tight sample holder to minimize any edge effects and ensure that the reference cell and test cell are located during measurement in the same spot under the solar simulator.

Optical measurements. Transmittance and reflectance spectra were collected with a Varian Cary 300 UV-Vis spectrophotometer with an internally coupled integrating sphere.

Film Characterisation: A Hitachi S-4300 field emission scanning electron microscope and a FEI Inspect S50 tungsten source scanning electron microscope were used to acquire SEM images. To determine coverage of perovskite films from SEM images, ImageJ (Rasband, W. ImageJ 2005, http://rsb.info.nih.gov/ij) was used to define a greyscale threshold such that the perovskite was distinct from the substrate, and percentage coverage was then calculated by the program. Sample thicknesses were measured using a Veeco Dektak 150 surface profileometer.

Controlling Dewetting to Achieve a Certain Transparency

To achieve a certain amount of dewetting, we varied the atmosphere (air or nitrogen-filled glovebox) in which films were spin-coated and annealed, the annealing temperature, and the vapour pressure of the solvent used (either dimethylsulfoxide (DMSO), n-methyl-2-pyrrolidone (NMP) or N,N-dimethylformamide (DMF)). We were able to vary perovskite surface coverage after annealing between ~50% and ~100%, as estimated using ImageJ software from SEM images.

As shown below, active layer transmittance shows a strong correlation with surface coverage, ranging from ~7% to ~60% for these samples. Spin-coating perovskite precursor solution was carried out at 2000 rpm for all samples. The other layers in the active layer were coated in air as described in the Methods section of the main text. It should be noted that samples prepared in air showed more variability between batches than those prepared in the glovebox, due to the fact that ambient moisture has been seen to affect the perovskite's formation (Eperon, G. E.; Burlakov, V. M.; Docampo, P.; Goriely, A.; Snaith, H. J. Morphological Control for High Performance, Solution-Processed Planar Heterojunction Perovskite Solar Cells. Adv. Funct. Mater. 2013. doi: 10.1002/adfm.201302090), and we did not fabricate devices in humidity-controlled air.

Calculation of Active Layer Transmittance

To calculate the active layer transmittance, what is meant by this is first defined. Because we are interested in the properties of only the active layer, we define the active layer transmittance as being the percentage light intensity which is not absorbed in a single pass through it. Hence, we exclude interfacial reflections and absorbance in other layers of the cell.

Figure 27:
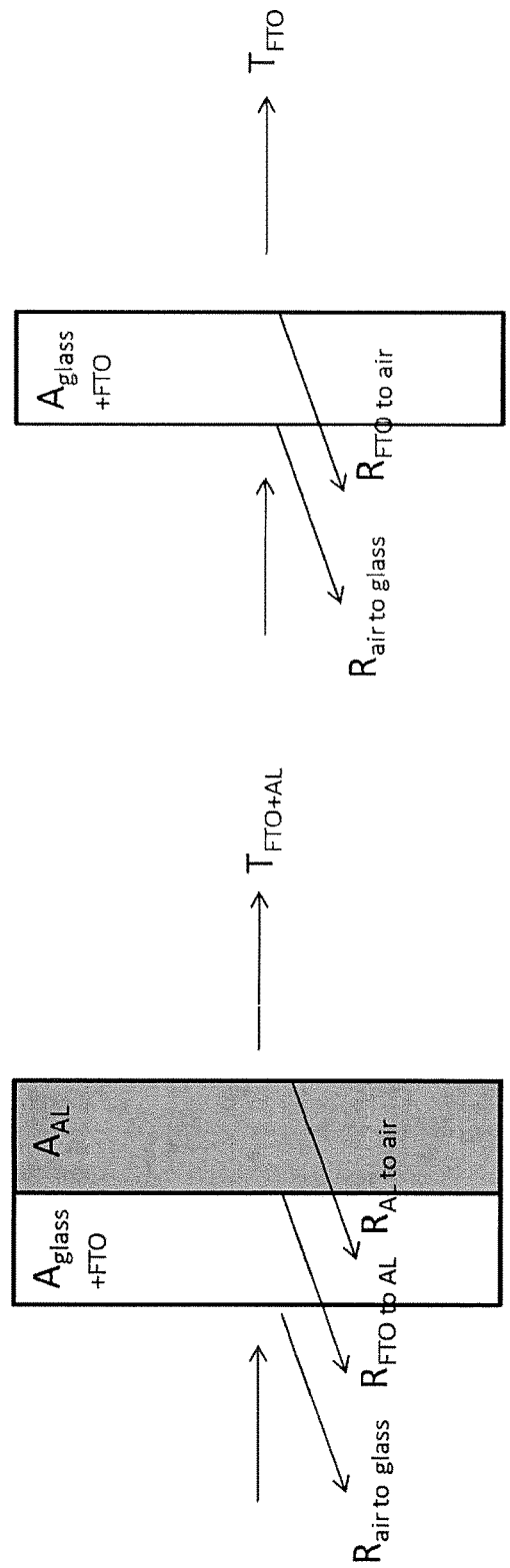
FIG. 27 shows, diagrammatically, the transmittances and reflectances involved in measuring the active layer transmittance. The left diagram shows optical processes in a sample on FTO-coated glass, whereas the right diagram is for FTO-coated glass only. FTO would comprise a thin layer on the right side of the glass.

We measured the transmittance of active layers formed on FTO-coated glass, and the transmittance of FTO-coated glass only, using an integrating sphere. We ignore any optical effects between glass and FTO. As seen in FIG. 27, the reflections from these films will be different. The dominant reflection, at the air-glass interface, will be the same. However, the semi-transparent perovskite cell has a second reflection at the FTO-active layer interface, and a third reflection at the perovskite-air interface. The FTO-coated glass sample has a second reflection at the FTO-air interface. We can calculate the effect the reflections have on the transmittances measured:

$$T_{FTO} = (1 - R_{air\ to\ glass})(1 - A_{glass+FTO})(1 - R_{FTO\ to\ air}) \quad (1)$$

$$T_{FTO+AL} = (1 - R_{air\ to\ glass})(1 - A_{glass+FTO})(1 - R_{FTO\ to\ AL})(1 - A_{AL})(1 - R_{AL\ to\ air}) \quad (2)$$

Where T, R, and A are the fractional transmittance, reflectance and absorption within a layer or at an interface. "AL" is the abbreviation used for the active layer.

We have defined the active layer transmittance as $(1-A_{AL})$, so rearranging for this term, we can cancel several components:

$$1 - A_{AL} = \frac{T_{FTO+AL}(1 - R_{FTO\ to\ air})}{T_{FTO}(1 - R_{FTO\ to\ AL})(1 - R_{AL\ to\ air})} \quad (3)$$

So if we can quantify the reflections from FTO to air, FTO to the active layer, and the active layer to air, we can find the active layer transmittance from the measured transmittances. In order to measure these, we make the assumption that the angle of incidence is small, and that we can ignore interference effects and more than two multiple reflections. Then, from the Fresnel equations, the reflectance is the same from both sides of an interface (i.e. $R_{AL\ to\ air} \approx R_{air\ to\ AL}$). We can then determine the necessary reflectances as shown below. The reflectance from the active layer side of a sample is given by:

$$R_{AL+FTO} = R_{air\ to\ AL} + (1 - R_{air\ to\ AL})(1 - A_{AL})^2 R_{AL\ to\ FTO} + \ldots \text{(smaller terms)} \quad (4)$$

If we make the assumption that the second term is small compared to the first term (it is attenuated twice by the active layer absorption, and the reflectance from the active layer to FTO is likely <20% based on expected indices of refraction), then we can obtain $R_{air}$ to $_{AL}$. The reflectance from the glass side of the same sample is given by:

$$R_{FTO+AL} = R_{air\ to\ glass} + (1 - R_{air\ to\ glass})(1 - A_{FTO+glass})^2 R_{FTO\ to\ AL} + \ldots \text{(smaller terms)} \quad (5)$$

Figure 28:
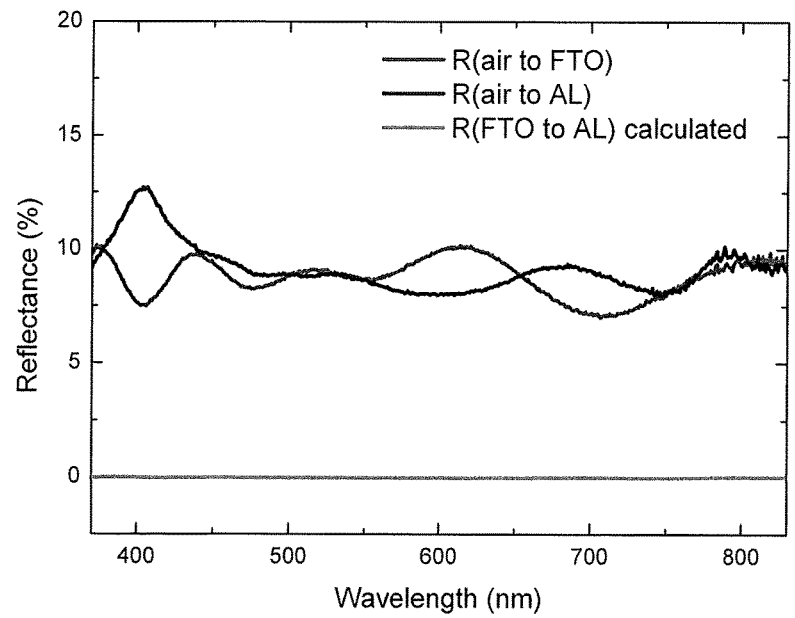
FIG. 28 shows (a) reflectance spectra of the relevant reflections for determining active layer transmittance, and (b) transmittance spectra showing the impact of factoring in reflective differences between FTO and FTO+sample to the calculated active layer transmittance.
Figure 28:
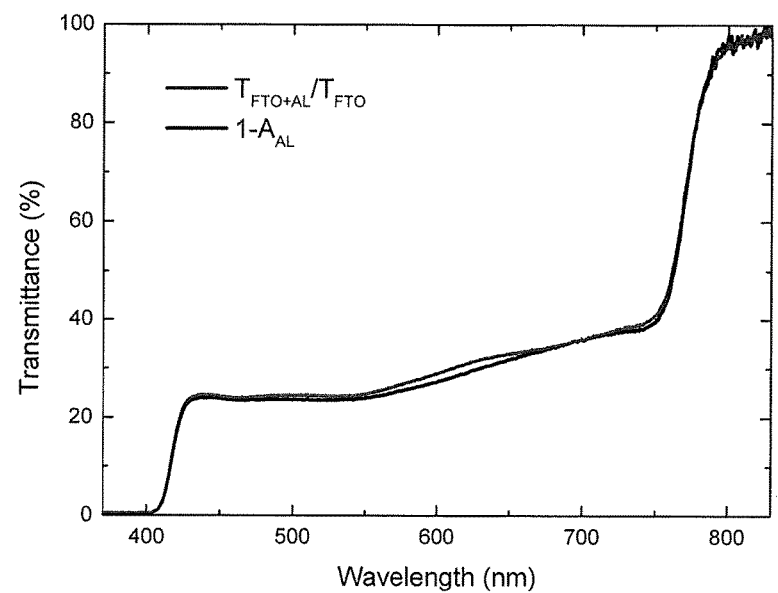

We can measure $R_{air\ to\ glass}$, and we can measure $A_{FTO+glass}$ (using A=1−T−R). Thus, we can determine $R_{FTO\ to\ AL}$. Finally, we need $R_{FTO\ to\ air}$, which can be measured via $R_{air\ to\ FTO}$. The requisite reflectances were measured for a range of samples, mounted on an 8° wedge at the exit port of an integrating sphere. FIG. 28(a) shows the magnitudes of the reflectances measured/calculated for a typical semi-transparent film.

It is observed that the FTO to active layer reflectance is negligibly small. This occurs due to the fact that the reflectances $R_{FTO+AL}$ and $R_{air\ to\ glass}$ measured are similar, and $(1-A_{FTO+glass})$ is almost 1, so a small number is divided by a significantly larger number.

Because this is the case, only the reflectances from FTO and the active layer to air make a significant impact on the transmittance calculation. However, these reflectances are also quite similar. FIG. 28(b) shows the two curves, $$\frac{T_{FTO+AL}}{T_{FTO}} \text{ and } \frac{T_{FTO+AL}(1 - R_{FTO\ to\ air})}{T_{FTO}(1 - R_{FTO\ to\ AL})(1 - R_{AL\ to\ air})}.$$

We observe that factoring the differing reflections into the calculation has only a small effect on the calculation of the active layer transmittance. This is due to the fact that reflectances from the active layer and FTO to air are similar, and the FTO to active layer reflectance negligible. Calculating the average visible transmittance from these plots gives 38.19% for the full calculation and 39.18% for $$\frac{T_{FTO+AL}}{T_{FTO}}.$$

Due to the fact that this difference is small, and within the margins of error introduced by differences between different regions of the same sample, the more simple calculation below can be used with the introduction of only small errors.

$$1 - A_{AL} \sim \frac{T_{FTO+AL}}{T_{FTO}} \quad (6)$$

This definition is used for the calculations.

Correction to Remove Second Pass of Light Reflected from Electrodes

In order to account for and remove the extra current generated in the back reflection from the semi-transparent gold contact, the reflectance at a semi-transparent gold-spiro-OMeTAD contact and the active layer absorption were used to determine what percentage of the current was due to the second pass of light.

The possible current generated in the first pass is from light which is neither reflected nor absorbed in the FTO-coated glass, and is then absorbed in the perovskite. The current generated in the second pass is generated from any light that is not absorbed in the first pass through the active layer, is reflected at the gold electrode, and is absorbed in the perovskite. We are interested in the fraction of current that comes from just the first pass. We can then multiply the total generated current by this factor to get current in the first pass only. This can be expressed as:

$$\frac{J_1}{J_1 + J_2} = \frac{\int \varphi T_{FTO} A_{perov} d\lambda}{\int \varphi T_{FTO} A_{perov} d\lambda + \int \varphi T_{FTO}(1 - A_{active\ layer}) R_{spiro-gold} A_{active\ layer} d\lambda} \quad (7)$$

In which $\varphi$ represents AM1.5 photon flux, and R, A and T are fractional reflectance, absorptions and transmittances. The internal quantum efficiency and the area of the device determine the exact values for generated current, but these factors simply cancel out. We note that light passes through the perovskite before the spiro-OMeTAD in the active layer (for other calculations we have ignored the distinction, but here it is relevant), so for the first pass we exclude the absorbance of spiro-OMeTAD. This is done by extrapolating the active layer absorption at 500 nm to wavelengths below that (we observe a typically flat spectrum for perovskite absorption at these wavelengths, so this assumption is valid)—spiro-OMeTAD absorbs strongly below 420 nm. For the second pass, some light at these wavelengths has now been absorbed in the spiro-OMeTAD so we use the whole active layer absorption for the total light absorption in the first pass.

Figure 30:
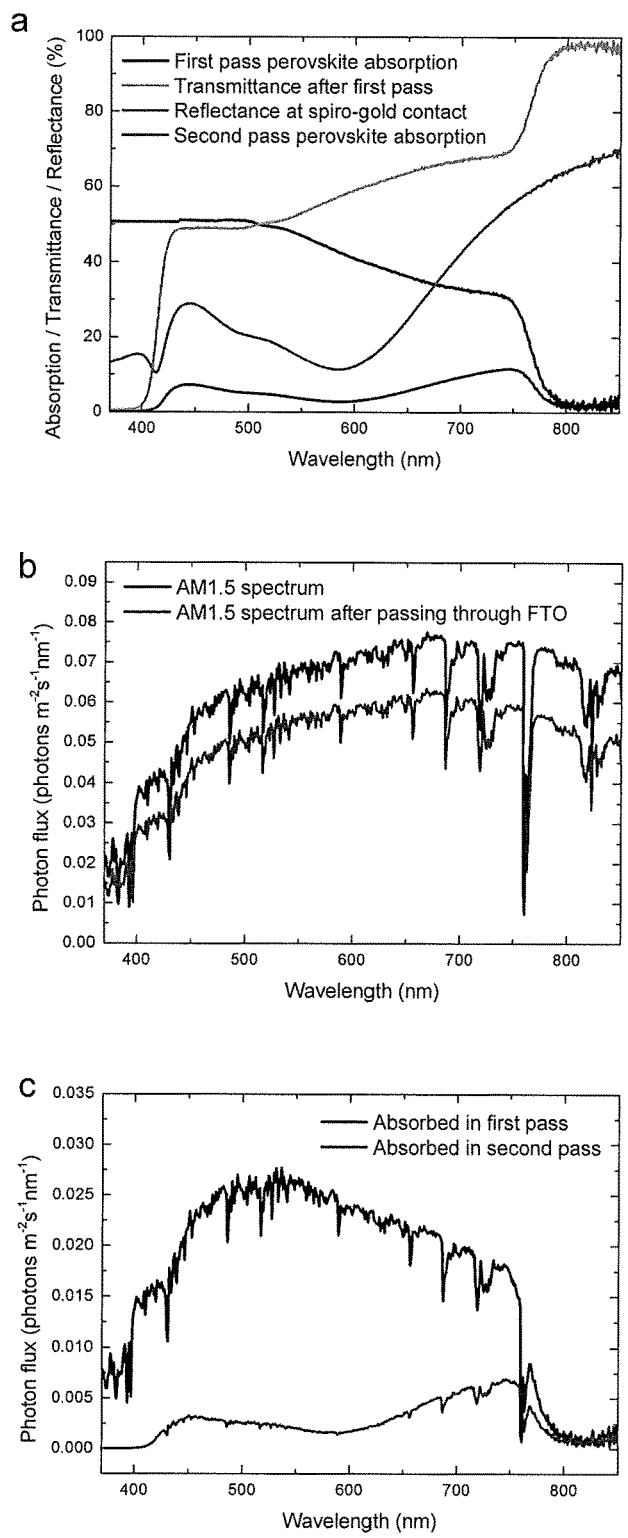
FIG. 30 shows (a) example data for a representative semitransparent perovskite solar cell showing first pass perovskite absorption, and second pass perovskite absorption calculated from the first pass transmittance and gold contact reflectance; (b) the available photon flux before and after passing through FTO; and (c) absorbed photon flux in the first and second passes. The ratio of the integrals of these curves gives the ratio of current generated in the first and second passes.

The reflectance from a spiro-OMeTAD-gold semi-transparent contact was measured separately with a gold-spiro contact on glass, using an integrating sphere. An example of the calculation is demonstrated in FIG. 30. The first pass useful absorption (FIG. 30a, second from top curve at 600 nm) is simply determined using an integrating sphere, and extrapolated to remove the influence of spiro-OMeTAD. The second pass useful absorption (FIG. 30a, bottom curve at 600 nm) is determined from the product of the first pass transmittance, including spiro-OMeTAD absorption (FIG. 30a, top curve at 600 nm), the reflectance at the spiro-OMeTAD-gold contact (FIG. 30a, third from top curve at 600 nm), and the absorption of the perovskite. In FIG. 30b, we show the available AM1.5 photon flux before and after passing through FTO glass. The product of this with the first and second pass absorption (as shown in FIG. 30a) respectively gives the photon flux absorbed in each pass, which is shown in FIG. 30c. Integrating these graphs gives the maximum current that could be generated (per m$^2$, with 100% internal quantum efficiency) in each pass, so as described in equation (7) we can determine the current that could be generated in the first pass only. For the example shown, the integrated values are 8.33 photons s$^{-1}$ m$^{-2}$ and 1.25 photons s$^{-1}$ m$^{-2}$ for the first and second passes respectively, so 87.0% of the measured photocurrent comes from the first pass.

TABLE 1

Figure 38:
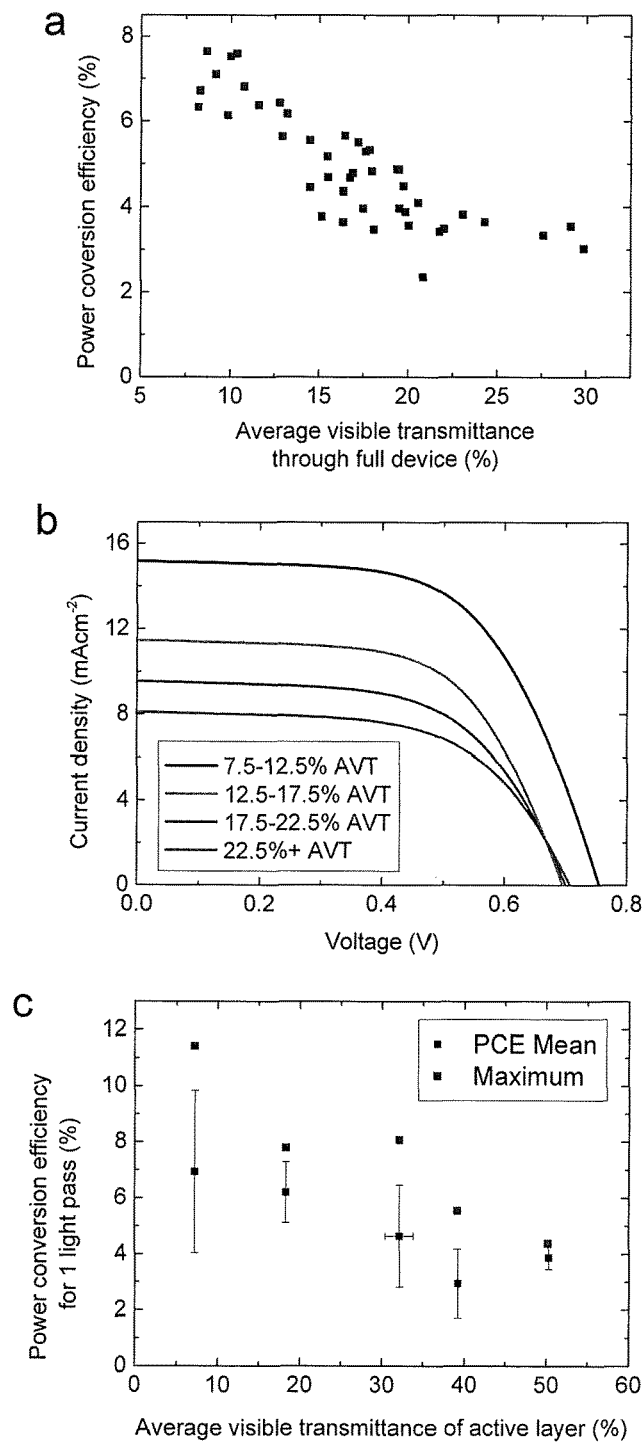
FIG. 38 shows semi-transparent solar cell device performance, wherein (a) shows the power conversion efficiencies for a batch of individual solar cells with ~10 nm Au electrodes, plotted as a function of full device AVT; (b) shows the average current density-voltage (JV) characteristics for the cells plotted in (a)—the curves are numerical averages of the current-voltage characteristics for individual cells split into the AVT intervals shown, with 5-15 cells per interval; and (c) shows the power conversion efficiency plotted as a function of active layer AVT, for a different batch of cells with thicker gold electrodes. The PCE plotted represents that which is attainable with an entirely transparent cathode (not a thick gold cathode). It has been corrected to remove current generated in the second pass (see Example 2 for details on calculation). Each point represents the mean of at least 14 individual devices, and the maximum PCE for the champion device in each interval is plotted. In all cases PCE was extracted from current-voltage measurements performed under 100 mWcm$^{-2}$ AM1.5 illumination. Full performance data for all devices in this Figure are shown in Example 2, tables 1 and 2.

Performance parameters extracted from current-voltage characteristics measured under 100 mWcm$^{-2}$ AM1.5 simulated sunlight for the full semi-transparent solar cells plotted in FIG. 38a and 38b.

| AVT interval (%) | Number of devices | Mean AVT (%) | Mean $J_{sc}$ (mAcm$^{-2}$) | Mean $V_{oc}$ (V) | Mean FF | Mean PCE (%) | Min PCE (%) | Max PCE (%) |
|---|---|---|---|---|---|---|---|---|
| 7.5-12.5 | 9 | 9.66 | 15.2 | 0.76 | 0.61 | 6.9 | 6.1 | 7.6 |
| 12.5-17.5 | 15 | 15.4 | 11.4 | 0.70 | 0.62 | 5.0 | 3.6 | 6.4 |
| 17.5-22.5 | 14 | 19.6 | 9.6 | 0.71 | 0.61 | 4.1 | 2.4 | 5.3 |
| 22.5+ | 5 | 26.8 | 8.1 | 0.71 | 0.61 | 3.5 | 3.0 | 3.8 |

TABLE 2

Performance parameters extracted from current-voltage characteristics measured under 100 mWcm$^{-2}$ AM1.5 simulated sunlight for the batch of semi-transparent cells shown in FIG. 38c, with the correction described above applied to remove current generated in the second pass.

| Mean active layer AVT (%) | Number of devices | Mean $J_{sc}$ measured (mAcm$^{-2}$) | $J_{sc}$ (no second pass) (mAcm$^{-2}$) | Mean $V_{oc}$ (V) | Mean FF | Corrected mean PCE (%) | Corrected min PCE (%) | Corrected max PCE (%) |
|---|---|---|---|---|---|---|---|---|
| 7.2 | 16 | 10.1 | 9.6 | 0.88 | 0.68 | 7.0 | 1.0 | 11.4 |
| 18.3 | 26 | 14.8 | 13.8 | 0.80 | 0.56 | 6.2 | 4.0 | 7.8 |
| 32.1 | 17 | 13.3 | 12.1 | 0.75 | 0.53 | 4.6 | 1.8 | 8.1 |
| 39.2 | 20 | 9.7 | 8.7 | 0.72 | 0.47 | 2.9 | 0.8 | 5.5 |
| 50.3 | 14 | 9.7 | 8.5 | 0.76 | 0.60 | 3.9 | 3.1 | 4.3 |

Figure 31:
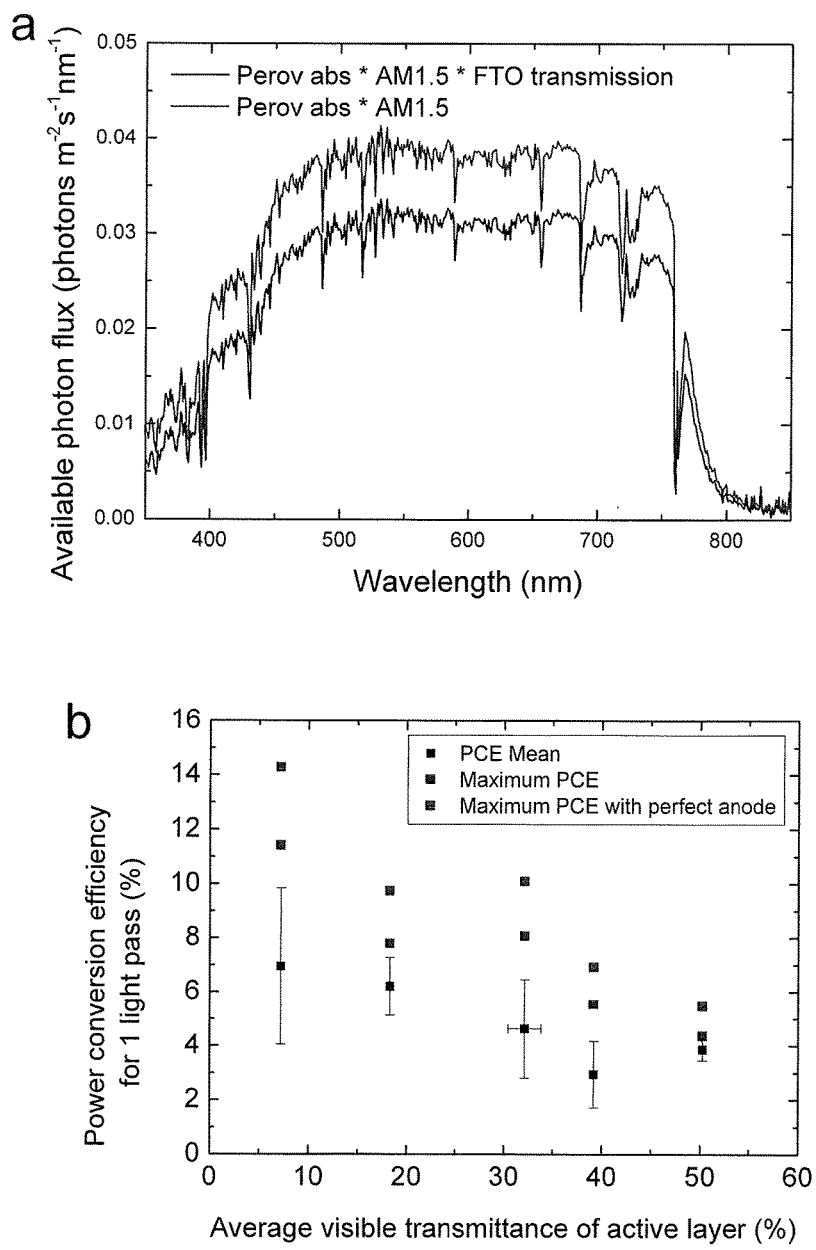
FIG. 31 shows (a) the available photon flux for a representative semitransparent perovskite film, determined by multiplying the AM1.5 solar spectrum with the perovskite's absorption, and also the transmittance of the FTO glass for the FTO-inclusive plot; and (b) the data from FIG. 38, with the additional current that could be attained with no absorption or reflection at the FTO-glass taken into account.

Estimation of Extra Photocurrent Available with a Fully Transparent, Non-reflective Anode In addition to removing the influence of the second pass, to remove the effect of a non-transparent anode (FTO coated glass), we can estimate the extra current available to a semitransparent solar cell if the anode is also perfectly transparent and non-reflective. Using the same method as previously, we can determine the total photon flux available for conversion to current (in a single pass) with the product of the AM1.5 solar spectrum, either including or excluding the losses (reflective and absorptive) imparted in transmission through the FTO-glass (see FIG. 30b), with the absorption of the perovskite layer in question. Determining the ratio between the integrals of the resultant graphs (an example is shown in FIG. 31a) gives a conversion factor for the photocurrent and PCE, to increase it to what it would be if there was no absorption or reflection from the anode. This factor was determined for the devices shown in FIG. 38, and the new maximum efficiencies are shown in FIG. 31b. The conversion factor was approximately 1.25 in all cases, meaning PCE could increase by another 25%. This calculation does neglect any possible discrepancies that may arise due to measured FTO-glass absorption including losses as scatter at near-90° angles, so large that the integrating sphere cannot detect it, which may in fact contribute to photocurrent in a device.

Spiro-OMeTAD-compact TiO2 Diode Characteristics

Figure 32:
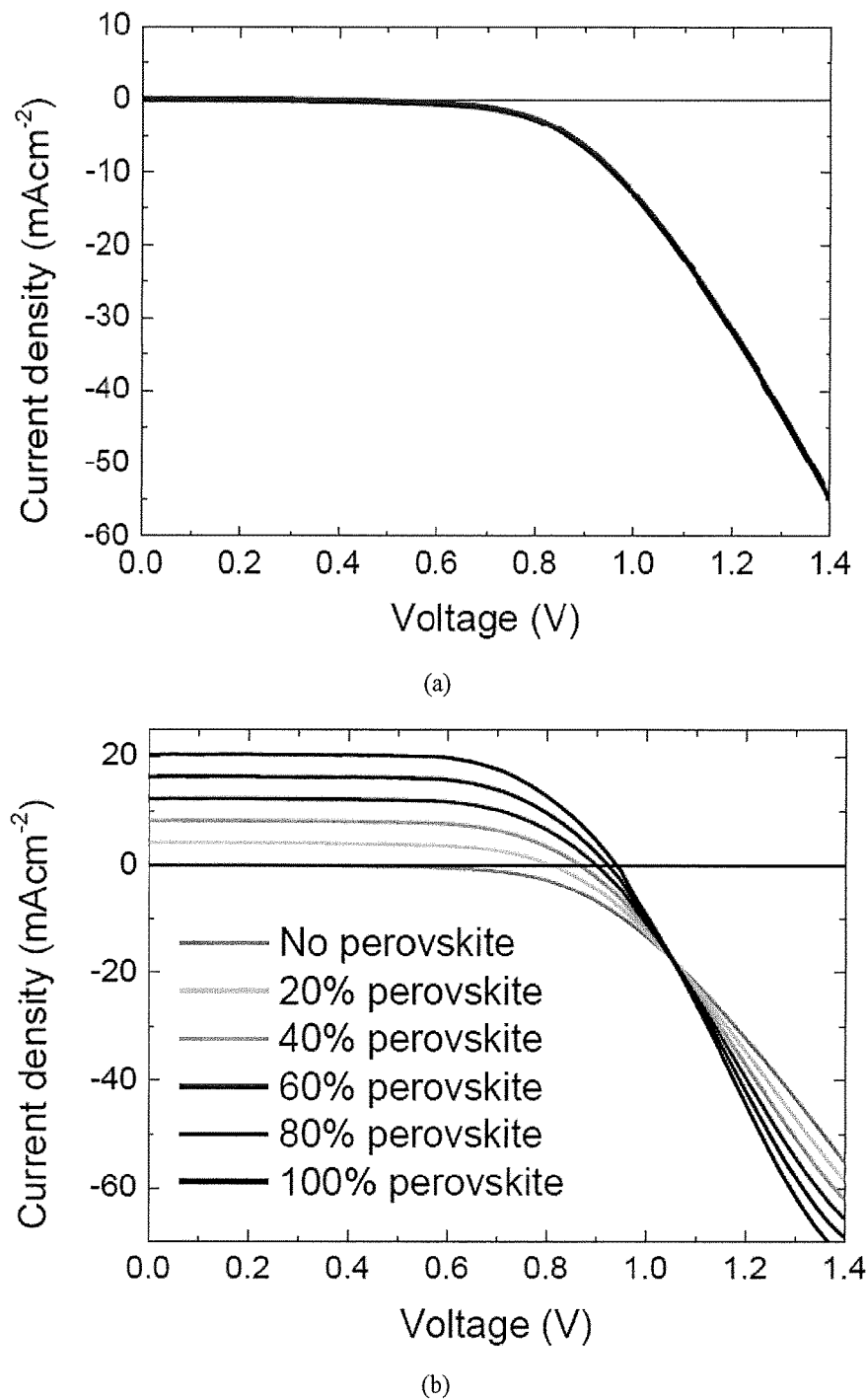
FIG. 32 shows (a) current-voltage characteristics for a spiro-OMeTAD-compact $TiO_2$ diode, fabricated in the same way as the perovskite solar cells but with no perovskite layer; and (b) mathematically determined fractional averages between the light current-voltage characteristics of a measured high-performance perovskite planar heterojunction solar cell, and the spiro-OMeTAD-compact $TiO_2$ diode.

To explain the good rectification behaviour observed even with discontinuous layers of perovskite, we fabricated cells with no perovskite coverage at all—simply a spiro-OMeTAD-compact $TiO_2$ diode. We observe that such a diode shows good rectification, with a turn-on at around 0.7V, as seen in FIG. 32a. A discontinuous layer of perovskite sandwiched between compact $TiO_2$ and spiro-OMeTAD is effectively then a combination of such spiro-OMeTAD-compact $TiO_2$ diodes and the spiro-OMeTAD-perovskite-compact $TiO_2$ solar cell diodes. To simply model current-voltage characteristics that we would expect under illumination with different perovskite coverages, we fractionally averaged current-voltage characteristics between a measured highly efficient planar heterojunction perovskite solar cell (with full perovskite coverage, so no spiro-OMeTAD-compact $TiO_2$ diodes) and the spiro-OMeTAD-compact $TiO_2$ diode. Modelled current-voltage characteristics are shown in FIG. 32b. We observe good rectification behaviour at all fractions of perovskite, and that the Voc would decrease from ~1V to 0.7V, as we see in measured devices. We note that the percentages of perovskite modelled do not represent the perovskite coverage, simply the mathematical fraction of the full coverage perovskite solar cell current-voltage characteristics versus the spiro-OMeTAD diode. Varying material thicknesses and resistances make it difficult to more precisely model the exact behaviour of a device with a given perovskite coverage, but it is the trend of Voc dropping from ~1V to ~0.7V, consistent with experiment, which is enlightening here.

Results and Discussion

Figure 33:
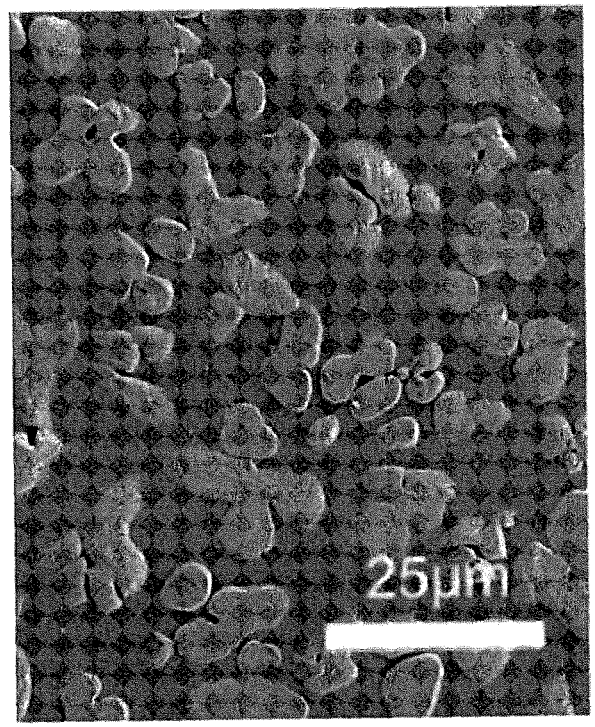
FIG. 33 shows a scanning electron micrograph of the top surface of a representative film of perovskite "islands" (paler regions) on a $TiO_2$-coated FTO substrate.
Figure 34:
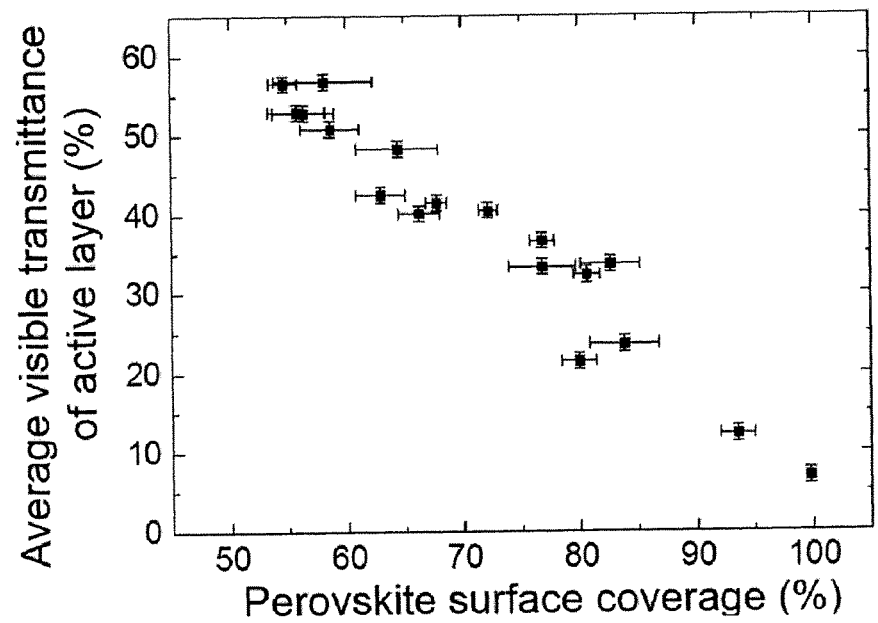
FIG. 34 is a graph showing the dependence of average visible transmittance of the active layer on perovskite surface coverage.
Figure 35:
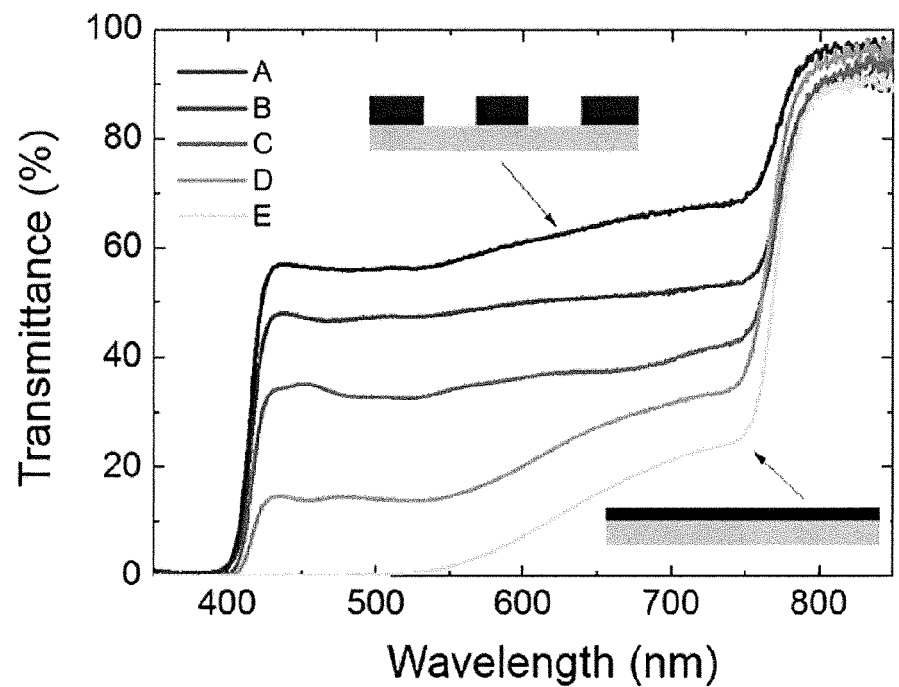
FIG. 35 shows transmittance spectra of active layers of a selection of dewet perovskite devices, with diagrammatical representations of the most and least transparent films shown as insets.

In FIG. 1, we show a schematic of the dewetting process to produce discontinuous regions of the perovskite absorber $CH_3NH_3PbI_{3-x}Cl_x$. Over time, pore growth, controllable through processing conditions such as temperature and film thickness, dictates the final morphology of the polycrystalline film. In FIG. 33, we show an SEM image of a representative semi-transparent perovksite film formed to maximise open area. We measured the "islands" to be >1 µm in height. Visibly, such films appear neutral-coloured (FIG. 6); a 1 µm film of perovksite absorbs effectively all light at energies above its bandgap, which is 1.55 eV (Lee, M. M.; Teuscher, J.; Miyasaka, T.; Murakami, T. N.; Snaith, H. J. Efficient Hybrid Solar Cells Based on Mesosuperstructured Organometal Halide Perovskites; Science 2012, 338, 643-647). A continuous 1 µm film would hence appear black, but because the perovskite film is formed of discontinuous islands, it appears semi-transparent and of neutral colour. For neutral color to be achieved, it is a prerequisite that the absorption onset of the absorber is in the near-infrared. In order to characterise such films for their use in working solar cells, we are interested in the optical behaviour of not just the perovskite, but the whole active layer necessary to produce a working solar cell. Here, the device architecture is a planar heterojunction of perovskite between an n-type compact $TiO_2$ layer and a p-type hole transporter, 2,2',7,7'-tetrakis-(N,N-di-p-methoxyphenylamine)9,9'-spirobifluorene (spiro-OMeTAD). As such, from now we define the "active layer" as the structure: compact $TiO_2$/perovskite/spiro-OMeTAD. Furthermore, as the application for semi-transparent solar cells is for visible aesthetics, we are interested in the visible wavelengths, between 370 and 740 nm. We define the average visible transmittance (AVT) as the mean transmittance of a film between these wavelengths. We fabricated perovskite films on compact $TiO_2$-coated FTO glass under a range of processing conditions (see above) in order to achieve a wide range of transparencies. We measured the perovskite surface coverage via analysis of SEM images, then applied the spiro-OMeTAD layer and measured the AVT with an integrating sphere (details above). In FIG. 34 we show the dependence of AVT on perovskite surface coverage. A linear trend demonstrates the ease of controlling the transparency of such films by carefully choice of solvent and processing temperature. We show a selection of representative active layer transmittance spectra in FIG. 35. We see encouragingly flat spectra across the majority of the visible spectrum, especially for the more transmissive samples. For the less transmissive samples (especially D and E in FIG. 35), there is a higher perovskite surface coverage, or less dewetting. These films were fabricated from the same coating conditions, but simply using different solvents, and dried and crystalized at different temperatures between 90 to 130° C. For the same amount of starting material, the final film volume should be the same regardless of the extent of dewetting, hence the regions of perovskite in the films with more coverage are thinner, and evidentially not thick enough to fully absorb the light at the red end of the spectrum. This is seen in FIG. 35, where even with 100% perovskite coverage, AVT is not 0%. The more dewet films comprise thicker perovskite islands and hence have flatter spectra. Diagrams of the cross-section of high and low transmission films are shown as an inset to FIG. 35. To quantify the colour-neutrality of the active layers, we calculated colour perception indices using the CIE 1931 xy colour space, designed to represent human visual colour perception. The transmitted light is represented by the product of the AM1.5 solar spectrum and the transmission spectrum of the active layer in question (Chen, K.-S.; Salinas, J.-F.; Yip, H.-L.; Huo, L.; Hou, J.; Jen, A. K.-Y. Semi-transparent Polymer Solar Cells with 6% PCE, 25% Average Visible Transmittance and a Color Rendering Index Close to 100 for Power Generating Window Applications. Energy Environ. Sci. 2012, 5, 9551-9557; Smith, T.; Guild, J. The CIE Colorimetric Standards and Their Use. Trans. Opt. Soc. 1932, 33, 73-134). We calculated x and y colour parameters for the samples labelled A-E in FIG. 35 and display the results on the CIE 1931 xy chromacity diagram in FIG. 36. We also plot a ~200 nm thick continuous perovskite film, the reference daylight illuminant D65 and the AM1.5 spectrum. The colour co-ordinates of the most transmissive active layers (A, B, C) are located very close to the AM1.5 spectrum and the D65 reference in the low colourfulness region of the chromacity diagram, representing excellent colour-neutrality. At lower transmittances, films move towards the red-brown side of the chromacity diagram, where the thin continuous perovskite film is positioned.

Figure 29:
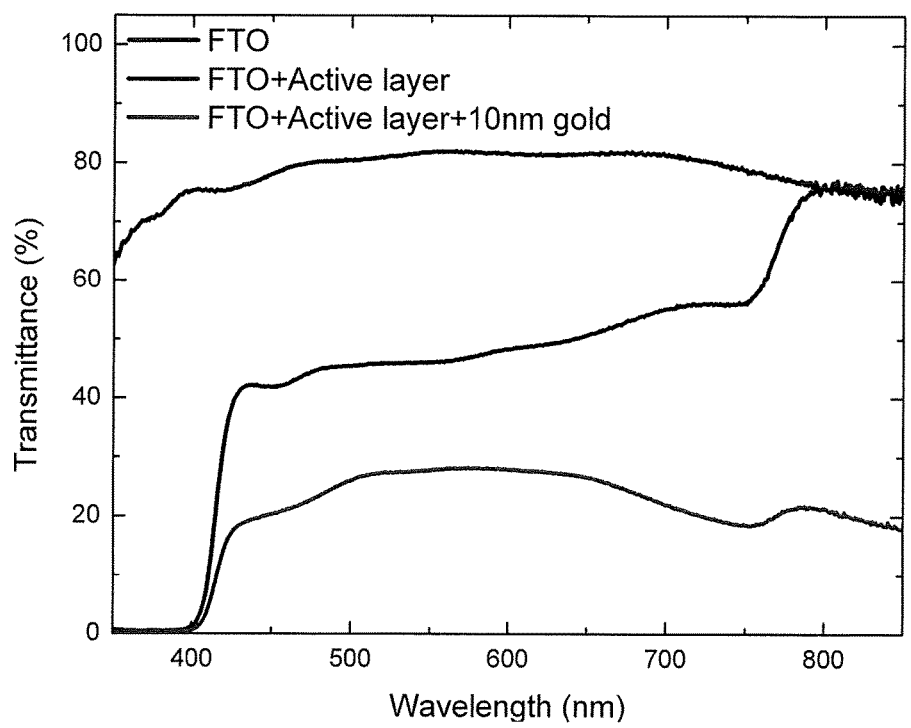
FIG. 29 shows transmittance spectra of the components of a representative semi-transparent cell, showing the transmission of the FTO-glass, the FTO-glass plus active layer, and the whole cell including a semi-transparent gold electrode.
Figure 37:
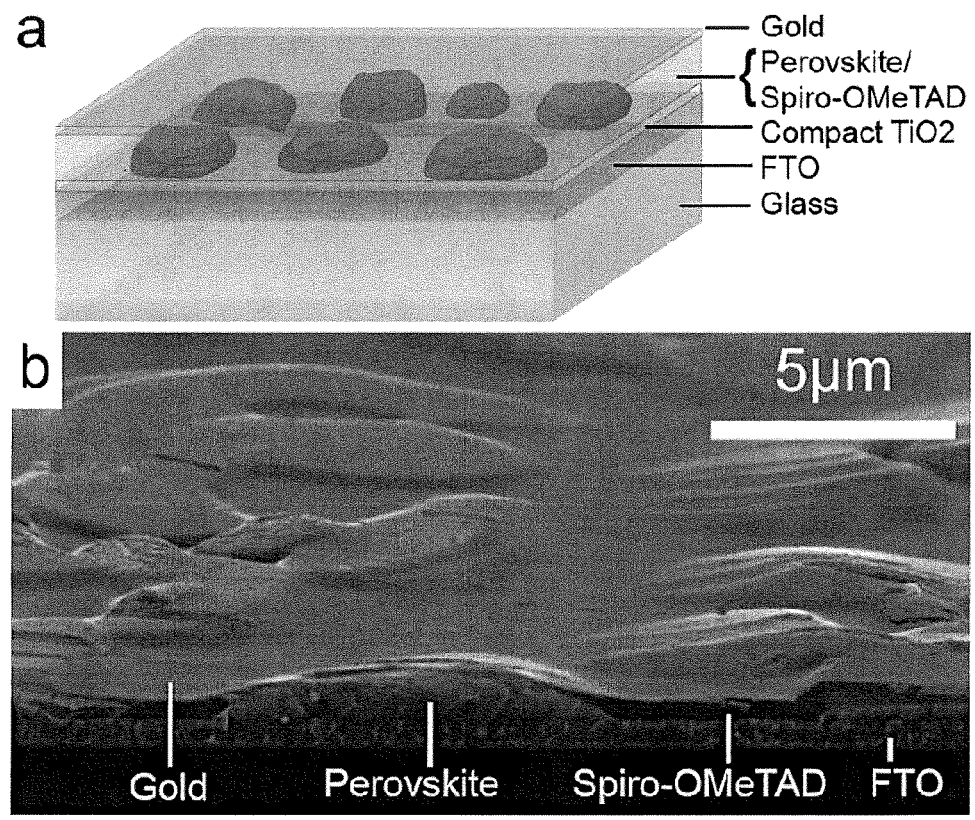
FIG. 37 shows semi-transparent neutral-coloured perovskite solar cells, wherein (a) is a diagram showing the architecture of the dewet planar perovskite heterojunction solar cell, and (b) is a tilted cross-sectional SEM image of a full semi-transparent solar cell showing the perovskite "islands" coated with spiro-OMeTAD.

We fabricated planar heterojunction solar cells with a range of transmittances, with the architecture shown in FIG. 37a. An SEM image of a cross section of a full device is shown in FIG. 37b. The perovskite islands can be clearly seen, with the spiro-OMeTAD infiltrating the spaces between and also coating the islands with a thin layer. Ideally we would use extremely transparent and conductive electrodes on both sides in order to maintain high transparencies. However, full optimisation of the electrodes is beyond the scope of this study, and here we used fluorene doped tin oxide (FTO) as the anode and a thin (~10 nm) layer of gold as the cathode. Such devices are reasonably transparent, though the gold electrode is a major source of transmittance loss (see FIG. 29). In FIG. 38a we plot the power conversion efficiencies against the AVT of the whole device (including 10 nm gold electrode) from a single batch of devices, extracted from current density-voltage curves measured under simulated AM1.5, 100 mWcm$^{-2}$ sunlight. We observe a clear trend, at the lowest transmittances in this batch (AVT~7%) power conversion efficiencies approach 8%, and as transmittance increases, the efficiency decreases. The most transparent cells, with AVTs of ~30%, showed power conversion efficiencies of around 3.5%. In FIG. 38b we show average current density-voltage curves from the same devices split into intervals of AVT. We observe a reduction in photocurrent for the higher transmittance devices, as expected more light passes straight through the device. Remarkably, we find that device yield in these highly discontinuous films does not suffer from critical shunting, as might be expected based on other thin-film solar cells. Although there is a significant spread in device efficiency at similar transmittances, the lower coverage films did not show a greater spread. An interesting observation is that open-circuit voltage ($V_{oc}$) is similar at ~0.7V for all but the least transmissive set of cells, where it is raised to ~0.75V. We propose that greater perovskite coverage reduces spiro-OMeTAD-compact $TiO_2$ contact area and these regions represent a parallel diode to the photoactive regions, with a lower shunt resistance. Hence, increasing the perovskite coverage increases the overall shunt resistance and increases the $V_{oc}$. From these J-V curves it appears that for the higher transmittances (i.e. lower perovskite coverage), the $V_{oc}$ reaches a minimum of ~0.7V. To further understand this, we fabricated and tested spiro-OMeTAD/compact $TiO_2$ diodes. Their diode characteristics show a dark current turn-on at also ~0.7 V (see above), so even in the case of there being minimum perovskite coverage, we would not expect the diode turn-on voltage to be any lower than 0.7 V, and hence this sets a lower limit on the open-circuit voltage. With full perovskite coverage, spiro-OMeTAD/perovskite/compact $TiO_2$ devices have been observed to have an open-circuit voltage of >1 V (Liu, M.; Johnston, M. B.; Snaith, H. J. Efficient Planar Heterojunction Perovskite Solar Cells by Vapour Deposition. Nature 2013, 501, 395-398.). Thus, with higher perovskite coverage, the fraction of spiro-OMeTAD/perovskite/compact $TiO_2$ diode area compared to spiro-OMeTAD/compact TiO2 will increase, and the effective turn-on voltage of these parallel diodes should increase from 0.7 to >1 V, as seen. The electrodes used (FTO and 10 nm thick gold) are non-optimum transparent electrodes. Much work is being undertaken to develop highly transmissive and conductive electrodes for semi-transparent solar cells and other applications (Ellmer, K. Past Achievements and Future Challenges in the Development of Optically Transparent Electrodes. Nat. Photonics 2012, 6, 809-817.). In light of this, we determined the best performance that could be achieved from these solar cells if we could use an entirely transparent cathode. We fabricated devices with a number of different active layer AVTs, between 5% and 50% and deposited slightly thicker gold electrodes to minimise electrode resistance. We determined the power conversion efficiency from measuring current-voltage characteristics, and then corrected the photocurrent to remove the fraction of current generated by the second pass of reflected light from the gold electrode (see above for details of calculation). We thus determined the PCE that could be attained from devices with entirely transparent cathodes (FIG. 38c). We note that we have not increased the measured photocurrent to account for light absorbed in the FTO and all the "corrected" photocurrents are lower than the measured photocurrents (Table 2). Even so, we can see that significantly improved performance could be achieved in comparison to the devices employing the thin gold electrodes, at a given active layer AVT. Notably, ~30% AVT active layers would still generate power conversion efficiencies of over 8%, which is a transparency and a performance that is compatible with commercial applications, being better than currently offered by a-Si, and would represent the best semi-transparent neutral-coloured solar cell efficiency to date. Once we have resolved the lower open-circuit voltages in these micro-structured perovskite solar cells, the $V_{oc}$ should be able to be pushed up towards 1.1V which is achievable in uniform planar heterojunction solar cells (Liu, M.; Johnston, M. B.; Snaith, H. J. Efficient Planar Heterojunction Perovskite Solar Cells by Vapour Deposition. Nature 2013, 501, 395-398), which will result in another 20 to 30% increase in relative efficiency. In addition, we are still employing FTO coated glass, which is not the most transmissive conducting layer, further improvements are still possible by simply employing a more transparent anode and an antireflective coating (an estimation of the further increases in efficiency possible is discussed above).

Figure 36:
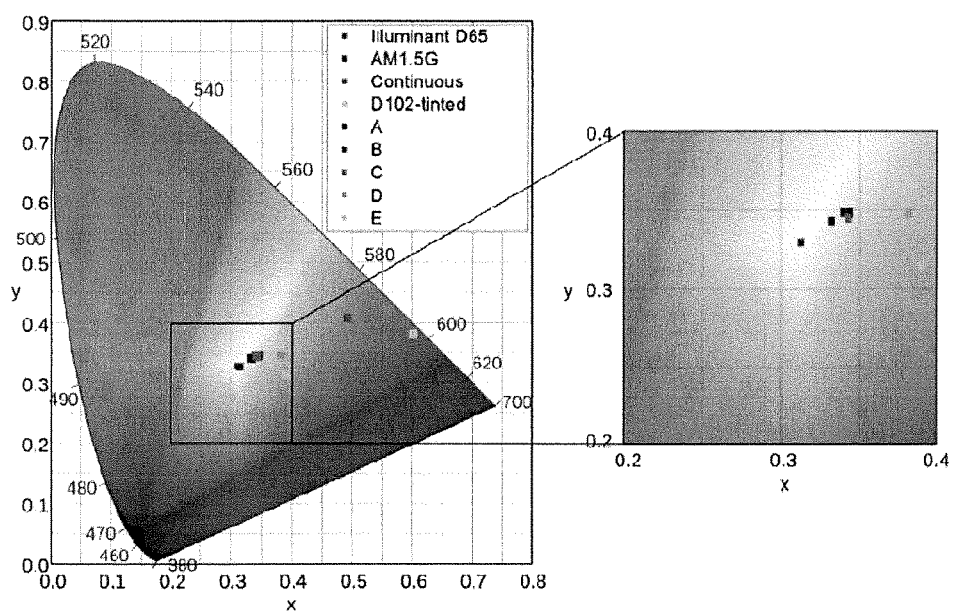
FIG. 36 shows the colour coordinates of the films with the transmittance spectra shown in FIG. 34 under AM1.5 illumination, on the CIE xy 1931 chromacity diagram, and the enlarged central region. Colour coordinates of a thin continuous perovskite film, a D102 dye-tinted cell (described later), the D65 standard daylight illuminant, and AM1.5 illumination, are also shown.
Figure 39:
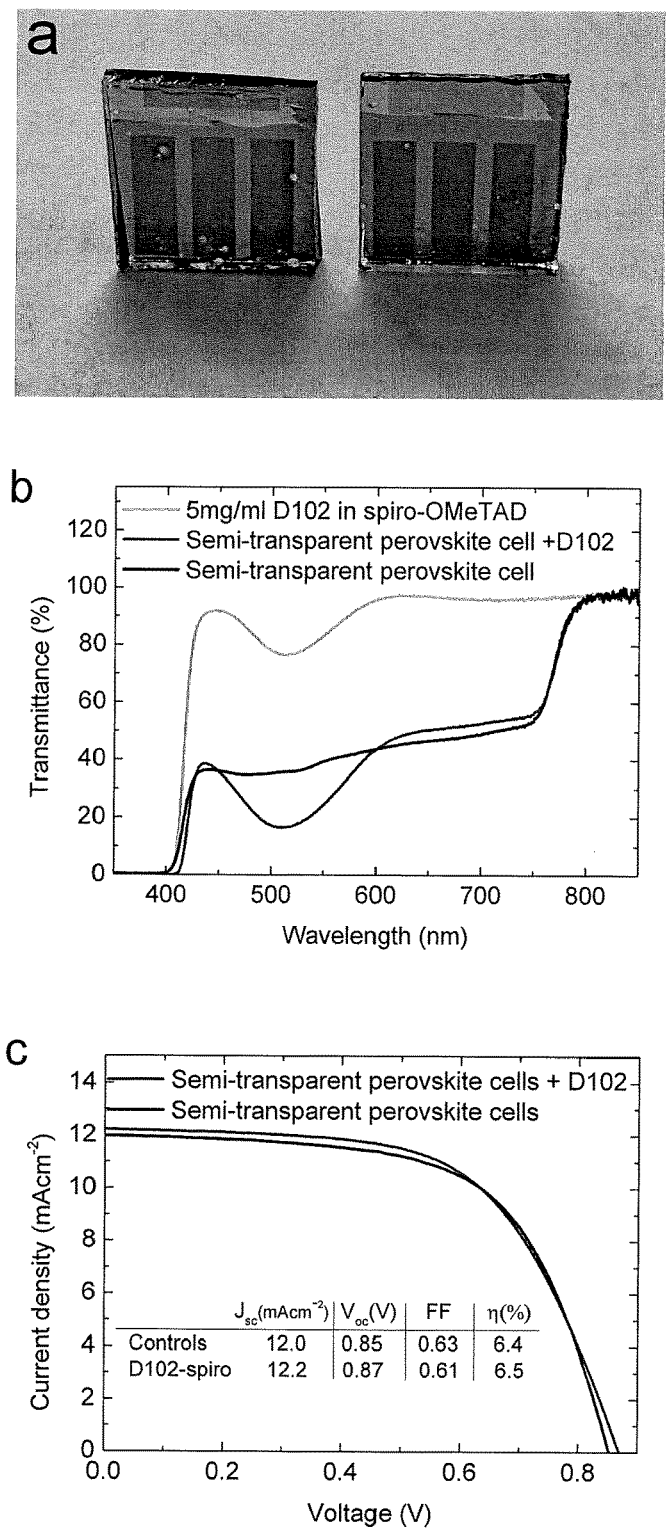
FIG. 39 shows (a) photographs of semi-transparent perovskite solar cells without (left) and with (right) D102 dye included in the spiro-OMeTAD layer, with 10 nm gold electrodes; (b) transmittance spectra of the active layer of such cells; and (c) average current density-voltage characteristics of such solar cells, demonstrating effectively no change in performance with inclusion of the dye. Device performance parameters are shown in the inset. Averages are numerical averages from 9 D102 doped and 12 control cells.

Having demonstrated a new and versatile means to form neutral-coloured semi-transparent solar cells, of further interest would be the prospect for lightly colour-tinting such cells. With the micro-structured architecture, we can envisage that it should be easy to optically modify the semi-transparent cells by incorporation of a dye or pigment into the regions where light passes through. Here, we simply dissolved an indolene dye termed D102 into the spiro-OMeTAD solution, and upon application to typical semi-transparent cells it produces "rose-tinted" devices (FIG. 39a) (Schmidt-Mende, L.; Bach, U.; Humphry-Baker, R.; Horiuchi, T.; Miura, H.; Ito, S.; Uchida, S.; Grätzel, M. Organic Dye for Highly Efficient Solid-State Dye-Sensitized Solar Cells. Adv. Mater. 2005, 17, 813-815). Plotting this tinted active layer on the chromacity diagram in FIG. 36 shows these films lie in the pale pink region. As we show in FIG. 39b, the absorption peak of the dye in addition to the perovskite attenuation is apparent in the transmittance spectrum. While light absorbed by the dye will not contribute to photocurrent, device performance should remain unaltered provided the dye has not introduced any detrimental electronic artifacts. We show the current voltage curves of such devices in FIG. 39c which confirm this; on average the rose-tinted cells perform similarly to the control cells.

In summary, we have demonstrated a new concept for the fabrication of neutral-coloured semi-transparent solar cells by creating micro-porous layers of organometal halide perovskite by partial dewetting of solution cast films. Our complete devices show good efficiencies at reasonable levels of transparencies, with significant scope for further improvement by implementing electrodes with higher transparencies, and enhancing the open-circuit voltage. Furthermore, we have demonstrated that the micro-structured perovskite film concept can be easily used to integrate colour into high efficiency semi-transparent devices, with no loss in efficiency. This work now enables perovskite solar cells to not only compete for high efficiency opaque applications, but to also offer an ideal solution to building integrated photovoltaics; neutral colour semi-transparency at high efficiency.

The invention claimed is:

1. A process for producing a semi-transparent photoactive layer comprising:
    a) disposing on a planar compact layer substrate having a substantially uniform thickness a composition comprising a photoactive material or one or more precursors of the photoactive material, to form a resulting layer; and
    b) dewetting the resulting layer to form a semi-transparent photoactive layer comprising a plurality of absorbing regions that comprise the photoactive material and a plurality of transparent regions that do not comprise the photoactive material,
    wherein the photoactive material comprises a perovskite.

2. A process according to claim 1 wherein (b) comprises dewetting the resulting layer until
    a dewet layer of the photoactive material is formed that comprises a plurality of unconnected absorbing regions of the photoactive material, wherein the average radius of the absorbing regions is from 0.4 µm to 100 µm and the average distance between the centres of two adjacent absorbing regions is from 1 µm to 300 µm; or
    a dewet layer of the photoactive material is formed that comprises a plurality of unconnected transparent regions that do not comprise the photoactive material, wherein the average diameter of the transparent regions is from 0.4 µm to 300 µm.

3. A process according to claim 1 wherein the perovskite is a mixed-anion perovskite comprising two or more different anions selected from halide anions and chalcogenide anions.

4. A process according to claim 1 wherein (b) comprises heating the resulting layer at a temperature of from 50° C. to 250° C. for a period of time in the range of 5 minutes to 120 minutes.

5. A process according to claim 1 wherein (b) comprises dewetting the resulting layer until;
    a dewet layer of the photoactive material having a coverage of the photoactive material in the range of 20% to 90% is formed; or
    a dewet layer of the photoactive material having an average transmission in the range of 10% to 90% for light for a wavelength in the range of 370 nm to 740 nm is formed; or
    a dewet layer of the photoactive material having a coverage of the photoactive material in the range of 20% to 90% is formed; or
    a dewet layer of the photoactive material having an average transmission of from 10% to 90% for light with a wavelength of from 370 nm to 740 nm is formed.

6. A process according to claim 1 that further comprises:
    c) blocking transparent regions of the photoactive layer with an electronic blocking material suitable for reducing the flow of current through transparent regions from a region on a first side of the photoactive layer to a region on a second side of photoactive layer.

7. A process according to claim 6 wherein the electronic blocking material comprises a self assembled monolayer or multilayer of a molecule, wherein the molecule binds selectively to the substrate, and wherein the electronic blocking material comprises a carboxylated cyclodextrin, a succinyl cyclodextrin, cyanoacrylic end functionalised penta(3-hexylthiophene), iodotetrafluorobenzene carboxylic acid, 4-guanidinobutyric acid, a $C_{10-30}$-alkylphosphonic acid, (dicyanomethylene)-2-methyl-6-(4-dimethylaminostyryl)-4H-pyran, polyethylene glycol or octadecylphosphonic acid.

8. A process according to claim 7 wherein (c) comprises blocking the transparent regions of the photoactive layer with an electronic blocking material by treating the photoactive layer with a composition comprising a solvent and the electronic blocking material.

9. A process according to claim 6 wherein the electronic blocking material comprises an insulating polymer comprising polystyrene, poly(ethylene glycol) diacrylate, polyethylene, polypropylene, polyethylene terephthalate, polyvinyl acetate or polyvinyl chloride.

10. A process according to claim 9 wherein the electronic blocking material further comprises a dye, a pigment or a material that re-emits or scatters light.

11. A process according to claim 9 further comprising the step of cross-linking the insulating polymer by heating, irradiating the substrate, or by treating the polymer with a radical initiator.

12. A process according to claim 1, further comprising the step of:
    c) disposing on the photoactive layer a composition comprising an insulating component that wets transparent regions of the photoactive layer and that is suitable for reducing the flow of current through transparent regions from a region on a first side of the photoactive layer to a region on a second side of photoactive layer, and wherein the composition comprises a solvent, a p-type semiconductor and (dicyanomethylene)-2-methyl-6-(4-dimethylaminostyryl)-4H-pyran.

13. A process according to claim 1 that further comprises a step (z), performed before step (a), wherein (z) comprises treating the substrate with an insulator material suitable for reducing the flow of current through transparent regions in the dewet layer of the photoactive material and suitable for allowing the flow of current through absorbing regions in the dewet layer of the photoactive material,
    wherein the flow of current is from a region on a first side of the photoactive layer to a region on a second side of photoactive layer,
    wherein the insulator material comprises a material selected from yttrium (III) oxide, magnesium oxide and an insulating polymer, and
    wherein (z) comprises disposing on the substrate a thin layer of the insulating material with a thickness of from 0.3 nm to 3 nm.

14. A process according to claim 1 that further comprises disposing in the transparent regions in the photoactive layer a dye, a pigment or a material that re-emits or scatters light.

15. A process according to claim 1 wherein (b) comprises dewetting the resulting layer by disrupting and forming holes in the resulting layer to form a photoactive layer comprising a plurality of absorbing regions that comprise the photoactive material and a plurality of transparent regions that do not comprise the photoactive material.

* * * * *